(12) United States Patent
Nagasawa et al.

(10) Patent No.: US 12,356,551 B2
(45) Date of Patent: Jul. 8, 2025

(54) SEMICONDUCTOR STORAGE DEVICE

(71) Applicant: Kioxia Corporation, Tokyo (JP)

(72) Inventors: Kazuya Nagasawa, Kamakura Kanagawa (JP); Norihiro Ishii, Yokohama Kanagawa (JP); Kazuhiro Nojima, Yokohama Kanagawa (JP); Tamotsu Fujimaki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 296 days.

(21) Appl. No.: 18/079,514

(22) Filed: Dec. 12, 2022

(65) Prior Publication Data

US 2023/0284390 A1   Sep. 7, 2023

(30) Foreign Application Priority Data

Feb. 21, 2022   (JP) .................................. 2022-024843
Apr. 12, 2022   (JP) .................................. 2022-065730

(51) Int. Cl.
*H05K 1/18*   (2006.01)

(52) U.S. Cl.
CPC ... *H05K 1/182* (2013.01); *H05K 2201/10159* (2013.01)

(58) Field of Classification Search
CPC ..................... H05K 1/182; H05K 2201/10159
USPC ....................................................... 361/761
See application file for complete search history.

(56) References Cited

U.S. PATENT DOCUMENTS

| 6,151,221 | A | 11/2000 | Van Lerberghe | |
|---|---|---|---|---|
| 6,310,780 | B1 * | 10/2001 | Tamura | H05K 1/183 |
| | | | | 361/767 |
| 2006/0065432 | A1 * | 3/2006 | Kawauchi | H05K 1/182 |
| | | | | 174/254 |
| 2014/0104775 | A1 * | 4/2014 | Clayton | G06F 1/184 |
| | | | | 361/749 |
| 2018/0109023 | A1 * | 4/2018 | Yun | H05K 1/111 |
| 2021/0345489 | A1 | 11/2021 | Ryu et al. | |

FOREIGN PATENT DOCUMENTS

| JP | U-A-57-140723 | 9/1982 |
|---|---|---|
| JP | A-2000-517485 | 12/2000 |
| JP | A-2019-054046 | 4/2019 |
| TW | 200929747 A | 7/2009 |
| TW | 202142069 A | 11/2021 |
| WO | WO-2009/042142 A1 | 4/2009 |

* cited by examiner

*Primary Examiner* — Binh B Tran
(74) *Attorney, Agent, or Firm* — Foley & Lardner LLP

(57)   ABSTRACT

A semiconductor storage device according to an embodiment includes a board, an electronic component, and a holder. The board has a first surface. The electronic component includes a component main body and a first lead. The component main body is at a position out of the board in a direction parallel to the first surface. The first lead protrudes from the component main body toward the board. The holder is on the board. The holder holds the first lead.

14 Claims, 46 Drawing Sheets

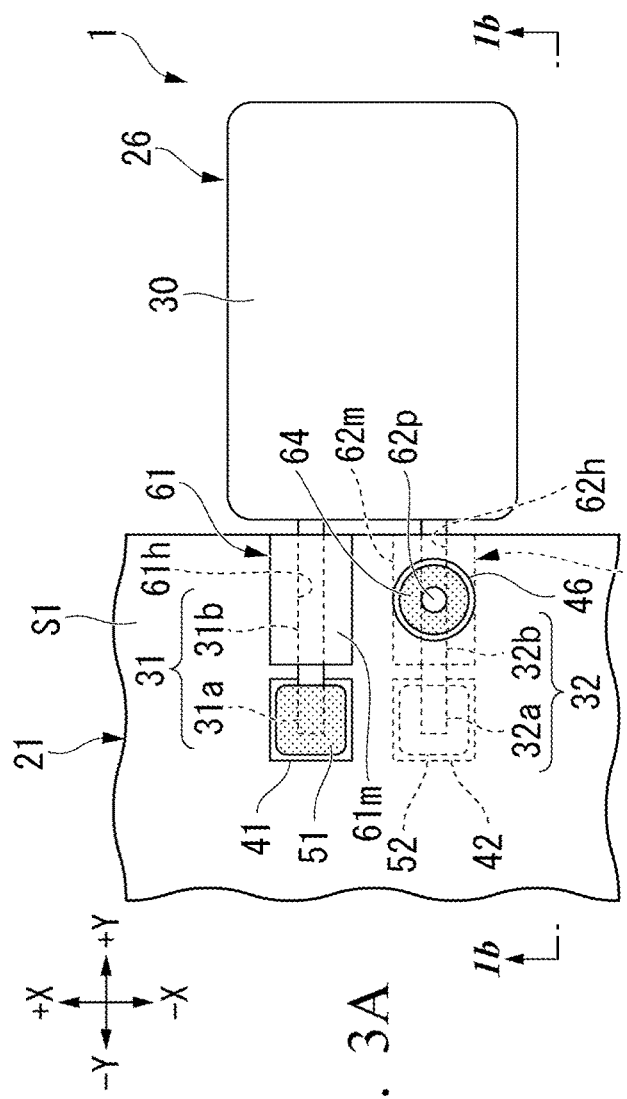
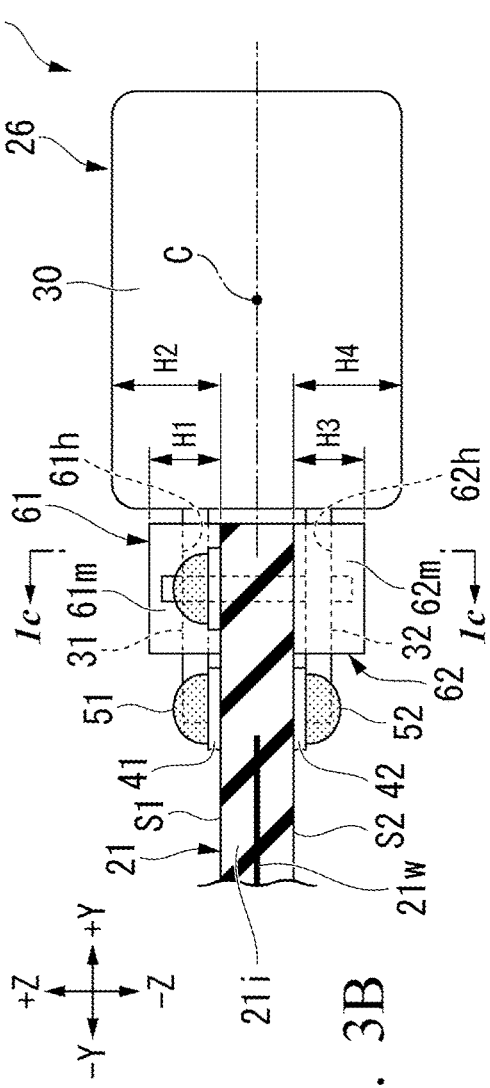
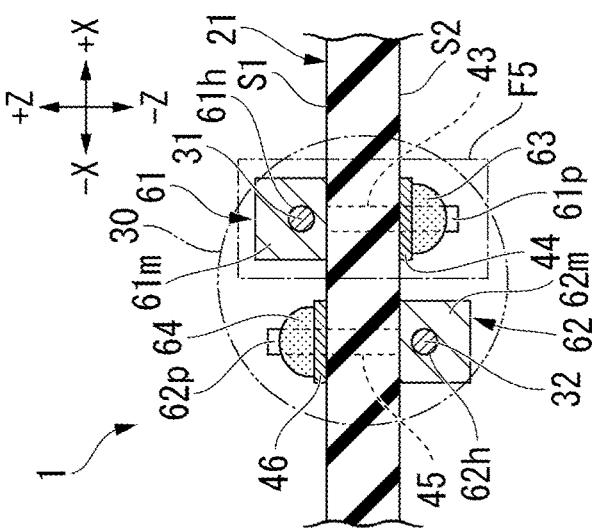
FIG. 3A
FIG. 3B
FIG. 3C

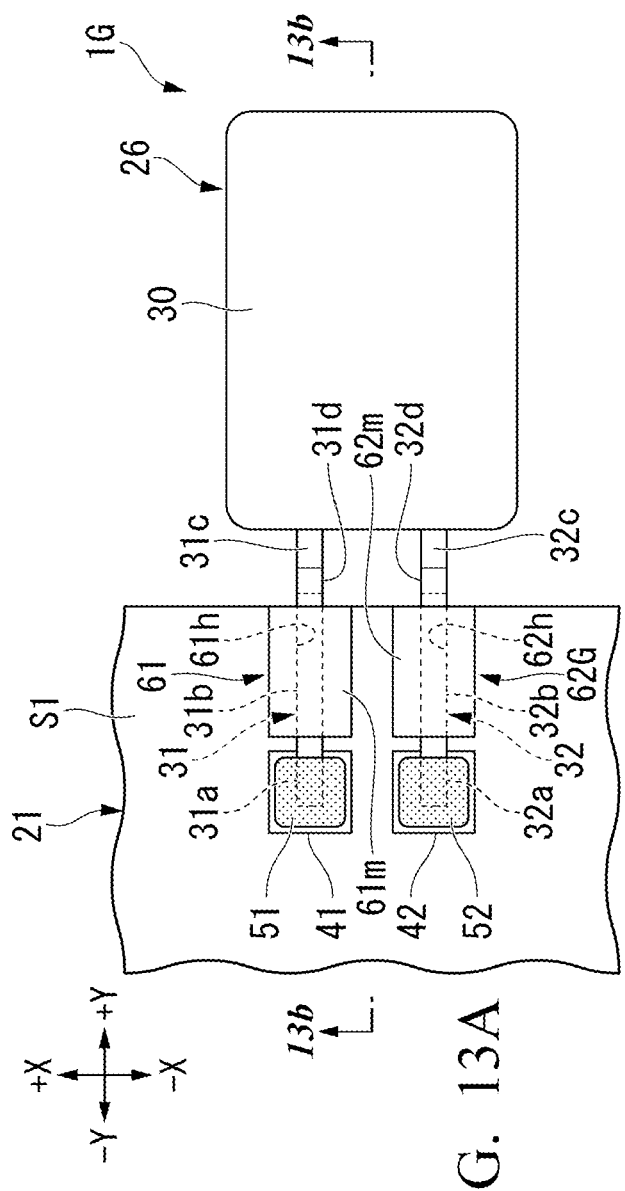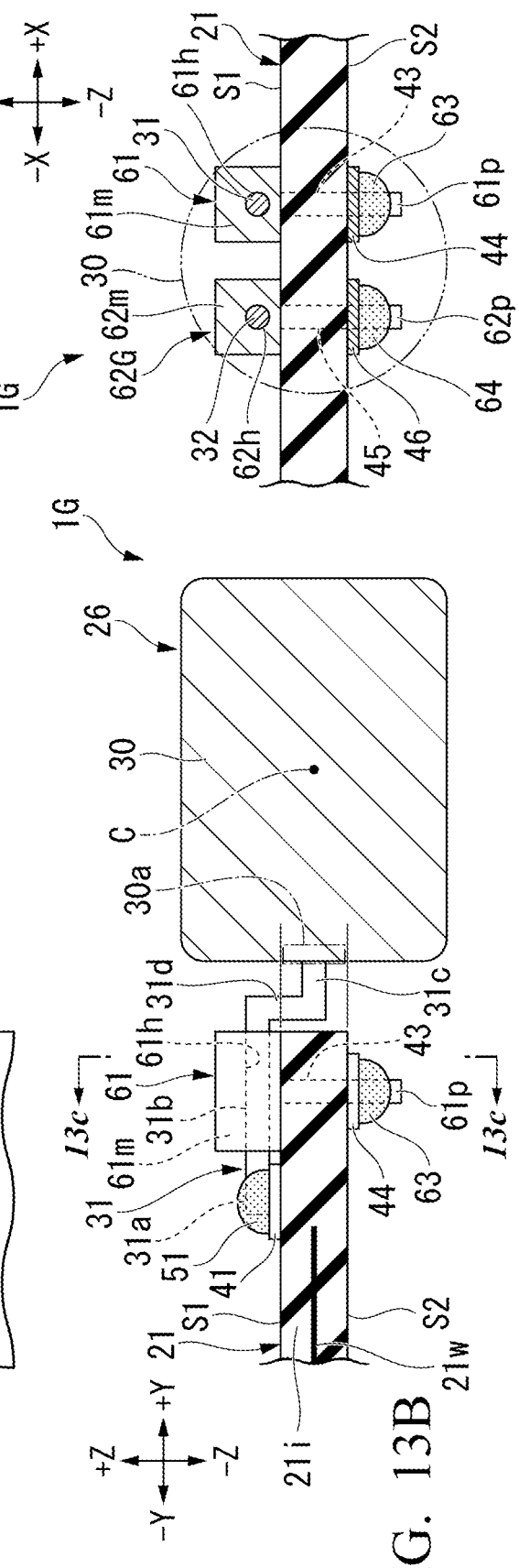

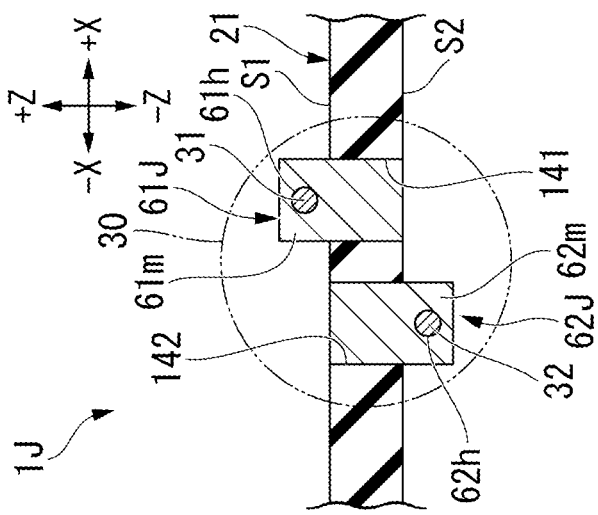
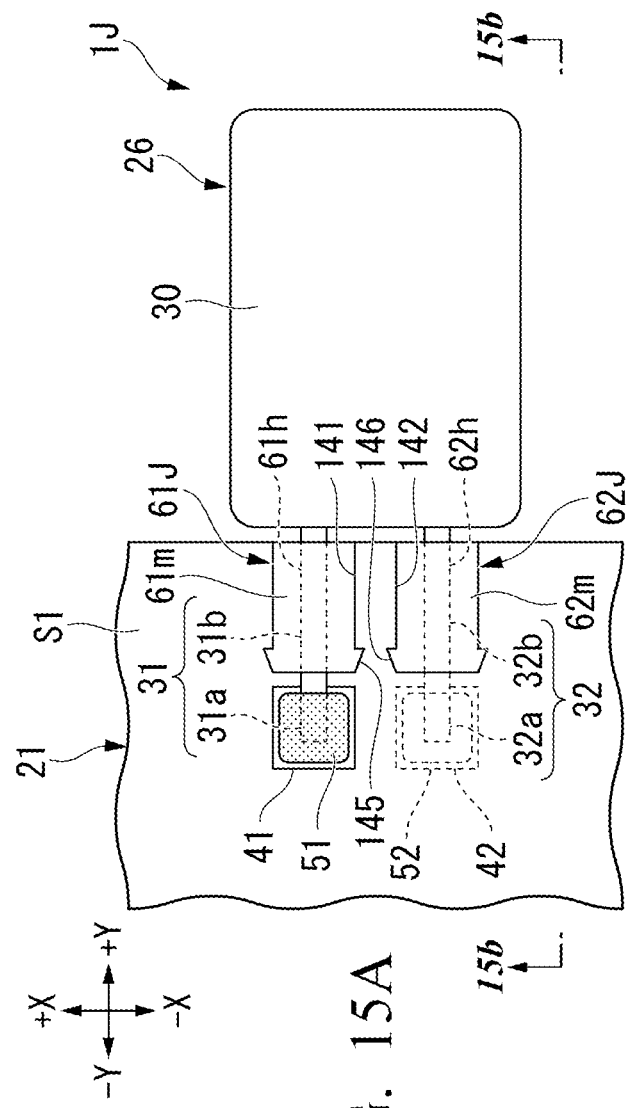
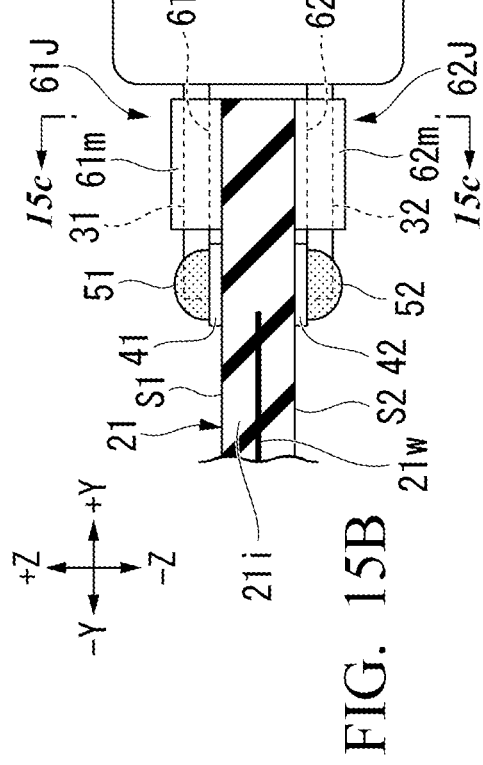

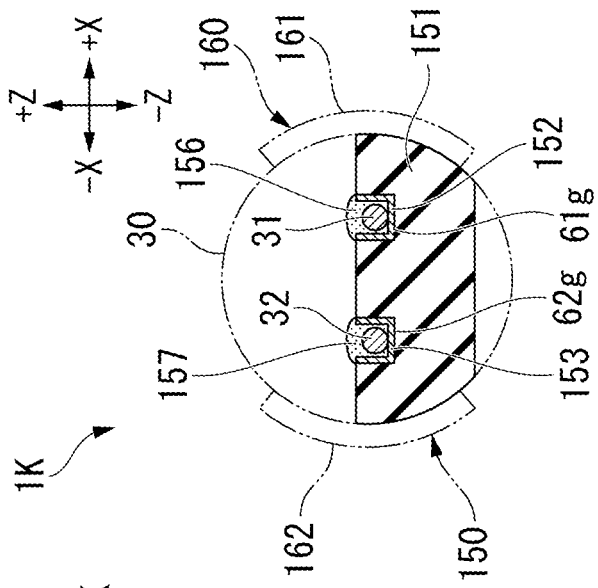
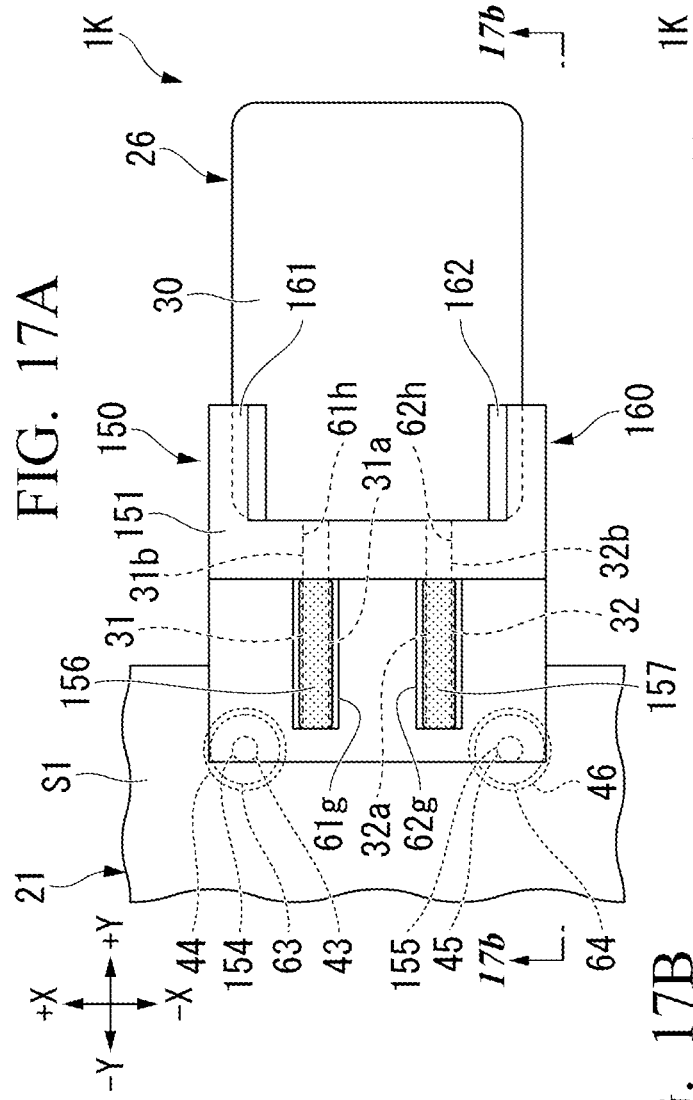
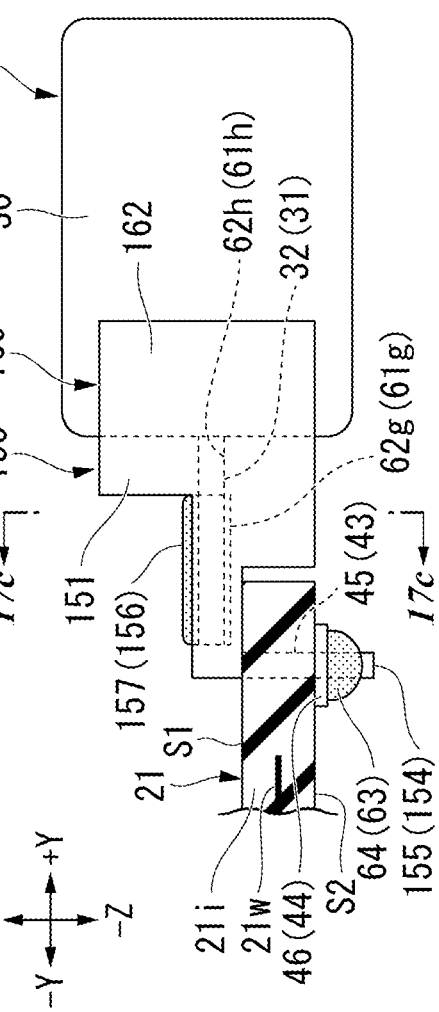

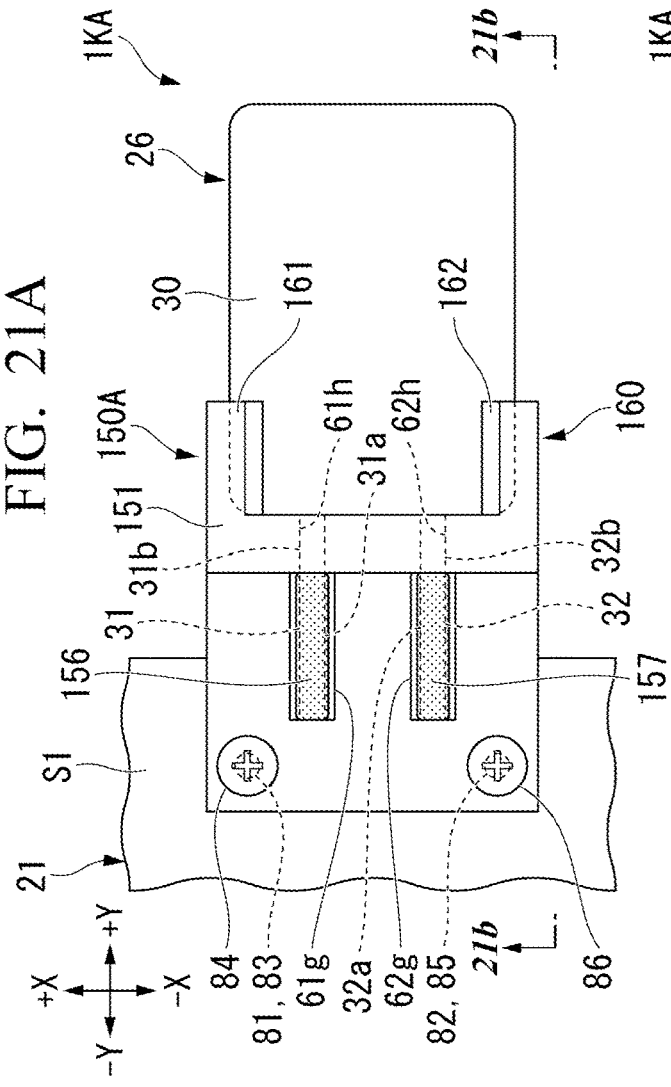
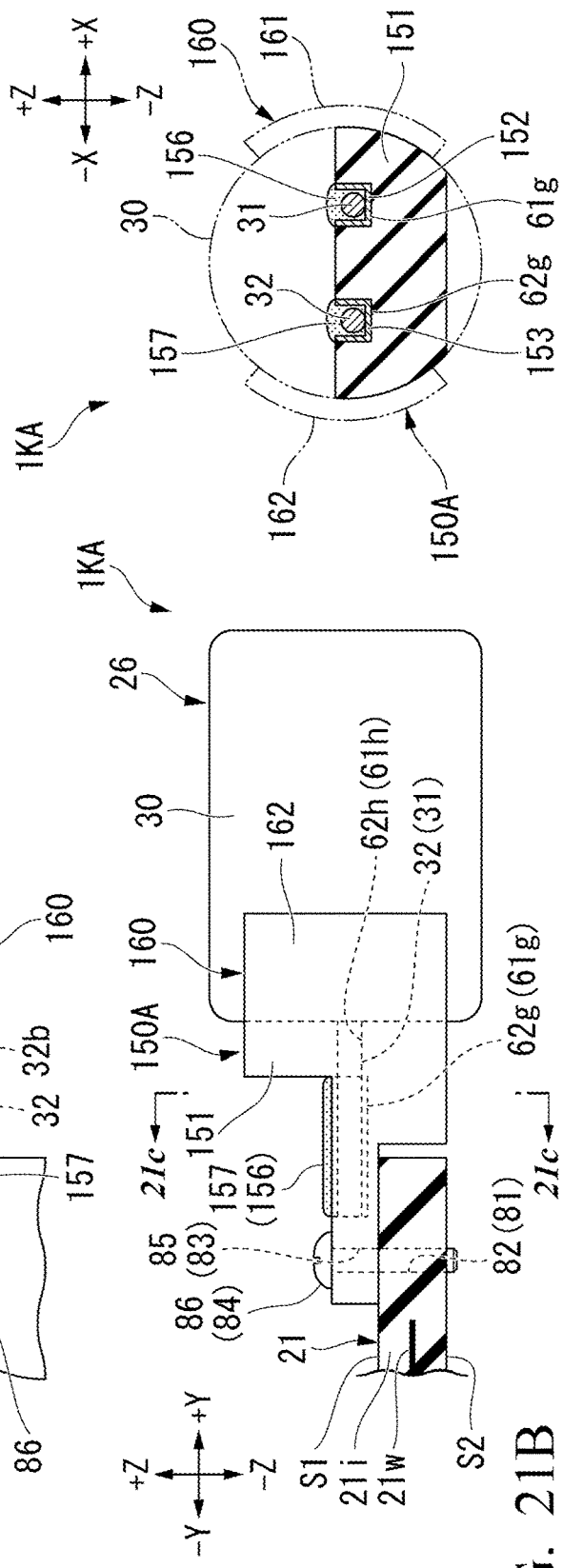
FIG. 21A
FIG. 21B
FIG. 21C

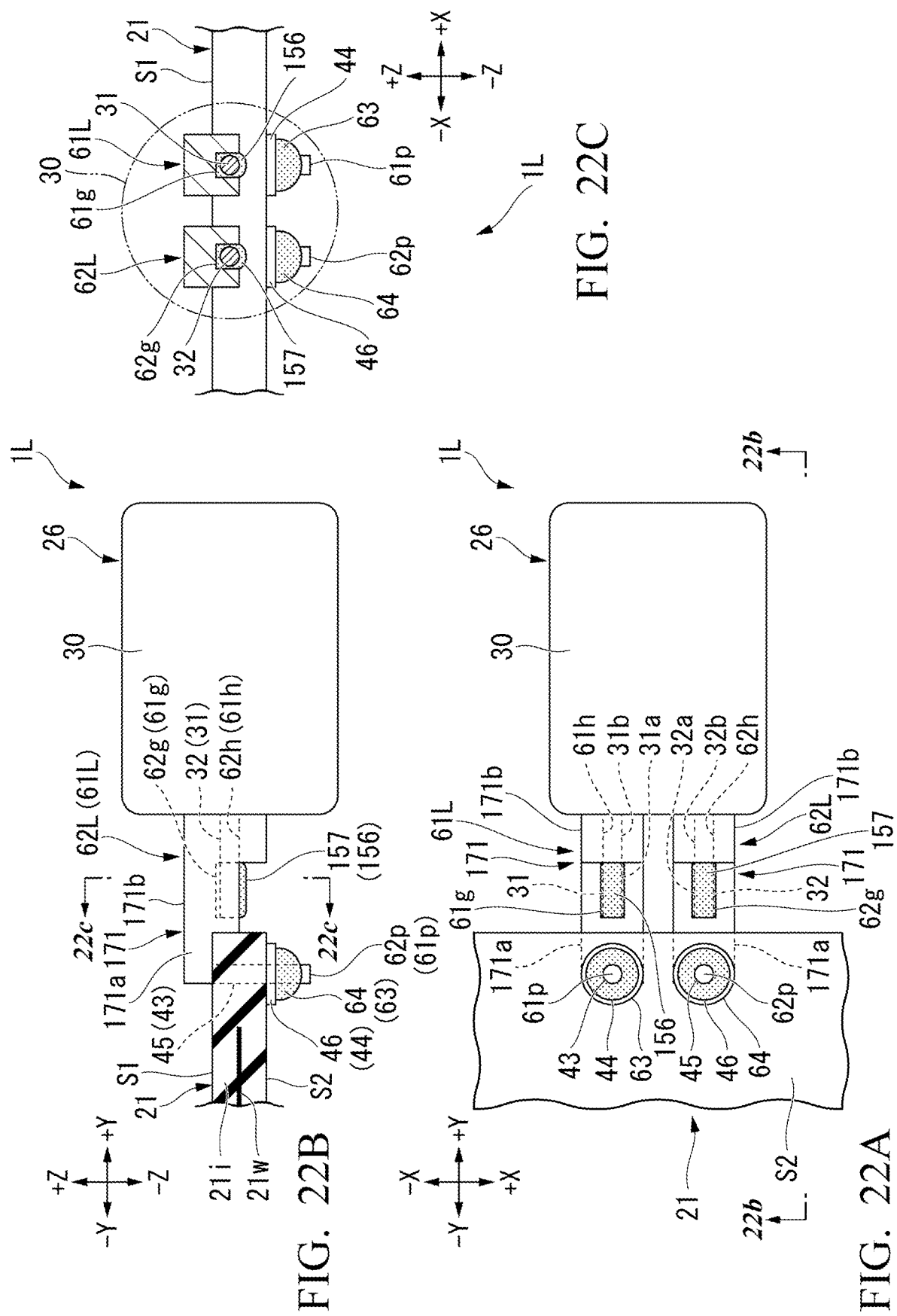

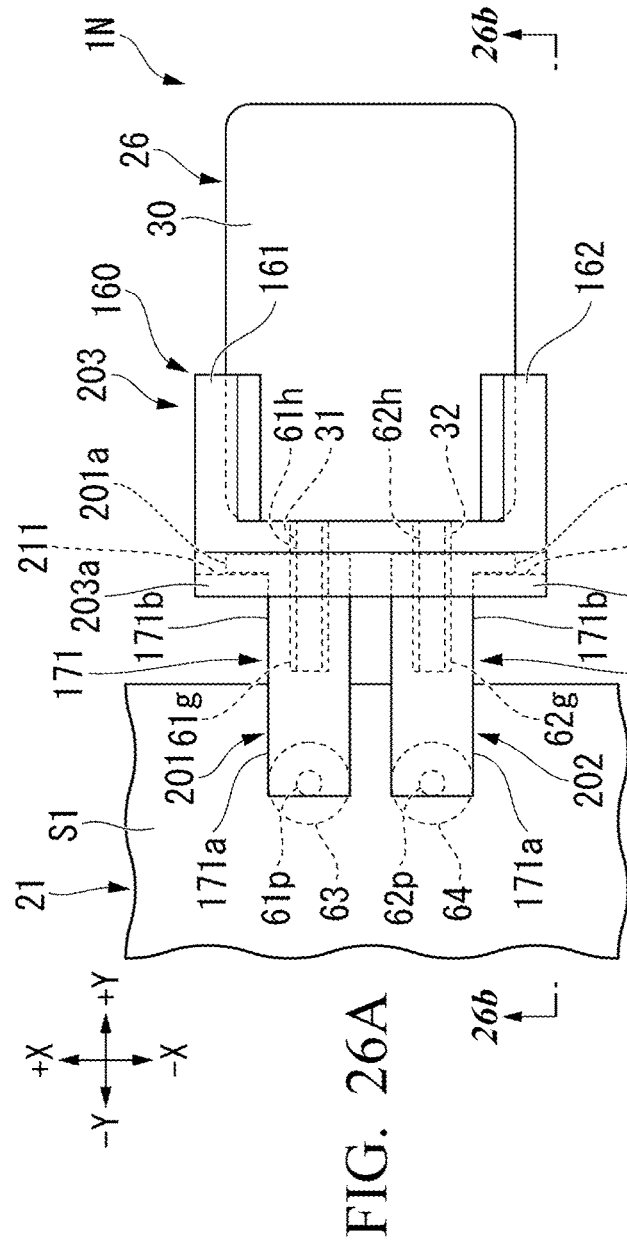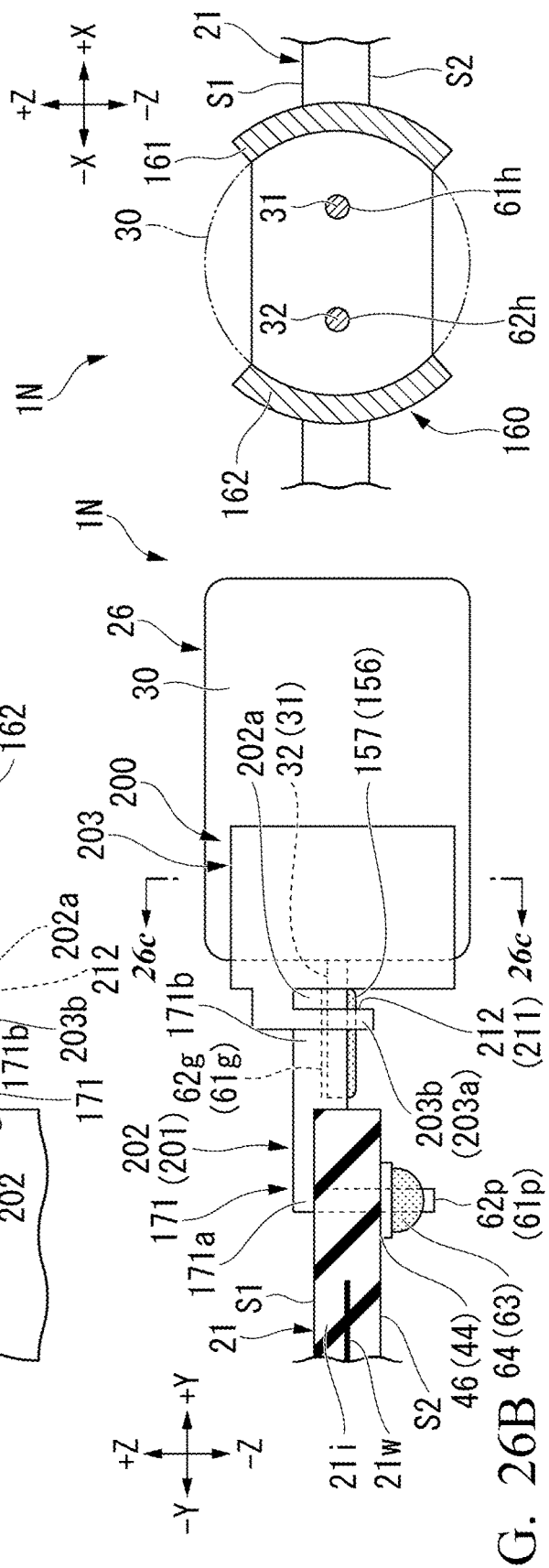
FIG. 26A
FIG. 26B
FIG. 26C

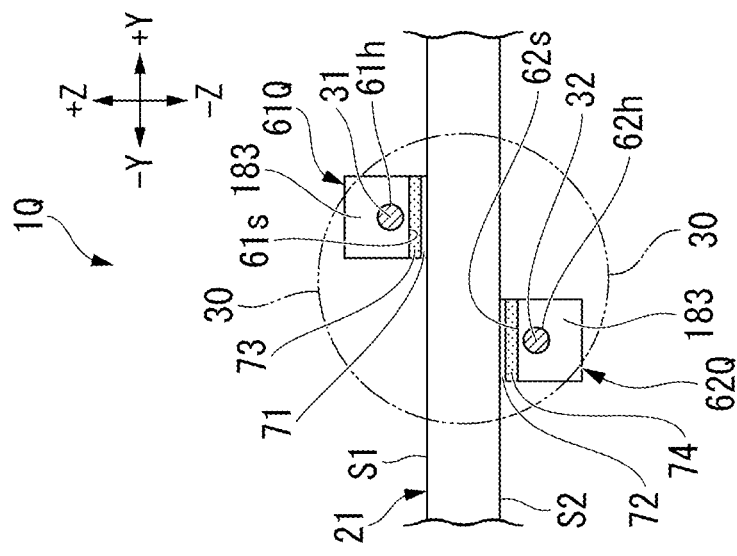
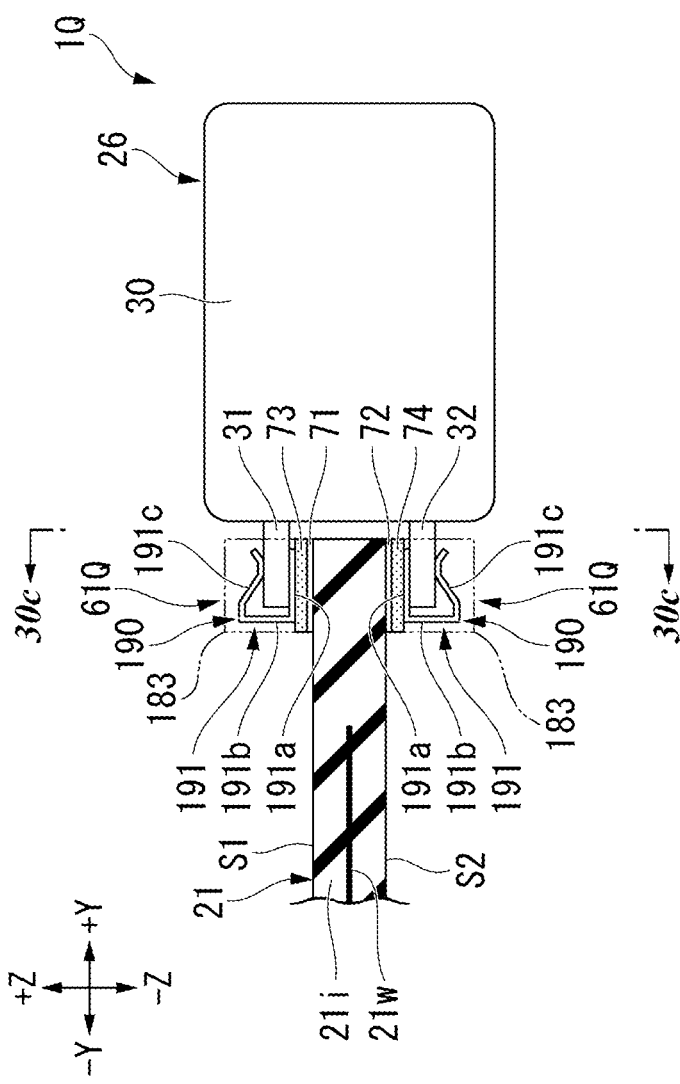
FIG. 30A
FIG. 30B

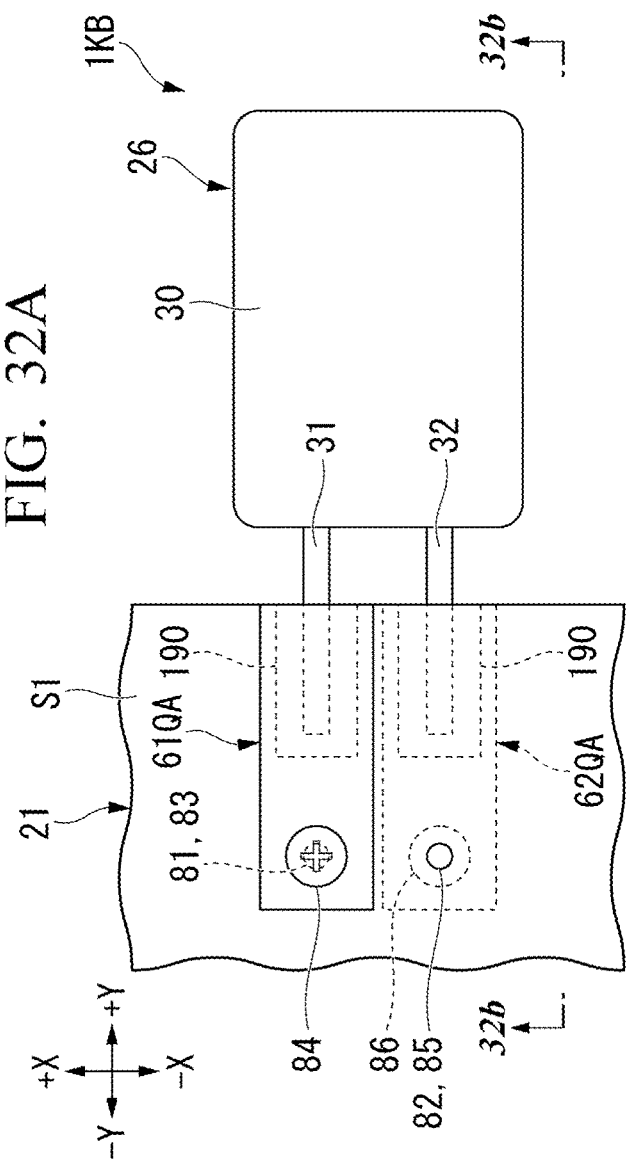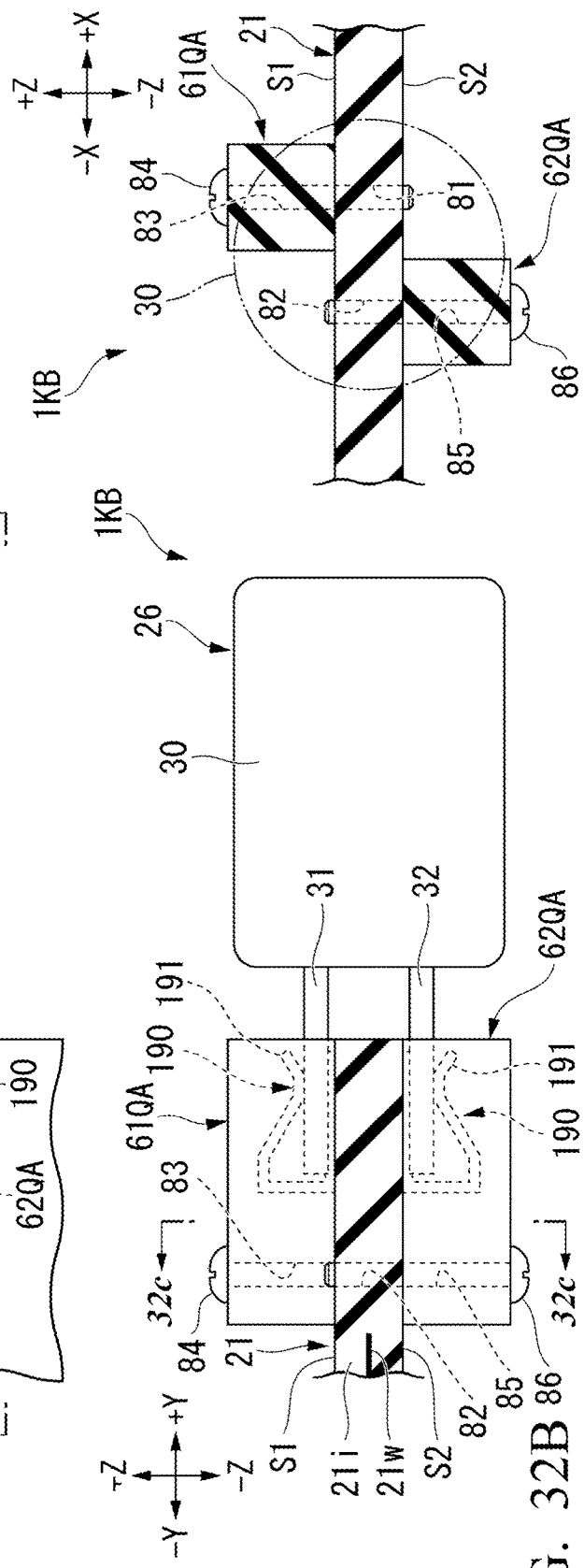

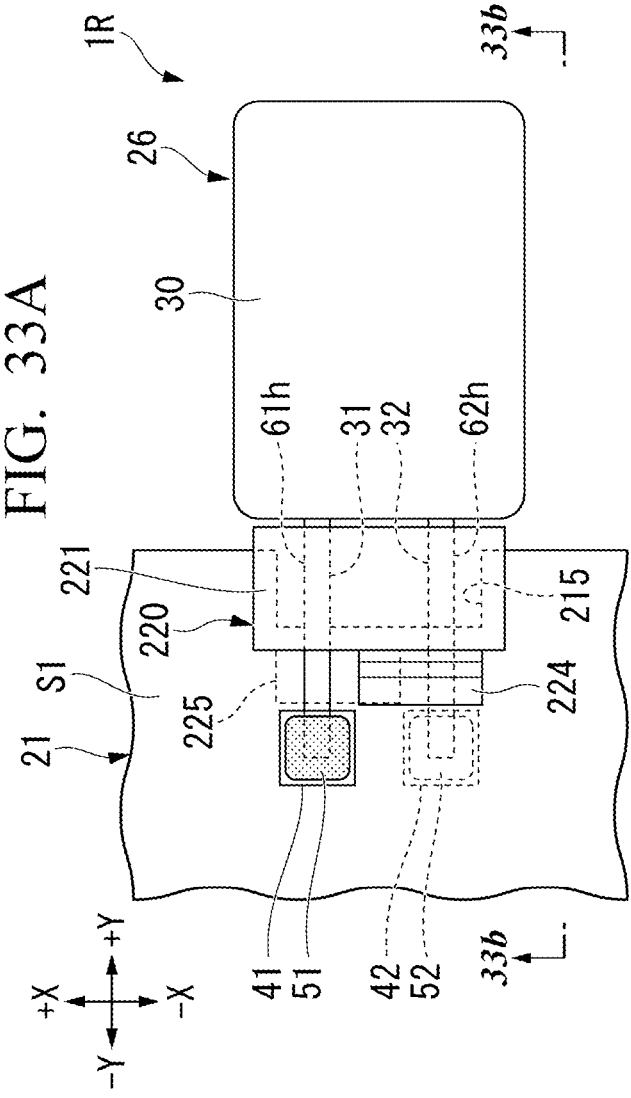
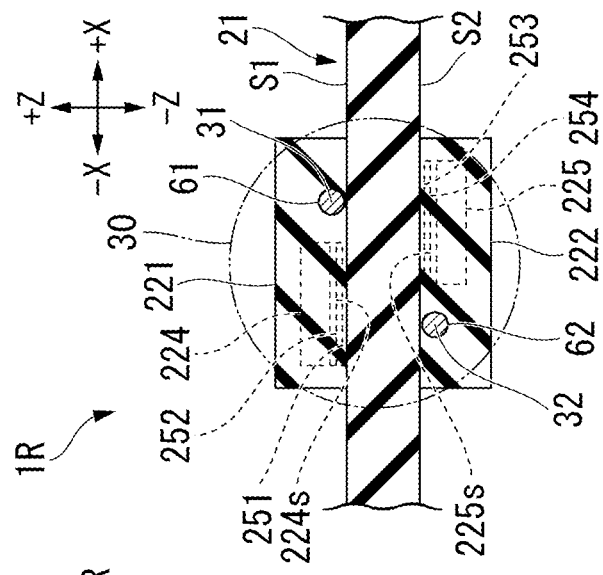
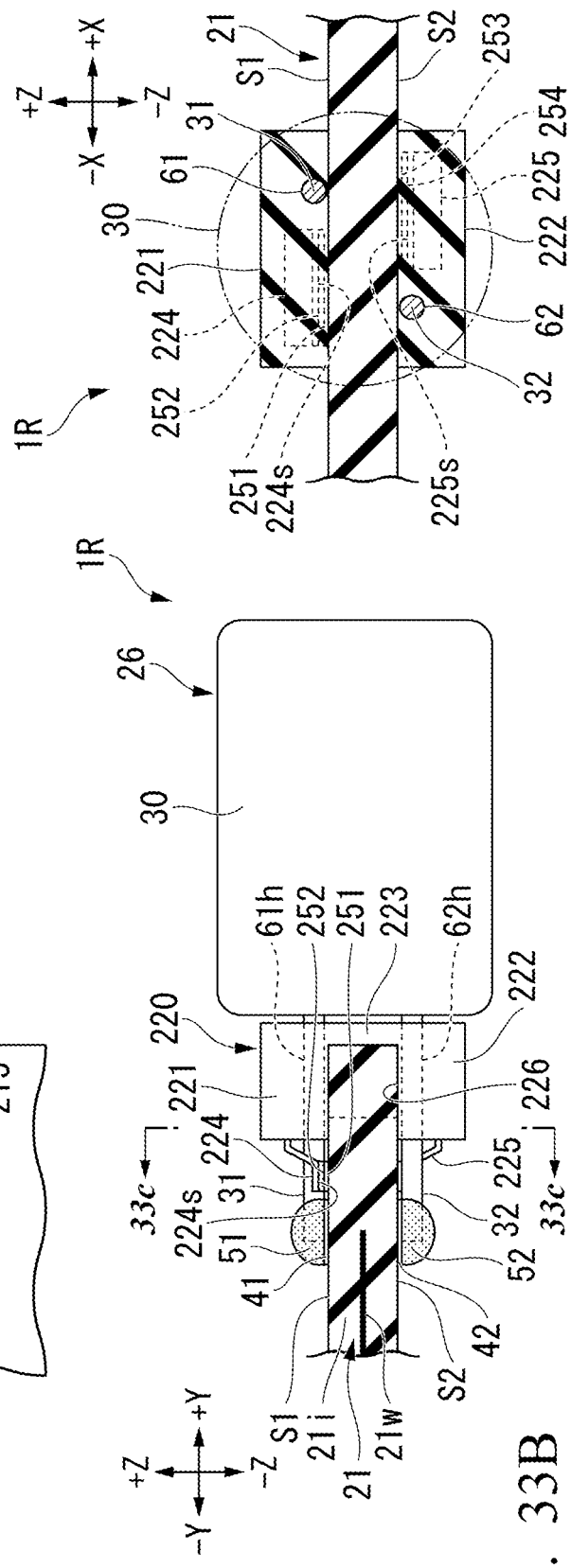

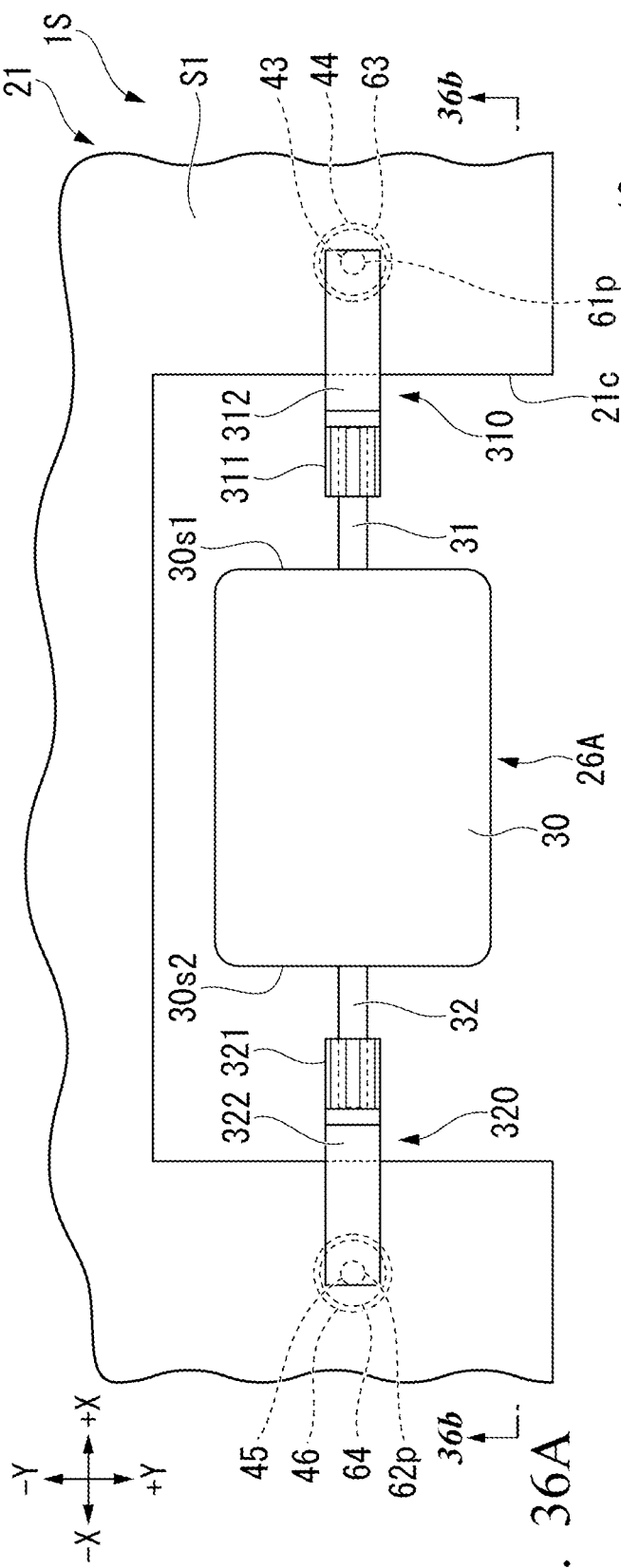
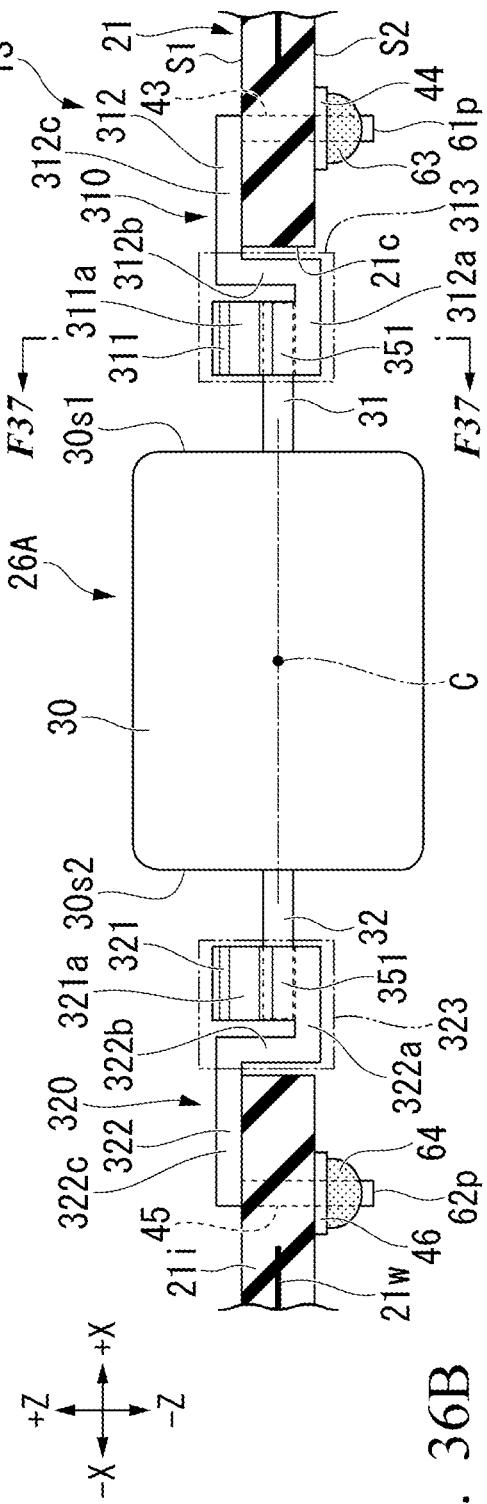
FIG. 36A
FIG. 36B

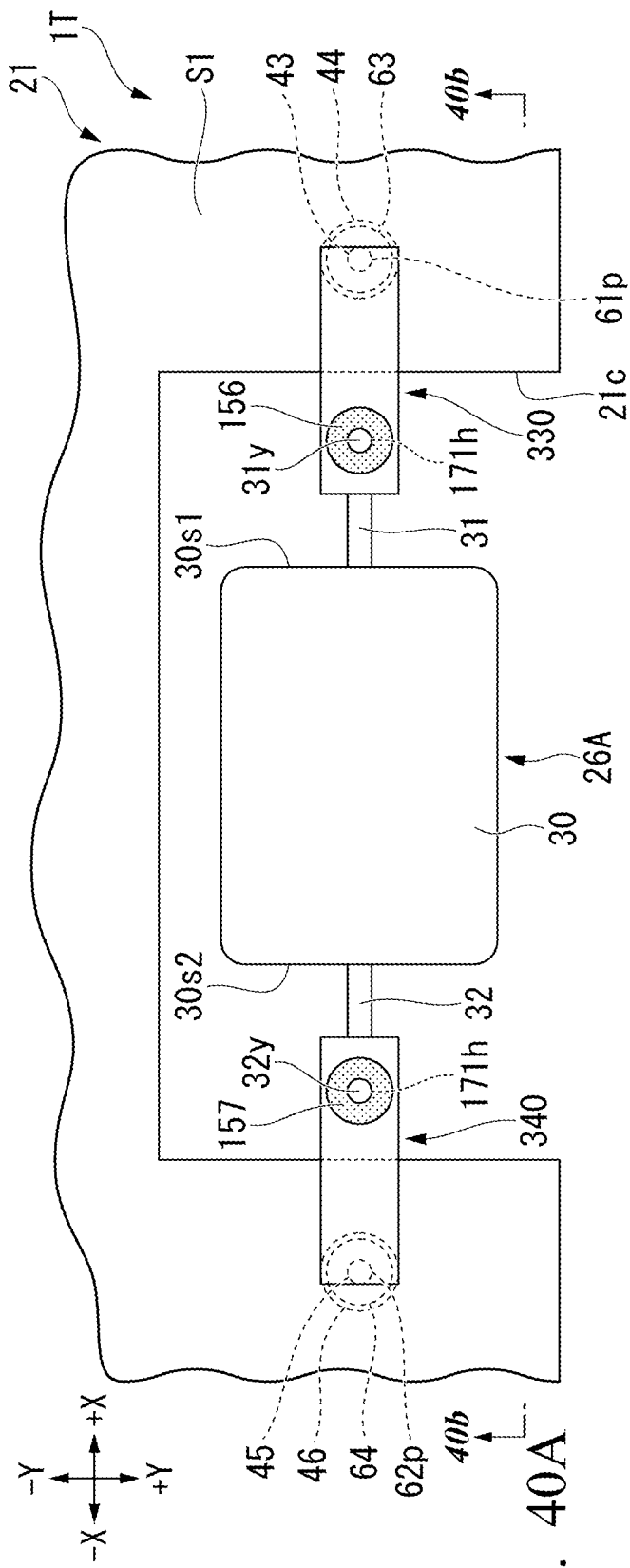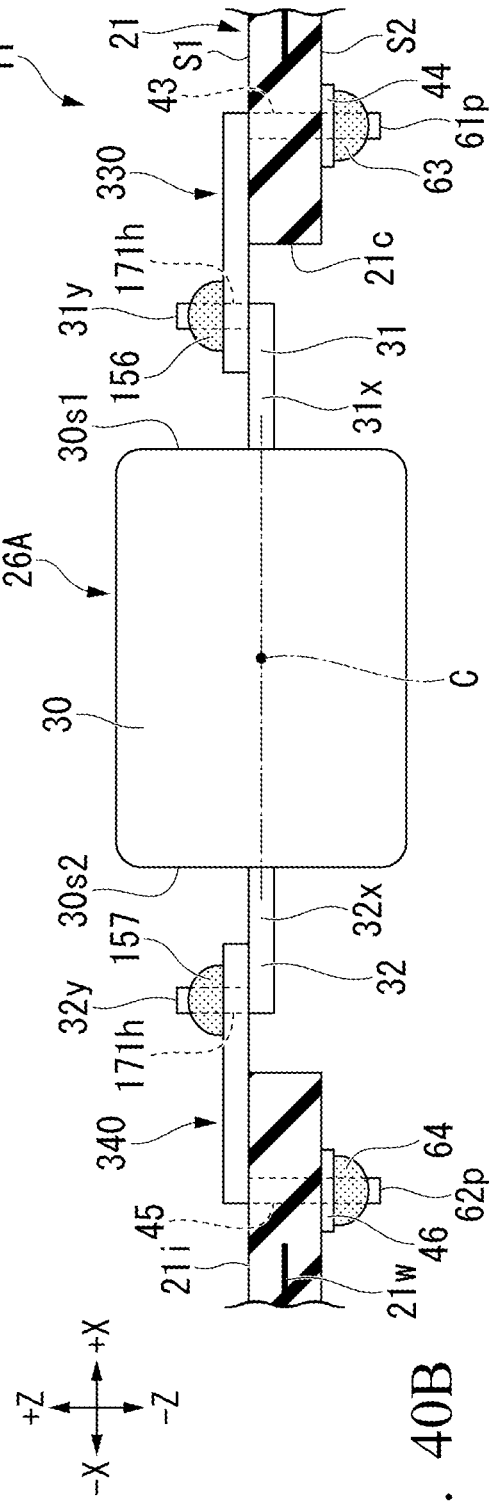
FIG. 40A
FIG. 40B

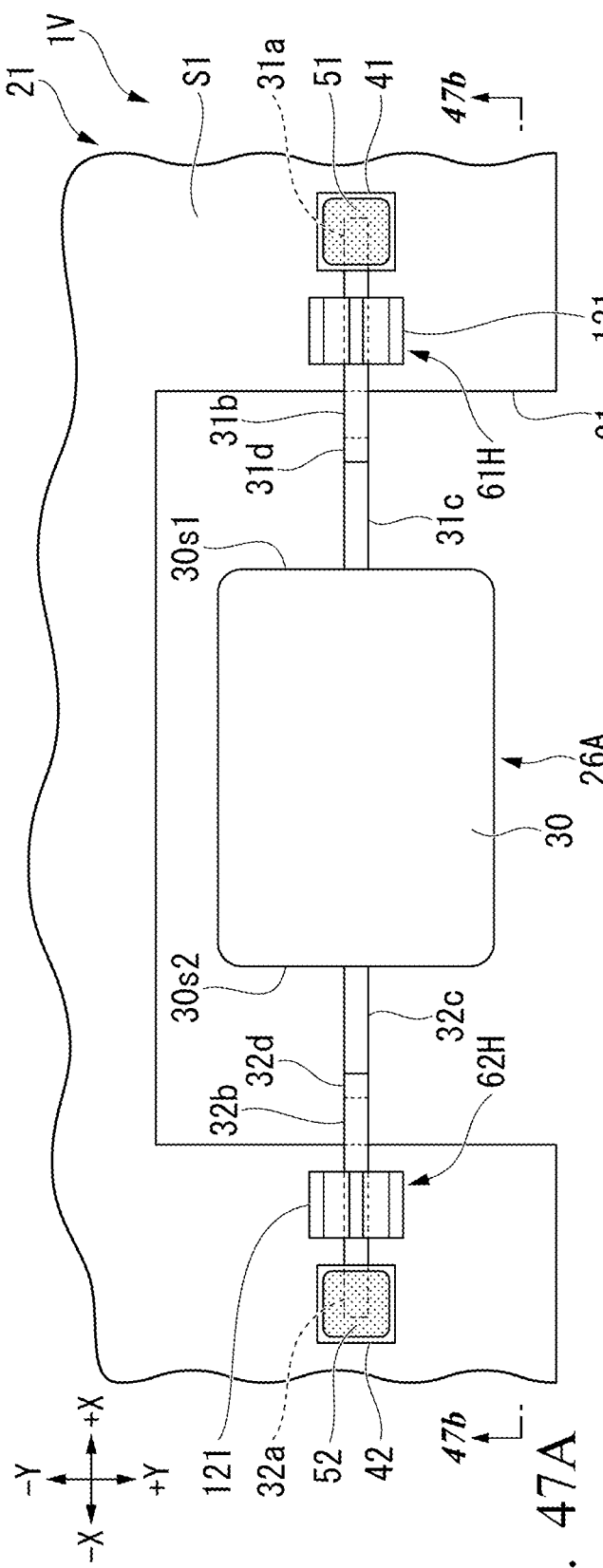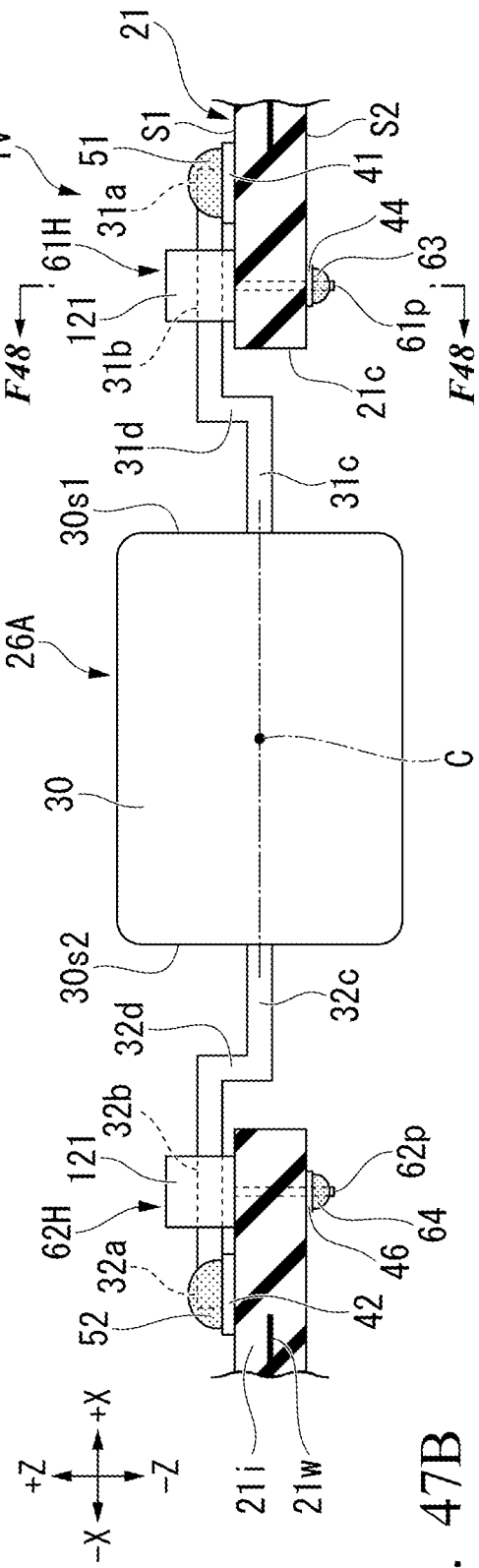
FIG. 47A
FIG. 47B

SEMICONDUCTOR STORAGE DEVICE

CROSS-REFERENCE TO RELATED APPLICATION

This application is based upon and claims the benefit of priority from Japanese Patent Application No. 2022-024843, filed Feb. 21, 2022, and Japanese Patent Application No. 2022-065730, filed Apr. 12, 2022; the entire contents of which are incorporated herein by reference.

FIELD

Embodiments described herein relate generally to a semiconductor storage device.

BACKGROUND

A semiconductor storage device including a board having a through-hole and an electronic component having a lead inserted into the through-hole is known.

BRIEF DESCRIPTION OF THE DRAWINGS

FIG. 3A is a plan explanatory view of a capacitor-mounting structure according to the first embodiment.

FIG. 3B is a cross-sectional explanatory view of the capacitor-mounting structure according to the first embodiment.

FIG. 3C is a cross-sectional explanatory view of the capacitor-mounting structure according to the first embodiment.

FIG. 13A is an explanatory plan view of a mounting structure of a seventh modified example according to the first embodiment.

FIG. 13B is an explanatory cross-sectional view of the mounting structure of the seventh modified example according to the first embodiment.

FIG. 13C is an explanatory cross-sectional view of the mounting structure of the seventh modified example according to the first embodiment.

FIG. 15A is an explanatory plan view of a capacitor-mounting structure according to a third embodiment.

FIG. 15B is an explanatory cross-sectional view of the capacitor-mounting structure according to the third embodiment.

FIG. 15C is an explanatory cross-sectional view of the capacitor-mounting structure according to the third embodiment.

FIG. 17A is an explanatory plan view of a capacitor-mounting structure according to a fourth embodiment.

FIG. 17B is an explanatory cross-sectional view of the capacitor-mounting structure according to the fourth embodiment.

FIG. 17C is an explanatory cross-sectional view of the capacitor-mounting structure according to the fourth embodiment.

FIG. 21A is an explanatory plan view of a mounting structure of a third modified example according to the fourth embodiment.

FIG. 21B is an explanatory cross-sectional view of the mounting structure of the third modified example according to the fourth embodiment.

FIG. 21C is an explanatory cross-sectional view of the mounting structure of the third modified example according to the fourth embodiment.

FIG. 22A is a plan explanatory view of a capacitor-mounting structure according to a fifth embodiment.

FIG. 22B is a cross-sectional explanatory view of the capacitor-mounting structure according to the fifth embodiment.

FIG. 22C is a cross-sectional explanatory view of the capacitor-mounting structure according to the fifth embodiment.

FIG. 26A is an explanatory plan view of a mounting structure of a third modified example according to the fifth embodiment.

FIG. 26B is an explanatory cross-sectional view of the mounting structure of the third modified example according to the fifth embodiment.

FIG. 26C is an explanatory cross-sectional view of the mounting structure of the third modified example according to the fifth embodiment.

FIG. 30A is a cross-sectional explanatory view of a capacitor-mounting structure according to a sixth embodiment.

FIG. 30B is a cross-sectional explanatory view of the capacitor-mounting structure according to the sixth embodiment.

FIG. 32A is an explanatory plan view of a mounting structure of a second modified example according to the sixth embodiment.

FIG. 32B is an explanatory cross-sectional view of the mounting structure of the second modified example according to the sixth embodiment.

FIG. 32C is an explanatory cross-sectional view of the mounting structure of the second modified example according to the sixth embodiment.

FIG. 33A is an explanatory plan view of a capacitor-mounting structure according to a seventh embodiment.

FIG. 33B is an explanatory cross-sectional view of the capacitor-mounting structure according to the seventh embodiment.

FIG. 33C is an explanatory cross-sectional view of the capacitor-mounting structure according to the seventh embodiment.

FIG. 36A is an explanatory plan view of a capacitor-mounting structure according to the eighth embodiment.

FIG. 36B is an explanatory cross-sectional view of the capacitor-mounting structure according to the eighth embodiment.

FIG. 40A is an explanatory plan view of a capacitor-mounting structure according to a ninth embodiment.

FIG. 40B is an explanatory cross-sectional view of the capacitor-mounting structure according to the ninth embodiment.

FIG. 47A is an explanatory plan view of a capacitor-mounting structure according to an eleventh embodiment.

FIG. 47B is an explanatory cross-sectional view of the capacitor-mounting structure according to the eleventh embodiment.

DETAILED DESCRIPTION

Figure 1:
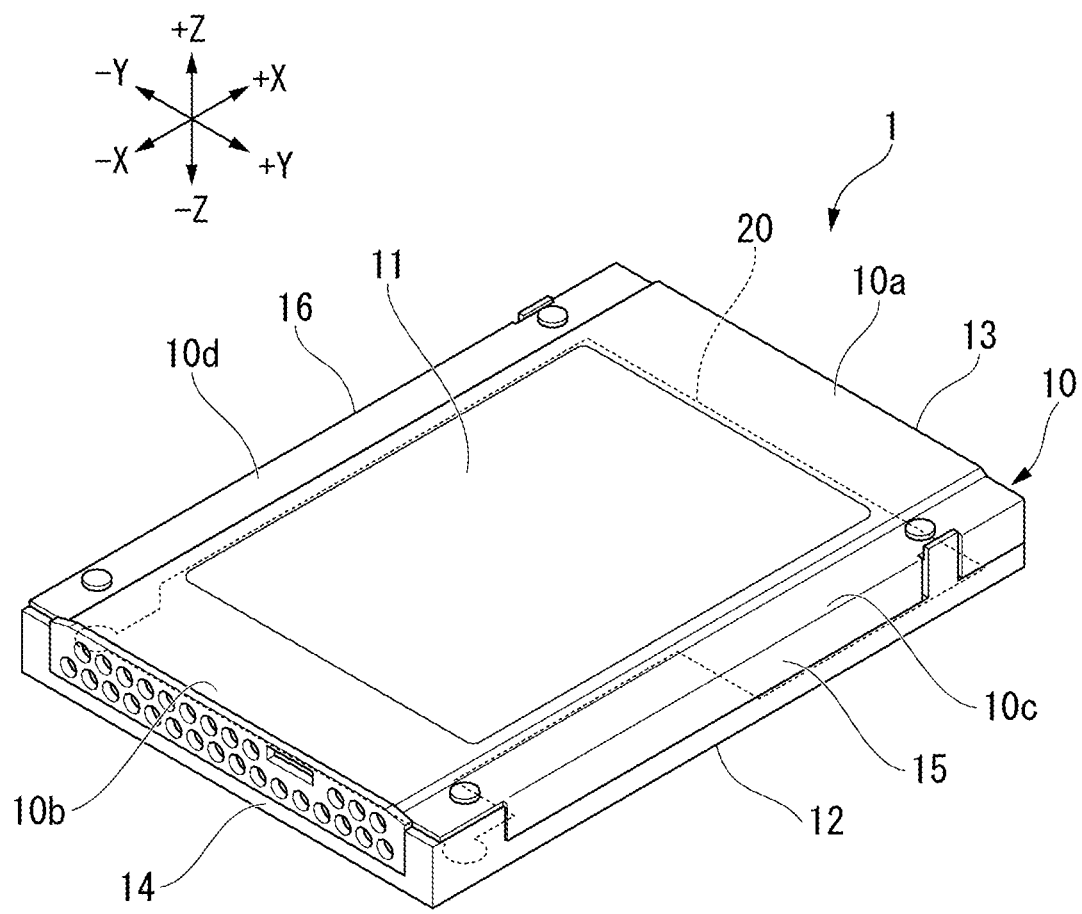
FIG. 1 is perspective view showing a semiconductor storage device according to a first embodiment.

A semiconductor storage device according to an embodiment includes a board, an electronic component, and a holder. The board has a first surface. The electronic component includes a component main body and a first lead. The component main body is at a position out of the board in a direction parallel to the first surface. The first lead protrudes from the component main body toward the board. The holder is on the board. The holder holds the first lead.

Hereinafter, a semiconductor storage device according to embodiments will be described with reference to the drawings. In the following description, configurations having the same or similar functions will be designated by the same reference signs. Duplicate descriptions of such configurations may be omitted. In the present application, "parallel" or "orthogonal" each may include "substantially parallel" or "substantially orthogonal", respectively. In the present application, "overlap" means that ideal projection images of two objects overlap each other and may include a case in which two objects are not directly in contact with each other (for example, another element is interposed between the two objects). In the present application, "connect" is not limited to mechanical connection and may include electrical connection. That is, "connect" is not limited to a case of being directly connected to an object, and may include a case of being connected to an object with another element interposed therebetween.

First of all, a +X direction, a −X direction, a +Y direction, a −Y direction, a +Z direction, and a −Z direction will be defined in advance. The +X direction, the −X direction, the +Y direction, and the −Y direction are directions parallel to a first surface S1 of a board 21 described below (refer to FIG. 2). The +X direction is a direction from a second end portion 10b toward a first end portion 10a of a housing 10 described below (refer to FIG. 1). The −X direction is a direction opposite to the +X direction. When the +X direction and the −X direction are not distinguished from each other, they will be simply referred to as "X direction". The +Y direction and the −Y direction are each a direction crossing (for example, orthogonal to) the X direction. The +Y direction is a direction from a fourth end portion 10d toward a third end portion 10c of the housing 10 described below (refer to FIG. 1). The −Y direction is a direction opposite to the +Y direction. When the +Y direction and the −Y direction are not distinguished from each other, they will be simply referred to as "Y direction". The +Z direction and the −Z direction are directions crossing (for example, orthogonal to) the X direction and the Y direction, and correspond to a thickness direction of the board 21 described later. The +Z direction is a direction from a board unit 20 toward a first main wall 11 of the housing 10 described below (refer to FIG. 1). The −Z direction is a direction opposite to the +Z direction. When the +Z direction and the −Z direction are not distinguished from each other, they will be simply referred to as "Z direction".

First Embodiment

1. Overall Configuration of Semiconductor Storage Device

A semiconductor storage device 1 according to the first embodiment will be described with reference to FIGS. 1 to 5. The semiconductor storage device 1 is a storage device, for example, SSD (Solid State Drive). The semiconductor storage device 1 may be referred to as "memory system". For example, the semiconductor storage device 1 is configured to be attached to an information processing apparatus such as a server or a personal computer and used as a storage of the information processing apparatus. In the present application, the information processing apparatus to which the semiconductor storage device 1 is configured to be attached will be referred to as a "host apparatus".

FIG. 1 is a perspective view showing the semiconductor storage device 1. The semiconductor storage device 1 includes, for example, the housing 10 and the board unit 20.

1.1 Housing

The housing 10 is formed in, for example, a flat rectangular box shape. The housing 10 has the first end portion 10a and the second end portion 10b which are separated from each other and form a pair of end portions in a longitudinal direction of the housing 10 (the X direction). The first end portion 10a has an opening (not shown in the drawings) to which an external connector 22 of the board unit 20 described below (refer to FIG. 2) is exposed to an outside of the housing 10. The housing 10 has the third end portion 10c and the fourth end portion 10d which are separated from each other and form a pair of end portions in a short direction of the housing 10 (the Y direction).

The housing 10 includes the first main wall 11, a second main wall 12, a first side wall 13, a second side wall 14, a third side wall 15, and a fourth side wall 16. The first main wall 11 is a wall parallel to the X direction and the Y direction. The first main wall 11 is located on a side in the +Z direction with respect to the board unit 20. The second main wall 12 is a wall parallel to the X direction and the Y direction. The second main wall 12 is located on a side in the −Z direction with respect to the board unit 20. Each of the first side wall 13, the second side wall 14, the third side wall 15, and the fourth side wall 16 is a wall parallel to the Z direction and extends between the end portion of the first main wall 11 and the end portion of the second main wall 12. The first side wall 13 is a side wall located at the end portion of the housing 10 on a side in the +X direction. The second side wall 14 is a side wall located at the end portion of the housing 10 on a side in the −X direction. The third side wall 15 is a side wall located at the end portion of the housing 10 on a side in the +Y direction. The fourth side wall 16 is a side wall located at the end portion on a side in the −Y direction. The board unit 20 is accommodated in the housing 10.

1.2 Board Unit

Figure 2:
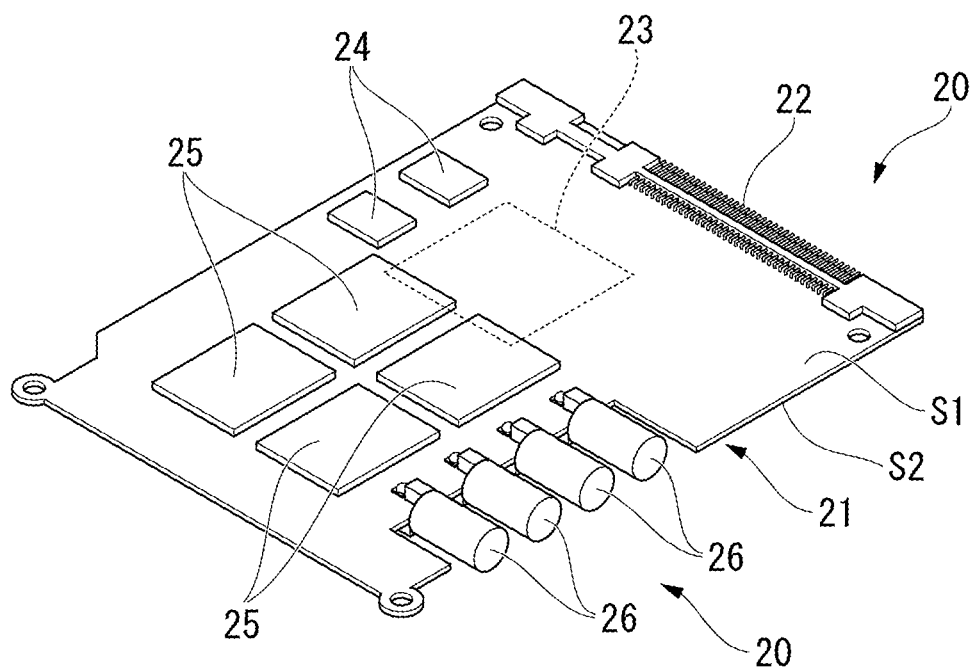
FIG. 2 is a perspective view showing a board unit according to the first embodiment.

FIG. 2 is a perspective view showing the board unit 20. The board unit 20 includes, for example, the board 21, the external connector 22, a controller 23, a plurality of DRAMs (Dynamic Random Access Memory) 24, a plurality of NAND semiconductor storage devices 25 (hereinbelow, referred to as "NAND 25"), and a plurality of capacitors 26.

The board 21 is a plate member parallel to the X direction and the Y direction. The board 21 is a printed board, and includes an insulating base member 21i and a wiring pattern 21w provided on the insulating base member 21i (refer to FIGS. 3A to 3C). The board 21 has a first surface S1 and a second surface S2. The second surface S2 is located on the opposite side of the first surface S1. The first surface S1 faces in the +Z direction. The second surface S2 faces in the −Z direction.

The external connector 22 includes a plurality of metal terminals connectable to a connector of the host apparatus. The external connector 22 is provided at the end portion of the board 21 on the side in the +X direction.

The controller 23 is configured to generally control the entire semiconductor storage device 1. The controller 23 is a semiconductor package including, for example, an SoC (System on a Chip) such as one semiconductor chip into which a host interface circuit with respect to the host apparatus, a control circuit configured to control the plurality of the DRAMs 24, a control circuit configured to control the plurality of the NANDs 25, and the like are integrated. The controller 23 is mounted on, for example, the second surface S2 of the board 21.

The DRAMs 24 are each, for example, a semiconductor package that includes a volatile semiconductor memory chip. The DRAMs 24 are each a data buffer that temporarily stores write data received from the host apparatus, and read data read from the NANDs 25, or the like. The DRAMs 24 are mounted on, for example, the first surface S1 of the board 21. At least one of the DRAMs 24 may be provided inside the controller 23.

The plurality of the NANDs 25 are arranged to align in the X direction and the Y direction. The NANDs 25 are each, for example, a semiconductor package that includes a nonvolatile semiconductor memory chip. The NANDs 25 are mounted on, for example, the first surface S1 and the second surface S2 of the board 21.

Each of the capacitors 26 has a backup power supply for data protection when shut-off of electrical power unexpectedly occurs. For example, when power supply from the host apparatus to the semiconductor storage device 1 is unexpectedly shut off, the capacitor 26 supplies electrical power to the controller 23, the plurality of the DRAMs 24, and the plurality of the NANDs 25 for a predetermined time. The capacitor 26 is, for example, an electrolytic capacitor. Furthermore, the capacitor 26 is, for example, an aluminum electrolytic capacitor. However, the capacitor 26 is not limited to the aforementioned example.

2. Capacitor-Mounting Structure

Next, a mounting structure of the capacitor 26 will be described. Hereinbelow, for example, the mounting structure of the capacitor 26 arranged next to the end portion of the board 21 on the side in the +Y direction will be described. However, the capacitor 26 may be arranged next to the end portion of the board 21 on the side in the −Y direction or the end portion of the board 21 on the side in the X direction.

FIGS. 3A to 3C are explanatory views of the mounting structure of the capacitor 26. FIG. 3A is a plan view showing the mounting structure of the capacitor 26. FIG. 3B is a cross-sectional view taken along line 1b-1b shown in FIG. 3A. FIG. 3C is a cross-sectional view taken along line 1c-1c shown in FIG. 3B. As a configuration regarding the mounting structure of the capacitor 26, the semiconductor storage device 1 is configured to include the board 21, a first connection portion 51, a second connection portion 52, a first holder 61, a second holder 62, a third connection portion 63, and a fourth connection portion 64.

2.1 Capacitor

First of all, the capacitor 26 will be described. The capacitor 26 includes, for example, a component main body 30, a first lead 31, and a second lead 32.

The component main body 30 is a part having a main function of an electronic component. For example, the component main body 30 of the capacitor 26 is a part configured to accumulate electric charge by receiving a direct-current voltage. The component main body 30 includes, for example, a metal functioning as an electrode, a dielectric, or an electrolyte. The component main body 30 is formed in a cylindrical shape having a diameter larger than a thickness of the board 21.

The component main body 30 is disposed at a position out of the board 21 in a direction parallel to the first surface S1 of the board 21 (for example, the Y direction). In other words, the component main body 30 is disposed at a position at which the component main body 30 does not overlap the board 21 when viewed from the thickness direction of the board 21 (the Z direction). In the embodiment, at least a part of the component main body 30 is arranged next to the board 21 in the Y direction. For example, a center C of the component main body 30 in the Z direction is arranged next to the board 21 in the Y direction.

The first lead 31 is a first terminal used for electrical connection. The first lead 31 protrudes from the component main body 30 in a direction approaching the board 21 (for example, the −Y direction). That is, the first lead 31 protrudes from the component main body 30 toward the board 21. The first lead 31 is located closer to the side in the +Z direction than the first surface S1 of the board 21 in the Z direction. At least a part of the first lead 31 overlaps the first surface S1 of the board 21 in the Z direction. At least a part of the first lead 31 extends parallel to the first surface S1 of the board 21. In the embodiment, the first lead 31 extends from the component main body 30 in a straight shape through the entire length of the first lead 31. The first lead 31 includes a first lead portion 31a and a second lead portion 31b. The first lead portion 31a is connected to the board 21 by the first connection portion 51 described below. The second lead portion 31b is connected to the board 21 by the first holder 61 described below. The second lead portion 31b is located between the first lead portion 31a and the component main body 30.

The second lead 32 is a second terminal used for electrical connection. The second lead 32 has a polarity different from that of the first lead 31. The second lead 32 is independent from the first lead 31. The second lead 32 protrudes from the component main body 30 in a direction approaching the board 21 (for example, the −Y direction). That is, the second lead 32 protrudes from the component main body 30 toward the board 21. The second lead 32 is located closer to the side in the −Z direction than the second surface S2 of the board 21 in the Z direction. In other words, the second lead 32 is located on the opposite side of the first lead 31 with respect to the board 21 in the Z direction. At least a part of the second lead 32 overlaps the second surface S2 of the board 21 in the Z direction. At least a part of the second lead 32 extends parallel to the second surface S2 of the board 21. In the embodiment, the second lead 32 extends from the component main body 30 in a straight shape through the entire length of the second lead 32. The second lead 32 includes a first lead portion 32a and a second lead portion 32b. The first lead portion 32a is connected to the board 21 by the second connection portion 52 described below. The second lead portion 32b is connected to the board 21 by the second holder 62 described below. The second lead portion 32b is located between the first lead portion 32a and the component main body 30.

Figure 4:
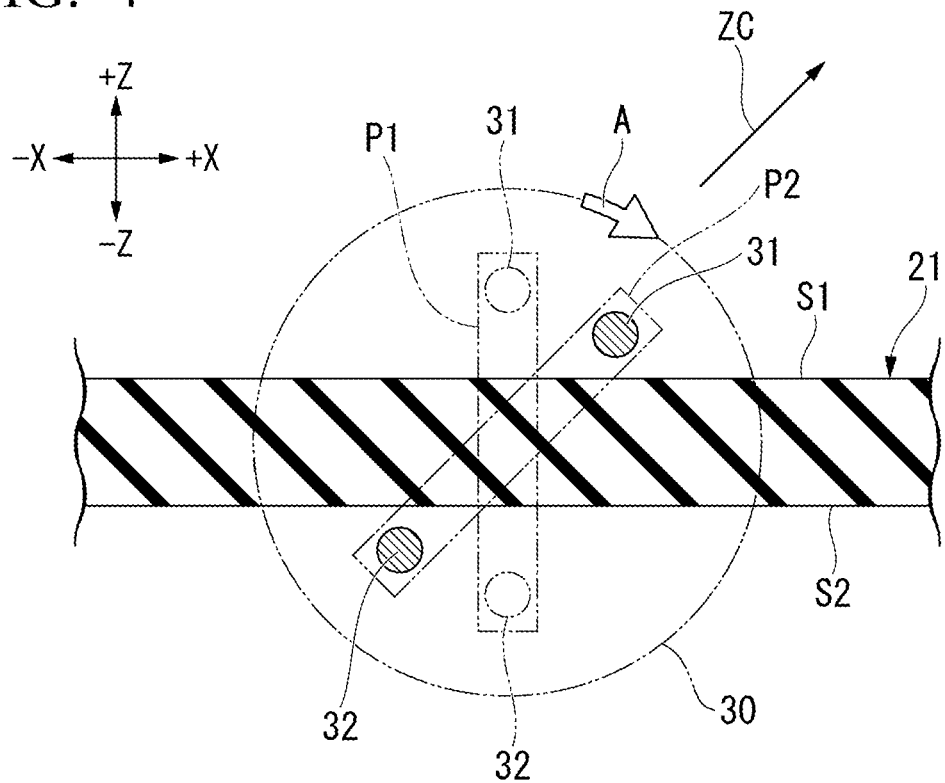
FIG. 4 is an explanatory view of positions of a first lead and a second lead according to the first embodiment.

FIG. 4 is an explanatory view of positions of the first lead 31 and the second lead 32 with respect to the board 21. Note that, FIG. 4 shows a pair of the first lead 31 and the second lead 32 of the capacitor 26 having the same posture. Specifically, FIG. 4 shows that the positions of the first lead 31 and the second lead 32 are changed by rotating the capacitor 26 in a state of maintaining the same posture of the capacitor 26. In FIG. 4, reference numeral P1 shows an arrangement state in which the first lead 31 and the second lead 32 are arranged in the Z direction, and reference numeral P2 shows an arrangement state in which the first lead 31 and the second lead 32 are arranged in an inclined direction ZC with respect to the Z direction. In other words, FIG. 4 shows a case of rotating the capacitor 26 in a direction represented by reference letter A around an axis parallel to the Z direction in a state in which the posture of the capacitor 26 in the X direction, the Y direction, and the Z direction is maintained in the same state. In the embodiment, the first lead 31 and the second lead 32 are arranged in the inclined direction ZC by rotating the capacitor 26 in the direction A. Consequently, even in a case in which a distance between the first lead 31 and the second lead 32 is larger than a thickness of the board 21, due to the rotation of the capacitor 26, the first lead 31 is arranged adjacent to the first surface S1 of the board 21, and the second lead 32 is arranged adjacent to the second surface S2 of the board 21.

2.2 Board

Returning to FIGS. 3A to 3C, the board 21 will be described. The board 21 includes, for example, a first pad 41, a second pad 42, a first through-hole 43, a first land 44, a second through-hole 45, and a second land 46.

The first pad 41 is a conductive portion provided on the first surface S1 of the board 21. The first pad 41 is used for surface mounting. The first pad 41 is connected to the wiring pattern 21w of the board 21. The first pad 41 overlaps the first lead portion 31a of the first lead 31 of the capacitor 26 in the Z direction. The first lead 31 of the capacitor 26 is electrically connected to the first pad 41.

The second pad 42 is a conductive portion provided on the second surface S2 of the board 21. The second pad 42 is used for surface mounting. The second pad 42 is connected to the wiring pattern 21w of the board 21. The second pad 42 overlaps the first lead portion 32a of the second lead 32 of the capacitor 26 in the Z direction. The second lead 32 of the capacitor 26 is electrically connected to the second pad 42.

The first through-hole 43 is a through-hole penetrating through the board 21 in the Z direction. The first through-hole 43 overlaps the first holder 61 described below in the Z direction. The first holder 61 is attached to the first through-hole 43. The first land 44 is a conductive portion provided on the second surface S2 of the board 21. The first land 44 is provided around the first through-hole 43.

The second through-hole 45 is a through-hole penetrating through the board 21 in the Z direction. The second through-hole 45 overlaps the second holder 62 described below in the Z direction. The second holder 62 is attached to the second through-hole 45. The second land 46 is a conductive portion provided on the first surface S1 of the board 21. The second land 46 is provided around the second through-hole 45.

2.3 First Connection Portion

The first connection portion 51 is provided on the first pad 41. The first connection portion 51 electrically connects the first lead portion 31a of the first lead 31 and the first pad 41. The first connection portion 51 is an electrical connection portion provided outside the first holder 61. The first connection portion 51 is formed of, for example, a conductive bonding material (solder, electroconductive paste, or the like). The first connection portion 51 is a member that mainly achieves, for example, electrical connection between the first lead 31 and the first pad 41. The first connection portion 51 may not need to have mechanical strength for holding the capacitor 26.

2.4 Second Connection Portion

The second connection portion 52 is provided on the second pad 42. The second connection portion 52 electrically connects the first lead portion 32a of the second lead 32 and the second pad 42. The second connection portion 52 is an electrical connection portion provided outside the second holder 62. The second connection portion 52 is formed of, for example, a conductive bonding material (solder, electroconductive paste, or the like). The second connection portion 52 is a member that mainly achieves, for example, electrical connection between the second lead 32 and the second pad 42. The second connection portion 52 may not need to have mechanical strength for holding the capacitor 26.

2.5 First Holder

The first holder 61 is a holding member that holds the first lead 31. The first holder 61 is fixed on the board 21. The first holder 61 holds the first lead 31 and thereby fixes the capacitor 26 on the board 21 in position. The first holder 61 is made of, for example, metal. In the embodiment, the first holder 61 is mounted on the first surface S1 of the board 21. The maximum height H1 of the first holder 61 with respect to the first surface S1 of the board 21 in the +Z direction is lower than the maximum height H2 of the capacitor 26 with respect to the first surface S1 of the board 21 in the +Z direction.

Figure 5:
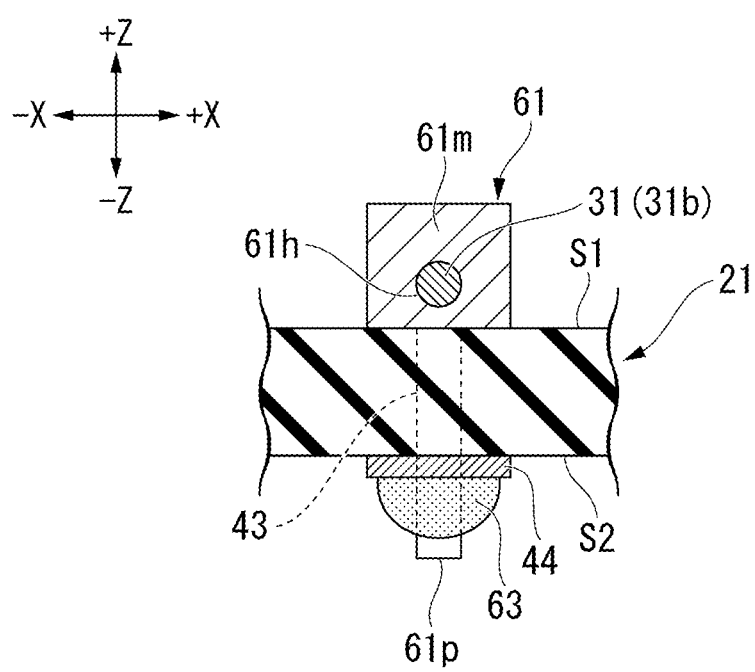
FIG. 5 is an enlarged cross-sectional view showing a region surrounded by a line F5 of FIG. 3C.

FIG. 5 is an enlarged cross-sectional view showing a region surrounded by a line F5 of FIG. 3C. The first holder 61 includes, for example, a holder main body 61m and a protruding portion 61p. The holder main body 61m is a cuboid provided along the first surface S1 of the board 21. The holder main body 61m has a through-hole 61h penetrating therethrough in the Y direction. The first lead 31 is inserted into the through-hole 61h in the Y direction. Since the first lead 31 is inserted into the through-hole 61h, the holder main body 61m holds the second lead portion 31b of the first lead 31.

The protruding portion 61p is connected to the holder main body 61m. The protruding portion 61p protrudes from the holder main body 61m in the −Z direction. The protruding portion 61p is inserted into the first through-hole 43 of the board 21. A leading end of the protruding portion 61p protrudes from the second surface S2 of the board 21 in the −Z direction. The protruding portion 61p is formed of, for example, a metal such as yellow brass, copper, iron, or the like. The protruding portion 61p may be a metal screw. The protruding portion 61p serving as a screw may be fixed on the board 21 by being engaged with a screw hole provided on the board 21 or a fixing member (for example, screw nut) provided on the second surface S2 of the board 21. In this case, the third connection portion 63 described below may be omitted.

2.6 Second Holder

Returning to FIGS. 3A to 3C, the second holder 62 will be described. The second holder 62 is a holding member that holds the second lead 32. The second holder 62 is fixed on the board 21. The second holder 62 holds the second lead 32 and thereby fixes the capacitor 26 on the board 21 in position. The second holder 62 is a separate body from the first holder 61. The second holder 62 is made of, for example, metal. In the embodiment, the second holder 62 is mounted on the second surface S2 of the board 21. That is, the second holder 62 is located on the opposite side of the first holder 61 with respect to the board 21 in the Z direction. The maximum height H3 of the second holder 62 with respect to the second surface S2 of the board 21 in the −Z direction is lower than the maximum height H4 of the capacitor 26 with respect to the second surface S2 of the board 21 in the −Z direction.

The second holder 62 includes, for example, a holder main body 62m and a protruding portion 62p. The holder main body 62m is a cuboid provided along the second surface S2 of the board 21. The holder main body 62m has a through-hole 62h penetrating therethrough in the Y direction. The second lead 32 is inserted into the through-hole 62h in the Y direction. Since the second lead 32 is inserted into the through-hole 62h, the holder main body 62m holds the second lead portion 32b of the second lead 32.

The protruding portion 62p is connected to the holder main body 62m. The protruding portion 62p protrudes from the holder main body 62m in the +Z direction. The protruding portion 62p is inserted into the second through-hole 45 of the board 21. The leading-end of the protruding portion 62p protrudes from the first surface S1 of the board 21 in the +Z direction. The protruding portion 62p is formed of, for example, a metal such as yellow brass, copper, iron, or the like. The protruding portion 62p may be a metal screw. The protruding portion 62b serving as a screw may be fixed on the board 21 by being engaged with a screw hole provided on the board 21 or a fixing member (for example, screw nut) provided on the first surface S1 of the board 21. In this case, the fourth connection portion 64 described below may be omitted.

2.7 Third Connection Portion

The third connection portion 63 is provided on the first land 44. The third connection portion 63 fixes the protruding portion 61p of the first holder 61 on the first land 44. The third connection portion 63 is, for example, a conductive bonding material (solder, electroconductive paste, or the like). However, the third connection portion 63 may be an adhesive or the like without electroconductivity.

2.8 Fourth Connection Portion

The fourth connection portion 64 is provided on the second land 46. The fourth connection portion 64 fixes the protruding portion 62p of the second holder 62 on the second land 46. The fourth connection portion 64 is, for example, a conductive bonding material (solder, electroconductive paste, or the like). However, the fourth connection portion 64 may be an adhesive or the like without electroconductivity.

3. Method of Manufacturing Board Unit

Next, an example of a method of manufacturing the board unit 20 will be described. First of all, the protruding portion 61p of the first holder 61 is inserted into the first through-hole 43 of the board 21, and the first holder 61 is mounted on the first surface S1 of the board 21. Subsequently, the third connection portion 63 is provided at the protruding portion 61p and the first land 44 of the first holder 61, and the first holder 61 is fixed on the board 21. Similarly, the protruding portion 62p of the second holder 62 is inserted into the second through-hole 45 of the board 21, and the second holder 62 is mounted on the second surface S2 of the board 21. Subsequently, the fourth connection portion 64 is provided at the protruding portion 62p and the second land 46 of the second holder 62, and the second holder 62 is fixed on the board 21.

After that, the first lead 31 of the capacitor 26 is inserted into the through-hole 61h of the first holder 61. The second lead 32 of the capacitor 26 is inserted into the through-hole 62h of the second holder 62. Consequently, the first lead 31 is held by the first holder 61, and the second lead 32 is held by the second holder 62. Accordingly, in a bonding step of the first lead 31 and the second lead 32 to the board 21 described below, displacement of the first lead 31 with respect to the first pad 41 and displacement of the second lead 32 with respect to the second pad 42 are suppressed.

Subsequently, in the bonding step of the first lead 31 to the board 21, the first connection portion 51 that connects the first lead portion 31a of the first lead 31 and the first pad 41 is provided, and the first lead 31 is electrically connected to the first pad 41. For example, the first connection portion 51 may be provided by a reflow process that is carried out at the same time as a bonding step of mounting the electronic components (for example, the DRAMs 24 and the NANDs 25) on the first surface S1 of the board 21. Similarly, in the bonding step of the second lead 32 to the board 21, the second connection portion 52 that connects the first lead portion 32a of the second lead 32 and the second pad 42 is provided, and the second lead 32 is electrically connected to the second pad 42. For example, the second connection portion 52 may be provided by a reflow process that is carried out at the same time as the bonding step of mounting the electronic components (for example, the controller 23 and the NANDs 25) on the second surface S2 of the board 21.

4. Advantage

In the embodiment, the semiconductor storage device 1 includes the board 21, the capacitor 26, and the first holder 61. The capacitor 26 includes the component main body 30 and the first lead 31. The component main body 30 is disposed at a position out of the board 21 in the Y direction. The first lead 31 protrudes from the component main body 30 in a direction approaching the board 21. That is, the first lead 31 protrudes from the component main body 30 toward the board 21. The first holder 61 is fixed on the board 21. The first holder 61 holds the first lead 31. With this configuration, since the component main body 30 of the capacitor 26 is disposed at a position out of the board 21, the housing 10 can be thinner as compared to a case in which the board 21 and the component main body 30 of the capacitor 26 are disposed so as to overlap each other in the Z direction. Consequently, it is possible to reduce the thickness of the semiconductor storage device 1.

Furthermore, as the first holder 61 is provided in the semiconductor storage device 1, displacement of the first lead 31 is suppressed during manufacture of the semiconductor storage device 1. Accordingly, it is possible to increase a degree of workability of the bonding step of the first lead 31 with respect to the board 21, and it is possible to increase a degree of manufacturability of the semiconductor storage device 1. Additionally, as the first holder 61 is provided in the semiconductor storage device 1, a load such as vibration or shock is prevented from being concentrated at the first connection portion 51, and it is possible to increase a degree of vibration resistance and a degree of impact resistance of the semiconductor storage device 1. Furthermore, as the first holder 61 is provided in the semiconductor storage device 1, a degree of flexibility in the shape of the first lead 31 and a degree of bonding of the first lead 31 increase such that a first lead 31 formed in a linear shape can be bonded to the first pad 41 not having a through-hole or the like. Accordingly, it is possible to reduce the thickness of the semiconductor storage device 1 or it is possible to increase a degree of manufacturability of the semiconductor storage device 1. It is possible to reduce the thickness of the semiconductor storage device 1 and it is possible to increase a degree of manufacturability of the semiconductor storage device 1.

In the embodiment, at least a part of the capacitor 26 is arranged next to the board 21 in the direction parallel to the first surface S1 of the board 21. With this configuration, it is possible to further reduce the thickness of the semiconductor storage device 1.

In the embodiment, the first lead 31 includes the first lead portion 31a and the second lead portion 31b. The second lead portion 31b is located between the first lead portion 31a and the component main body 30. The first connection portion 51 electrically connects the first lead portion 31a of the first lead 31 and the board 21. The first holder 61 holds the second lead portion 31b of the first lead 31. With this configuration, a portion close to the component main body 30 is held by the first holder 61 as compared to a case in which the first lead portion 31a of the first lead 31 is held by the first holder 61. Consequently, a load such as vibration or shock is further prevented from being concentrated at the first connection portion 51, and it is possible to further increase a degree of vibration resistance and a degree of impact resistance of the semiconductor storage device 1.

From another viewpoint of the embodiment, the semiconductor storage device 1 includes the board 21 and the capacitor 26. The board 21 has the first surface S1 and the second surface S2. The second surface S2 is located on the opposite side of the first surface S1. The capacitor 26 includes the component main body 30, the first lead 31, and the second lead 32. The component main body 30 is disposed at a position out of the board 21 in a direction parallel to the first surface S1 of the board 21. The first lead 31 protrudes from the component main body 30 toward the board 21. The first lead 31 has a portion overlapping the first surface S1 of the board 21 in the thickness direction of the board 21. The first lead 31 is electrically connected to the board 21. The second lead 32 protrudes from the component main body 30 toward the board 21. The second lead 32 has a portion located on an opposite side of the first lead 31 with respect to the board 21. The second lead 32 is electrically connected to the board 21. With this configuration, the housing 10 can be thinner as compared to a case in which the board 21 and the component main body 30 of the capacitor 26 are disposed so as to overlap each other in the Z direction. Consequently, it is possible to reduce the thickness of the semiconductor storage device 1.

5. Modified Examples

Next, modified examples according to the first embodiment will be described. Configurations of each of the modified examples other than those described below are the same as those of the aforementioned first embodiment. Each of the modified examples described below may be achieved by being appropriately combined with configurations of another modified example or another embodiment.

First Modified Example

Figure 6:
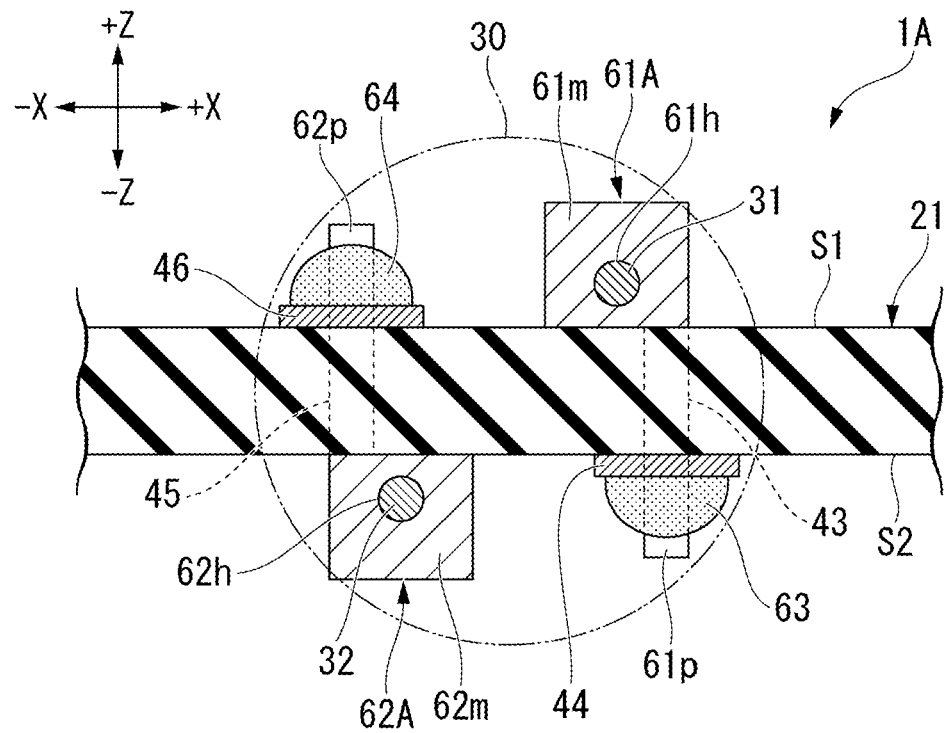
FIG. 6 is an explanatory view of a mounting structure of a first modified example according to the first embodiment.

FIG. 6 is an explanatory view of a mounting structure of the capacitor 26 of a first modified example. A semiconductor storage device 1A of the first modified example includes a first holder 61A instead of the first holder 61 and includes a second holder 62A instead of the second holder 62.

The protruding portion 61p of the first holder 61A is provided at a position displaced from the through-hole 61h in the X direction. At least a part of the protruding portion 61p protrudes in the −Z direction from a region of the holder main body 61m at which the through-hole 61h is not provided. Similarly, the protruding portion 62p of the second holder 62A is provided at a position displaced from the through-hole 62h in the X direction. At least a part of the protruding portion 62p protrudes in the +Z direction from a region of the holder main body 62m at which the through-hole 62h is not provided. With this configuration, it is possible to increase rigidities of the first holder 61A and the second holder 62A.

Second Modified Example

Figure 7:
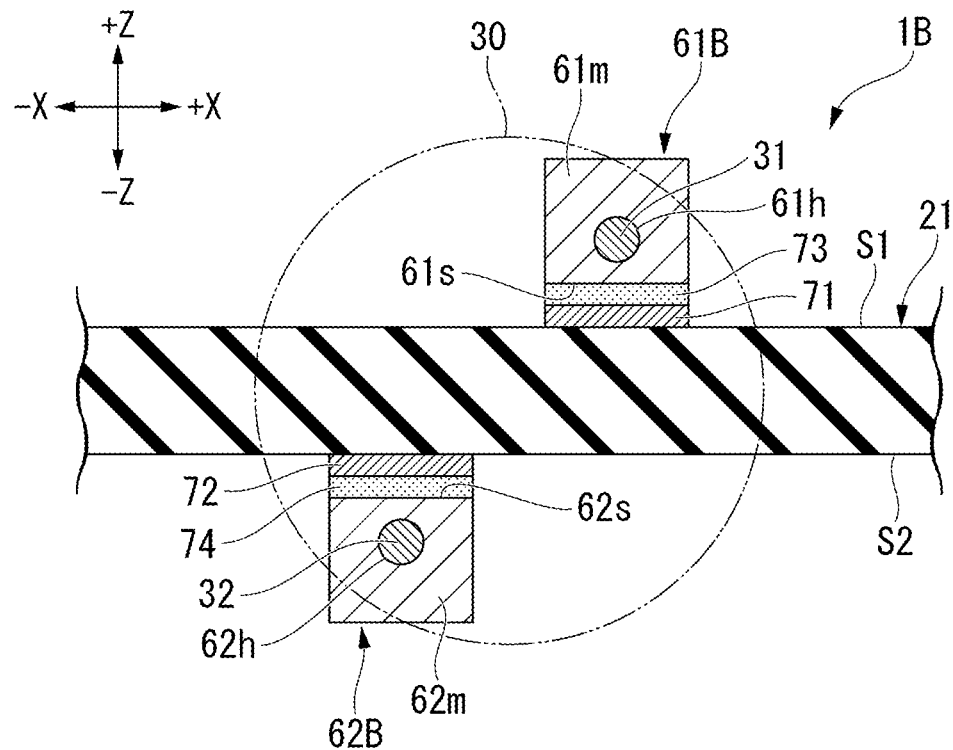
FIG. 7 is an explanatory view of a mounting structure of a second modified example according to the first embodiment.

FIG. 7 is an explanatory view of a mounting structure of the capacitor 26 of a second modified example. A semiconductor storage device 1B of the second modified example includes a first holder 61B instead of the first holder 61 and includes a second holder 62B instead of the second holder 62.

The board 21 includes a third pad 71 instead of the first through-hole 43 and the first land 44. The third pad 71 is a conductive portion provided on the first surface S1 of the board 21. The third pad 71 is used for surface mounting. Similarly, the board 21 includes a fourth pad 72 instead of the second through-hole 45 and the second land 46. The fourth pad 72 is a conductive portion provided on the second surface S2 of the board 21. The fourth pad 72 is used for surface mounting.

In the modified example, the first holder 61B does not include the protruding portion 61p. The first holder 61B has a metal flat surface 61s facing the third pad 71. The first holder 61B is fixed on the third pad 71 via a connection portion 73. That is, the first holder 61 is mounted on a surface of the first surface S1 of the board 21. The connection portion 73 is formed of, for example, a conductive bonding material (for example, solder or electroconductive paste). For example, the connection portion 73 may be provided by a reflow process that is carried out at the same time as the bonding step of mounting the electronic components (for example, the DRAMs 24 and the NANDs 25) on the first surface S1 of the board 21.

Similarly, the second holder 62B does not include the protruding portion 62p. The second holder 62B has a flat surface 62s facing the fourth pad 72. The second holder 62B is fixed on the fourth pad 72 via a connection portion 74. That is, the second holder 62 is mounted on a surface of the second surface S2 of the board 21. The connection portion 74 is formed of, for example, a conductive bonding material (for example, solder or electroconductive paste). For example, the connection portion 74 may be provided by a reflow process that is carried out at the same time as the bonding step of mounting the electronic components (for example, the controller 23 and the NANDs 25) on the second surface S2 of the board 21.

Third Modified Example

Figure 8:
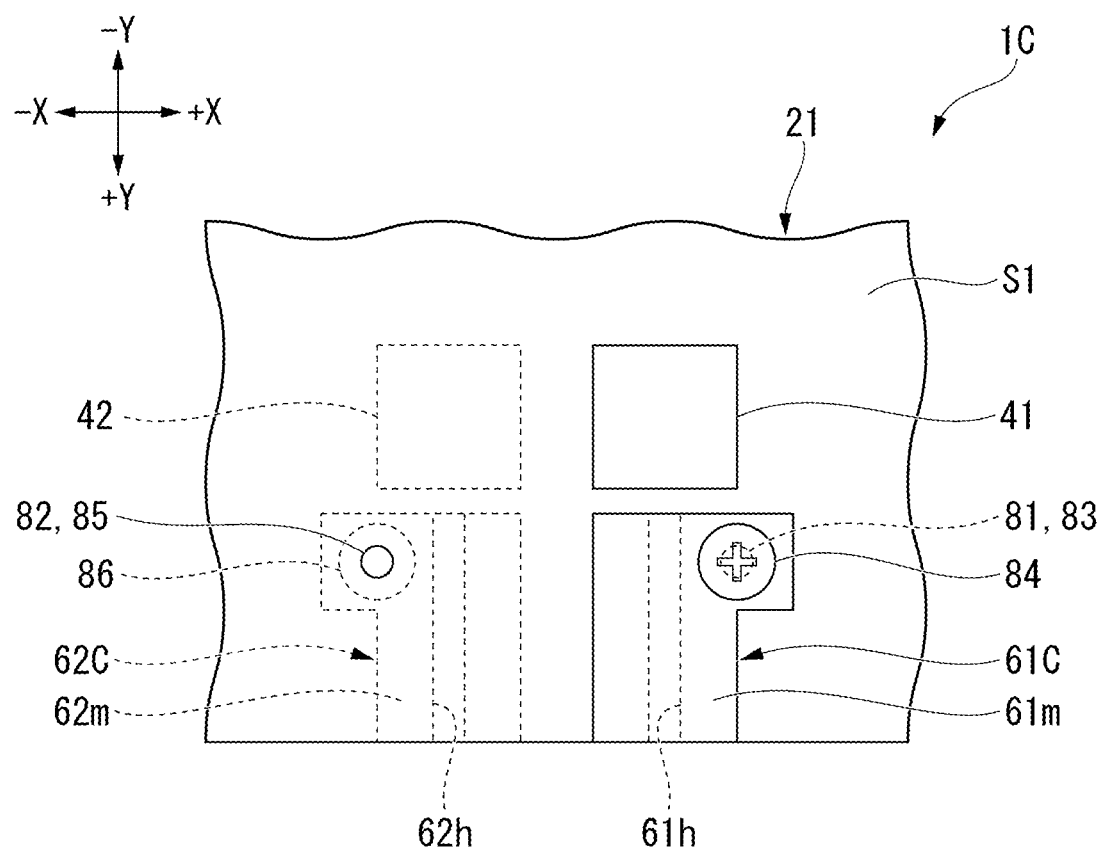
FIG. 8 is an explanatory view of a mounting structure of a third modified example according to the first embodiment.

FIG. 8 is an explanatory view of a mounting structure of the capacitor 26 of a third modified example. A semiconductor storage device 1C of the third modified example includes a first holder 61C instead of the first holder 61 and a second holder 62C instead of the second holder 62.

The board 21 has a screw hole 81 instead of the first through-hole 43 and the first land 44. Similarly, the board 21 has a screw hole 82 instead of the second through-hole 45 and the second land 46. In the modified example, the first holder 61C has a screw-insertion hole 83 in communication with the screw hole 81 of the board 21. The first holder 61C is inserted into the screw-insertion hole 83. The first holder 61C is fixed on the board 21 by a screw 84 engaged with the screw hole 81. Similarly, the second holder 62C has a screw-insertion hole 85 in communication with the screw hole 82 of the board 21. The second holder 62C is inserted into the screw-insertion hole 85. The second holder 62C is fixed on the board 21 by a screw 86 engaged with the screw hole 82. Note that, the mechanical fixing structure may be a fastening member, for example, a screw or the like instead of the screws 84 and 86 and may be a welded fixing structure by welding or the like with respect to the board 21.

Fourth Modified Example

Figure 9B:
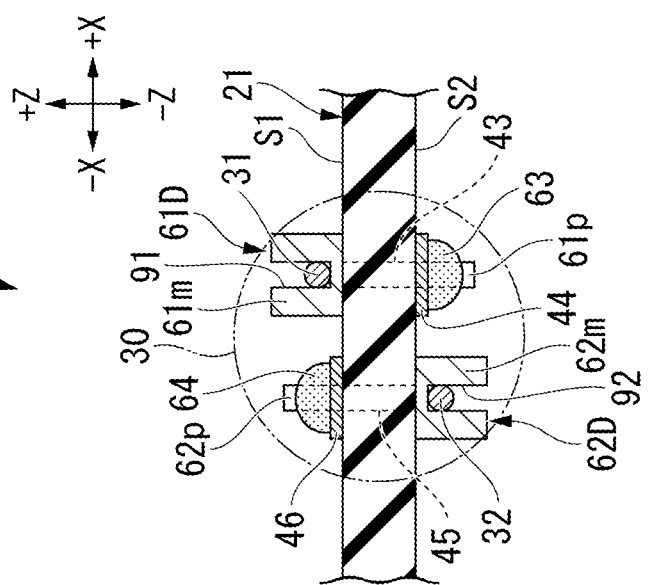
FIG. 9B is an explanatory cross-sectional view of the mounting structure of the fourth modified example according to the first embodiment.
Figure 9A:
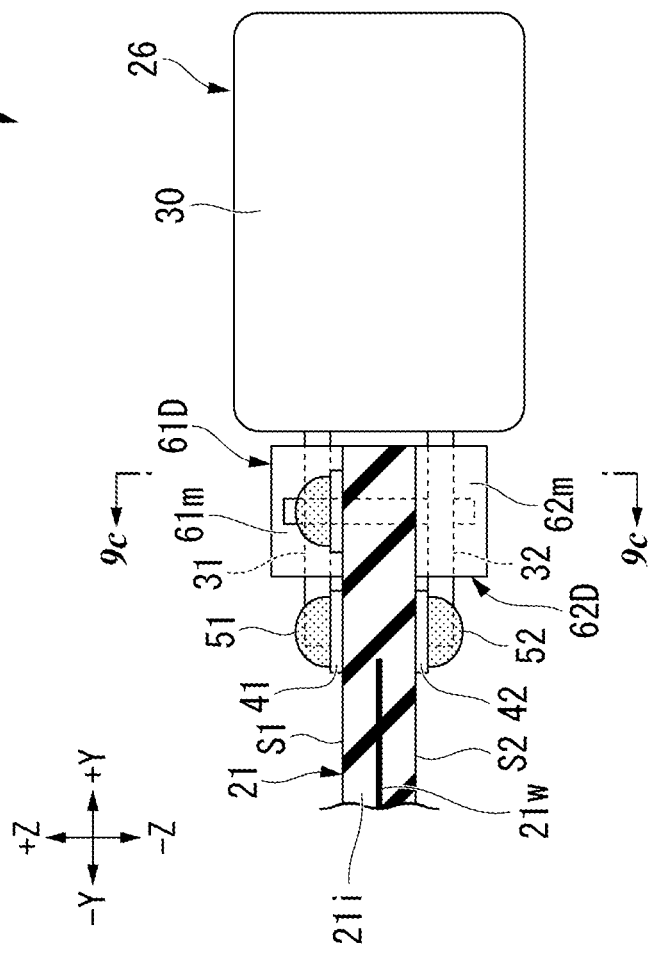
FIG. 9A is an explanatory cross-sectional view of a mounting structure of a fourth modified example according to the first embodiment.

FIGS. 9A and 9B are explanatory views of a mounting structure of the capacitor 26 of a fourth modified example. FIG. 9A is a cross-sectional view showing the mounting structure of the capacitor 26. FIG. 9B is a cross-sectional view taken along line 9c-9c shown in FIG. 9A. A semiconductor storage device 1D of the fourth modified example includes a first holder 61D instead of the first holder 61 and includes a second holder 62D instead of the second holder 62.

The holder main body 61m of the first holder 61D has a groove 91 instead of the through-hole 61h. The groove 91 penetrates through the holder main body 61m in the Y direction. The groove 91 is opened in the +Z direction. The first lead 31 is inserted into the groove 91 in the Y direction. A width of the groove 91 in the X direction is substantially the same as a diameter of the first lead 31. When the first lead 31 is inserted into the groove 91, the first lead 31 is sandwiched by the holder main body 61m such that both sides of the first lead 31 are in contact with inside faces of the groove 91.

Similarly, the holder main body 62m of the second holder 62D has a groove 92 instead of the through-hole 62h. The groove 92 penetrates through the holder main body 62m in the Y direction. The groove 92 is opened in the −Z direction. The second lead 32 is inserted into the groove 92 in the Y direction. A width of the groove 92 in the X direction is substantially the same as a diameter of the second lead 32. When the second lead 32 is inserted into the groove 92, the second lead 32 is sandwiched by the holder main body 62m such that both sides of the second lead 32 are in contact with inside faces of the groove 92.

Fifth Modified Example

Figure 10B:
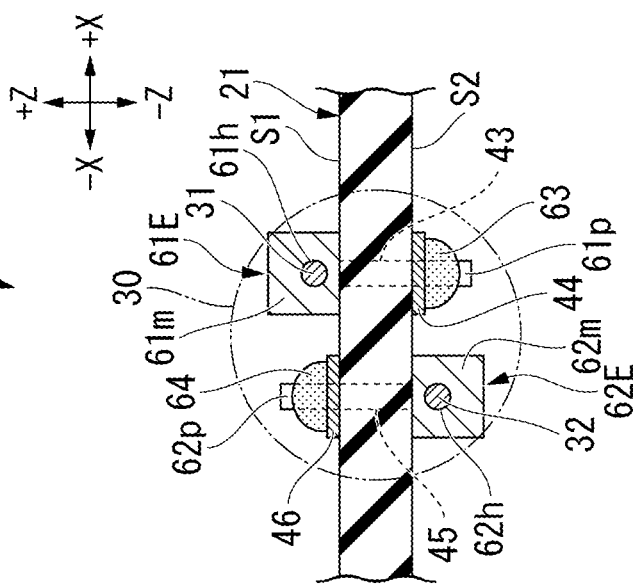
FIG. 10B is an explanatory cross-sectional view of the mounting structure of the fifth modified example according to the first embodiment.
Figure 10A:
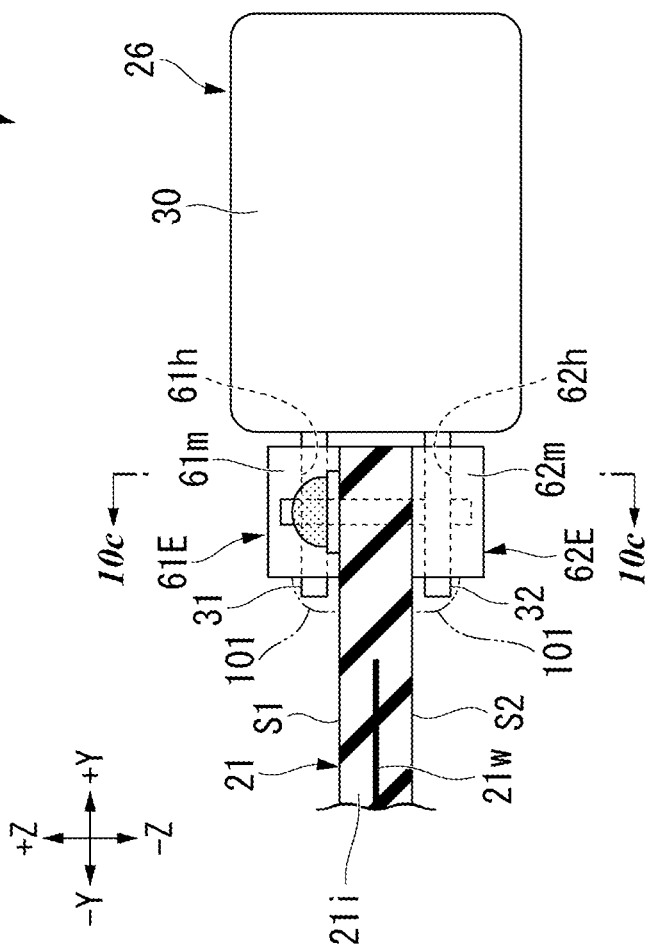
FIG. 10A is an explanatory cross-sectional view of a mounting structure of a fifth modified example according to the first embodiment.

FIGS. 10A and 10B are explanatory views of a mounting structure of the capacitor 26 of a fifth modified example. FIG. 10A is a cross-sectional view showing the mounting structure of the capacitor 26. FIG. 10B is a cross-sectional view taken along line 10c-10c shown in FIG. 10A. A semiconductor storage device 1E of the fifth modified example includes a first holder 61E instead of the first holder 61 and includes a second holder 62E instead of the second holder 62.

The board 21 does not include the first pad 41 and the second pad 42. The first land 44 of the board 21 to which the first holder 61E is connected is connected to the wiring pattern 21w of the board 21. The first holder 61E is formed of, for example, metal having electroconductivity. The first holder 61E is connected to the first land 44. The first holder 61E is connected to the wiring pattern 21w of the board 21 via the first land 44. That is, the first lead 31 is connected to the wiring pattern 21w of the board 21 via the first holder 61E and the first land 44. Note that, a connection portion 101 that improves an electrical connection between the first holder 61E and the first lead 31 may be provided on the board 21. The connection portion 101 is formed of, for example, a conductive bonding material (for example, solder or electroconductive paste). The connection portion 101 is provided on, for example, an end face of the first holder 61E in the Y direction.

The explanation of the aforementioned first holder 61E may be applicable to the explanation of the second holder 62E by replacing "first holder 61E" with "second holder 62E", replacing "first land 44" with "second land 46", and replacing "first lead 31" with "second lead 32".

Note that, instead of the first land 44 and the second land 46, the first holder 61E and the second holder 62E may be connected to the wiring pattern 21w of the board 21 via the pads 71 and 72 for surface mounting described in the second modified example.

Figure 11B:
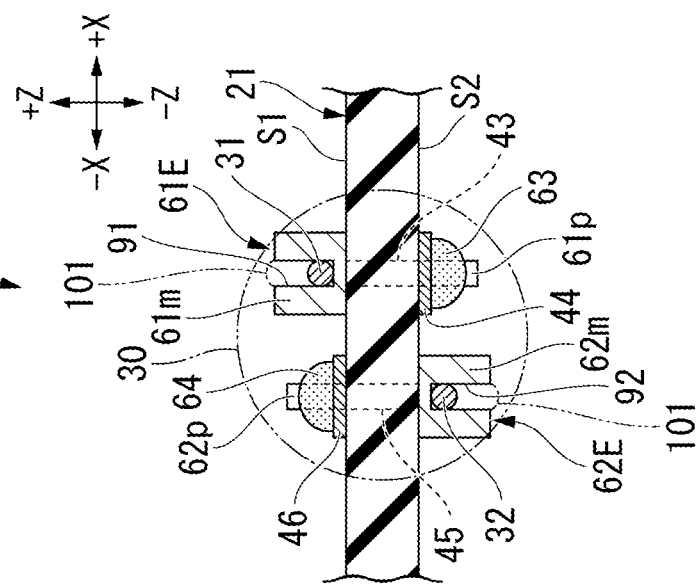
FIG. 11B is an explanatory cross-sectional view of another mounting structure of the fifth modified example according to the first embodiment.
Figure 11A:
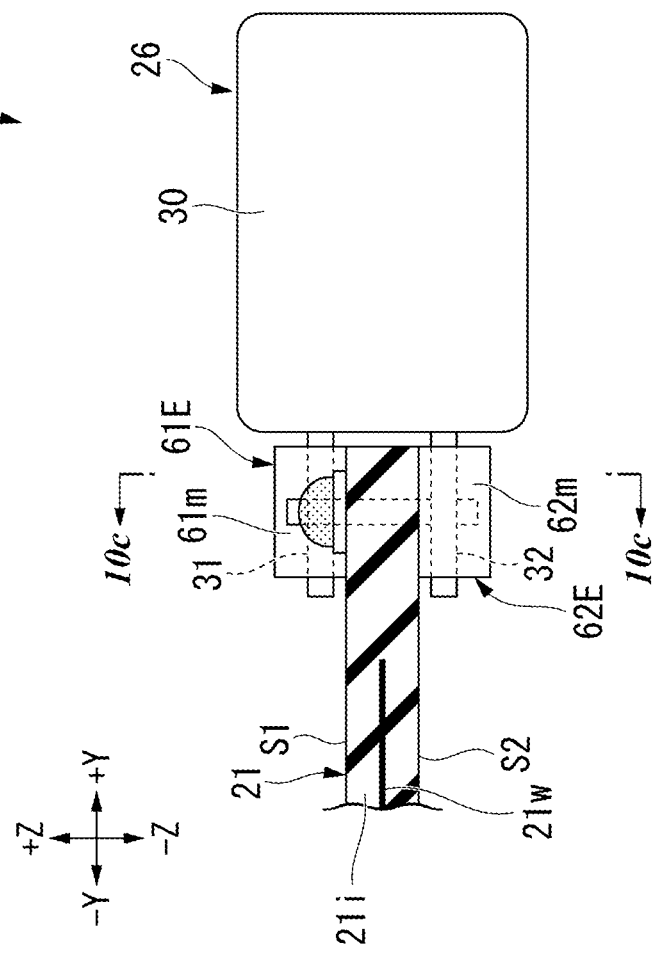
FIG. 11A is an explanatory cross-sectional view of another mounting structure of the fifth modified example according to the first embodiment.

FIGS. 11A and 11B are explanatory views of another mounting structure of the fifth modified example. FIG. 11A is a cross-sectional view showing the mounting structure of the capacitor 26. FIG. 11B is a cross-sectional view taken along line 10c-10c showing FIG. 11A. The first holder 61E and the second holder 62E may have the grooves 91 and 92 described in the fourth modified example instead of the through-holes 61h and 62h. In this case, the connection portion 101 can be provided with respect to the groove 91 of the first holder 61E and the first lead 31 from, for example, the side in the +Z direction. Similarly, the connection portion 101 can be provided with respect to the groove 92 of the second holder 62E and the second lead 32 from, for example, the side in the −Z direction.

Sixth Modified Example

Figure 12A:
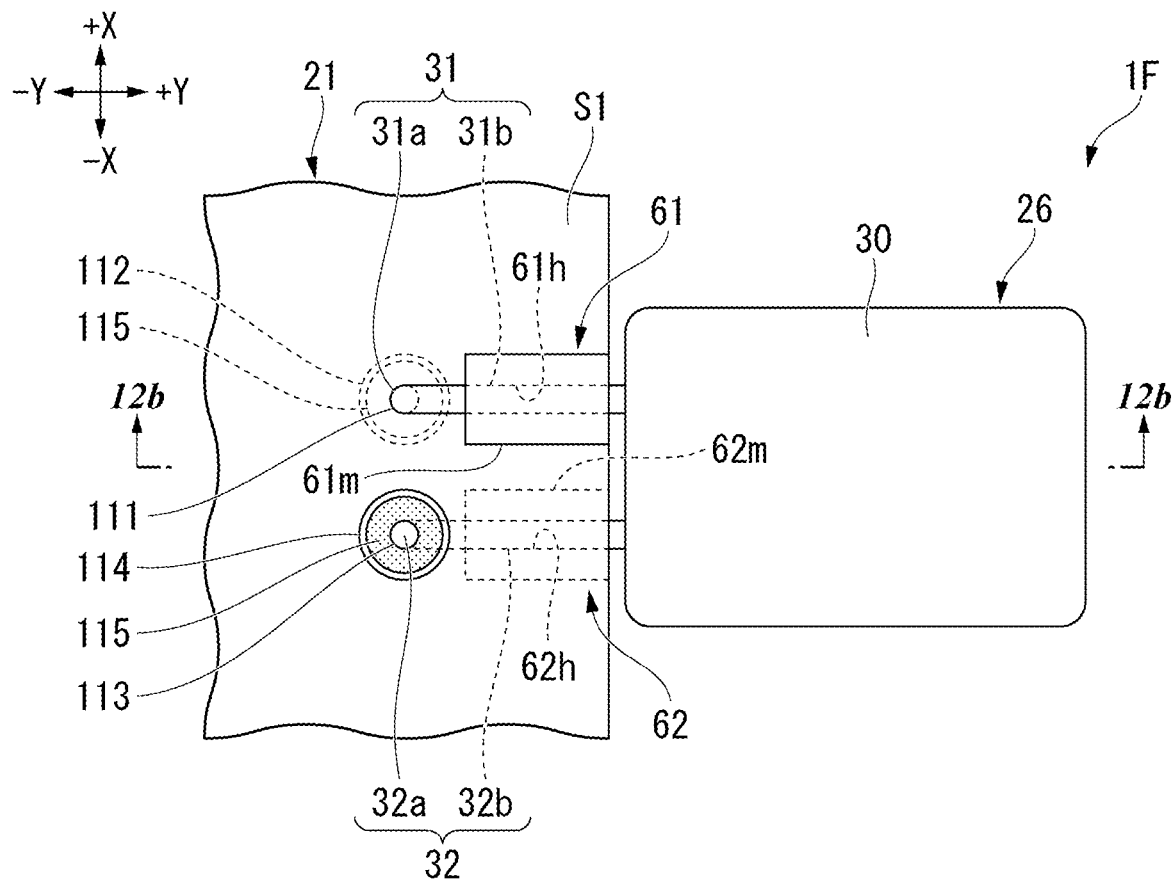
FIG. 12A is an explanatory plan view of a mounting structure of a sixth modified example according to the first embodiment.
Figure 12B:
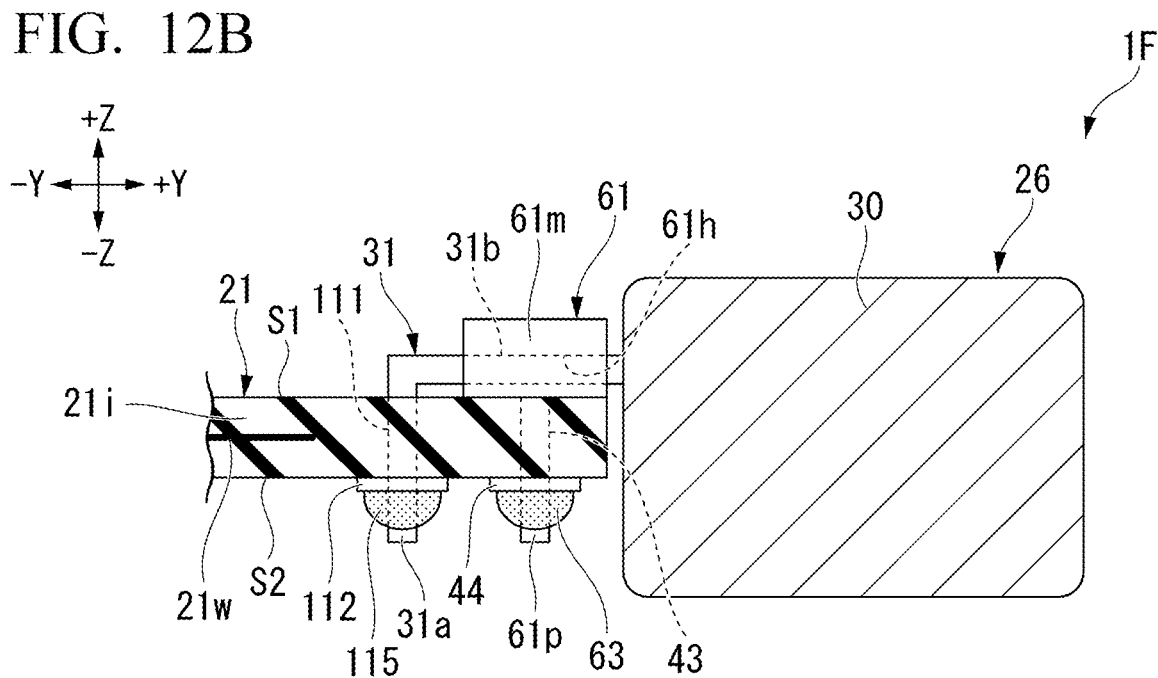
FIG. 12B is an explanatory cross-sectional view of the mounting structure of the sixth modified example according to the first embodiment.

FIGS. 12A and 12B are explanatory views of a mounting structure of the capacitor 26 of a sixth modified example. FIG. 12A is a plan view showing the mounting structure of the capacitor 26. FIG. 12B is a cross-sectional view taken along line 12b-12b shown in FIG. 12A.

In a semiconductor storage device 1F of the modified example, the board 21 includes a third through-hole 111 and a third land 112 instead of the first pad 41. The third through-hole 111 penetrates through the board 21 in the Z direction. For example, a metal plating layer is provided on an inner surface of the third through-hole 111. The third land 112 is provided around the third through-hole 111 on the second surface S2 of the board 21. The third land 112 is connected to the wiring pattern 21w of the board 21. Furthermore, the board 21 includes a fourth through-hole 113 and a fourth land 114 instead of the second pad 42. The fourth through-hole 113 penetrates through the board 21 in the Z direction. For example, a metal plating layer is provided on an inner surface of the fourth through-hole 113. The fourth land 114 is provided around the fourth through-hole 113 on the first surface S1 of the board 21. The fourth land 114 is connected to the wiring pattern 21w of the board 21.

In the modified example, the first lead portion 31a of the first lead 31 of the capacitor 26 includes a portion bent with respect to the second lead portion 31b toward the −Z direction. The first lead portion 31a is inserted into the third through-hole 111. A connection portion 115 is provided on the third land 112. The connection portion 115 electrically connects the first lead portion 31a of the first lead 31 and the third land 112. Similarly, the first lead portion 32a of the second lead 32 of the capacitor 26 includes a portion bent with respect to the second lead portion 32b toward the +Z direction. The first lead portion 32a is inserted into the fourth through-hole 113. A connection portion 116 is provided on the fourth land 114. The connection portion 116 electrically connects the first lead portion 32a of the second lead 32 and the fourth land 114. Each of the connection portions 115 and 116 is formed of, for example, a conductive bonding material (for example, solder or electroconductive paste).

Seventh Modified Example

FIGS. 13A to 13C are explanatory views of a mounting structure of the capacitor 26 of a seventh modified example. FIG. 13A is a plan view showing the mounting structure of the capacitor 26. FIG. 13B is a cross-sectional view taken along line 13b-13b shown in FIG. 13A. FIG. 13C is a cross-sectional view taken along line 13c-13c shown in FIG. 13B. A semiconductor storage device 1G of the seventh modified example includes a second holder 62G instead of the second holder 62.

Similarly to the first holder 61, the second holder 62G is mounted on the first surface S1 of the board 21. Similarly to the first pad 41, the second pad 42 is provided on the first surface S1 of the board 21. Similarly to the first land 44, the second land 46 is provided on the second surface S2 of the board 21.

The center C of the component main body 30 of the capacitor 26 in the Z direction is arranged next to, for example, the board 21 in the Y direction. The component main body 30 has a region 30a facing the board 21 in the Y direction. The first lead 31 and the second lead 32 protrude from the region 30a of the component main body 30.

Each of the first lead 31 and the second lead 32 includes a two-step curved portion. For example, the first lead 31 includes a third lead portion 31c and a fourth lead portion 31d in addition to the first lead portion 31a and the second lead portion 31b mentioned above. The third lead portion 31c protrudes from the region 30a of the component main body 30 in the −Y direction. The fourth lead portion 31d includes a portion bent at the end portion of the third lead portion 31c on the side in the −Y direction toward the +Z direction. The fourth lead portion 31d extends in the Z direction. The end portion of the fourth lead portion 31d on the side in the +Z direction is connected to the second lead portion 31b. Similarly, the second lead 32 includes a third lead portion 32c and a fourth lead portion 32d in addition to the first lead portion 32a and the second lead portion 32b mentioned above. The third lead portion 32c protrudes from the region 30a of the component main body 30 in the −Y direction. The fourth lead portion 32d includes a portion bent at the end portion of the third lead portion 32c on the side in the −Y direction toward the +Z direction. The fourth lead portion 32d extends in the Z direction. The end portion of the fourth lead portion 32d on the side in the +Z direction is connected to the second lead portion 32b.

Note that, the first holder 61 may be surface-mounted on the first pad 41 provided on the first surface S1 of the board 21 without including the protruding portion 61p. Similarly, the second holder 62G may be surface-mounted on the second pad 42 provided on the first surface S1 of the board 21 without including the protruding portion 62p.

Moreover, each of the first holder 61 and the second holder 62G may have a sandwiching portion 190 and the protruding portion 61p. Here, the sandwiching portion 190 is disposed so as to overlap the first surface S1 of the board 21 in a similar manner to a sixth embodiment (FIGS. 30A and 30B) described below. The protruding portion 61p is inserted into the first through-hole 43 of the board 21 and is fixed on the board 21 via the third connection portion 63 in a similar manner to the first embodiment. Additionally, each of the first holder 61 and the second holder 62G may be surface-mounted on the first pad 41 provided on the first surface S1 of the board 21 without including the protruding portion 61p.

Second Embodiment

Next, a second embodiment will be described. The second embodiment is different from the first embodiment in that a lock mechanism that fixes a lead is provided. Configurations other than those described below are the same as those of the aforementioned first embodiment.

Figure 14:
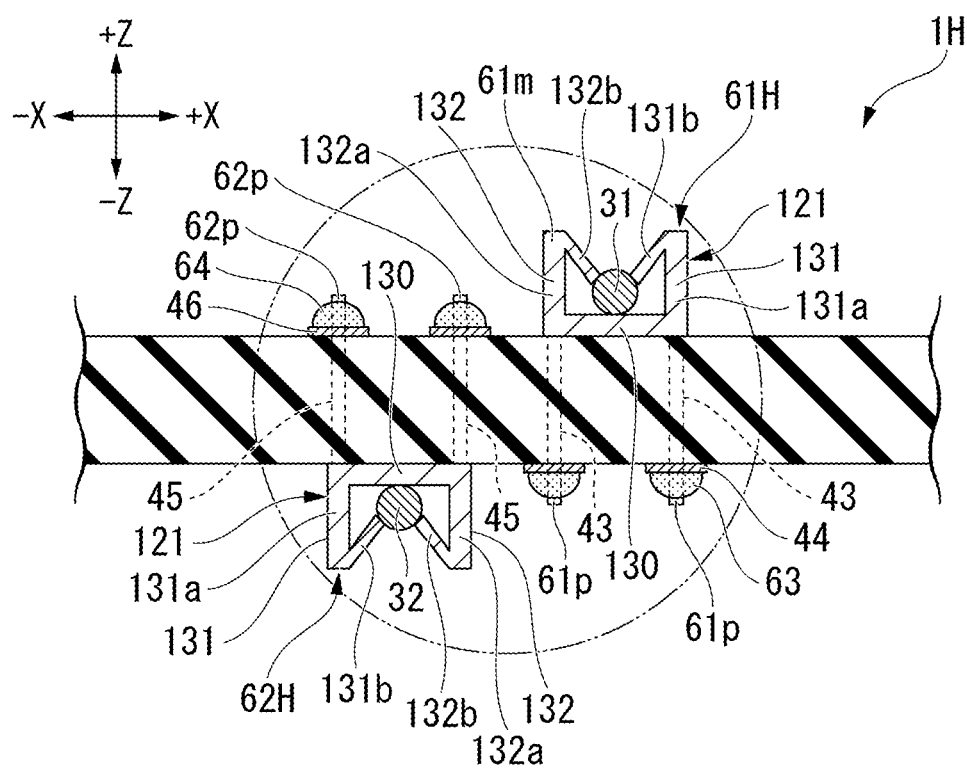
FIG. 14 is an explanatory view of a capacitor-mounting structure according to a second embodiment.

FIG. 14 is an explanatory view of a mounting structure of the capacitor 26 according to the second embodiment. A semiconductor storage device 1H according to the second embodiment includes a first holder 61H instead of the first holder 61 and includes the second holder 62H instead of the second holder 62.

The first holder 61H includes a lock mechanism 121 that fixes the first lead 31 without including a connection portion such as solder. For example, the lock mechanism 121 removably fixes the first lead 31. The lock mechanism 121 includes, for example, a base 130, a first pressing portion 131, and a second pressing portion 132. The base 130 is a plate along the first surface S1 of the board 21. The base 130 is mounted on the first surface S1 of the board 21. The base 130 includes one or more protruding portions 61p. The base 130 is fixed on the board 21.

The first pressing portion 131 has a first portion 131a and a second portion 131b. The first portion 131a is upright in the +Z direction from the end portion of the base 130 on the side in the +X direction. The first portion 131a extends in a direction of separation from the board 21. The second portion 131b is bent toward the inside of the first holder 61 from the end portion of the first portion 131a on the side in the +Z direction. The first pressing portion 131 is, for example, formed of metal and has elasticity. When the first pressing portion 131 is elastically deformed, the second portion 131b is movable in a direction of approaching the first portion 131a and in a direction of separation from the first portion 131a from a starting point of the end portion of the first portion 131a on the side in the +Z direction.

Similarly, the second pressing portion 132 has a first portion 132a and a second portion 132b. The first portion 132a is upright in the +Z direction from the end portion of the base 130 on the side in the −X direction. The first portion 131a extends in a direction of separation from the board 21. The second portion 132b is bent toward the inside of the first holder 61 from the end portion of the first portion 132a on the side in the +Z direction. The second pressing portion 132 is, for example, formed of metal and has elasticity. When the second pressing portion 132 is elastically deformed, the second portion 132b is movable in a direction of approaching the first portion 132a and in a direction of separation from the first portion 132a from a starting point of the end portion of the first portion 132a on the side in the +Z direction.

In the embodiment, in a case in which the first lead 31 is attached to the first holder 61H, the first lead 31 is sandwiched between the second portion 131b of the first pressing portion 131 and the second portion 132b of the second pressing portion 132. For example, as the first lead 31 comes into contact with the first pressing portion 131 and the second pressing portion 132, the first lead 31 elastically deforms the first pressing portion 131 and the second pressing portion 132 such that a distance between the second portion 131b of the first pressing portion 131 and the second portion 132b of the second pressing portion 132 is spread. Therefore, the first lead 31 is attached to the inside of the first holder 61.

When the center of the first lead 31 (maximum-diameter portion) in the Z direction moves to the side in the −Z direction further than the leading end of the second portion 131b of the first pressing portion 131 and the leading end of the second portion 132b of the second pressing portion 132, the postures of the first pressing portion 131 and the second pressing portion 132 restore to their original state by elastic forces thereof. That is, the distance between the second portion 131b of the first pressing portion 131 and the second portion 132b of the second pressing portion 132 decreases, and therefore the second portion 131b and the second portion 132b approach each other. Consequently, a part of the first pressing portion 131 which is opposed to the board 21 comes into contact with the first lead 31, and therefore the first lead 31 is prevented from being separated from the board 21. Similarly, a part of the second pressing portion 132 which is opposed to the board 21 comes into contact with the first lead 31, and therefore the first lead 31 is prevented from being separated from the board 21. Accordingly, the first lead 31 is fixed by the lock mechanism 121.

The explanation of the second holder 62H is the same as that of the first holder 61H. That is, the explanation of the aforementioned first holder 61H may be applicable to the explanation of the second holder 62H by replacing "first holder 61H" with "second holder 62H", replacing "protruding portion 61p" with "protruding portion 62p", replacing "first lead 31" with "second lead 32", replacing "the +Z direction" with "the −Z direction", and replacing "the +X direction" with "the −X direction".

With this configuration, it is possible to reduce the thickness of the semiconductor storage device 1H in a similar manner to the first embodiment. Furthermore, in the configuration according to the embodiment, it is not necessary to provide a connection portion such as solder with respect to the first lead 31 and the second lead 32.

Third Embodiment

Next, a third embodiment will be described. The third embodiment is different from the first embodiment in that a holder is fixed to a cutout of a board. Configurations other than those described below are the same as those of the aforementioned first embodiment.

FIGS. 15A to 15C are explanatory views of a mounting structure of the capacitor 26 according to the third embodiment. FIG. 15A is a plan view showing the mounting structure of the capacitor 26. FIG. 15B is a cross-sectional view taken along line 15b-15b shown in FIG. 15A. FIG. 15C is a cross-sectional view taken along line 15c-15c shown in FIG. 15B. A semiconductor storage device 1J according to the third embodiment includes a first holder 61J instead of the first holder 61 and includes a second holder 62J instead of the second holder 62.

Figure 16:
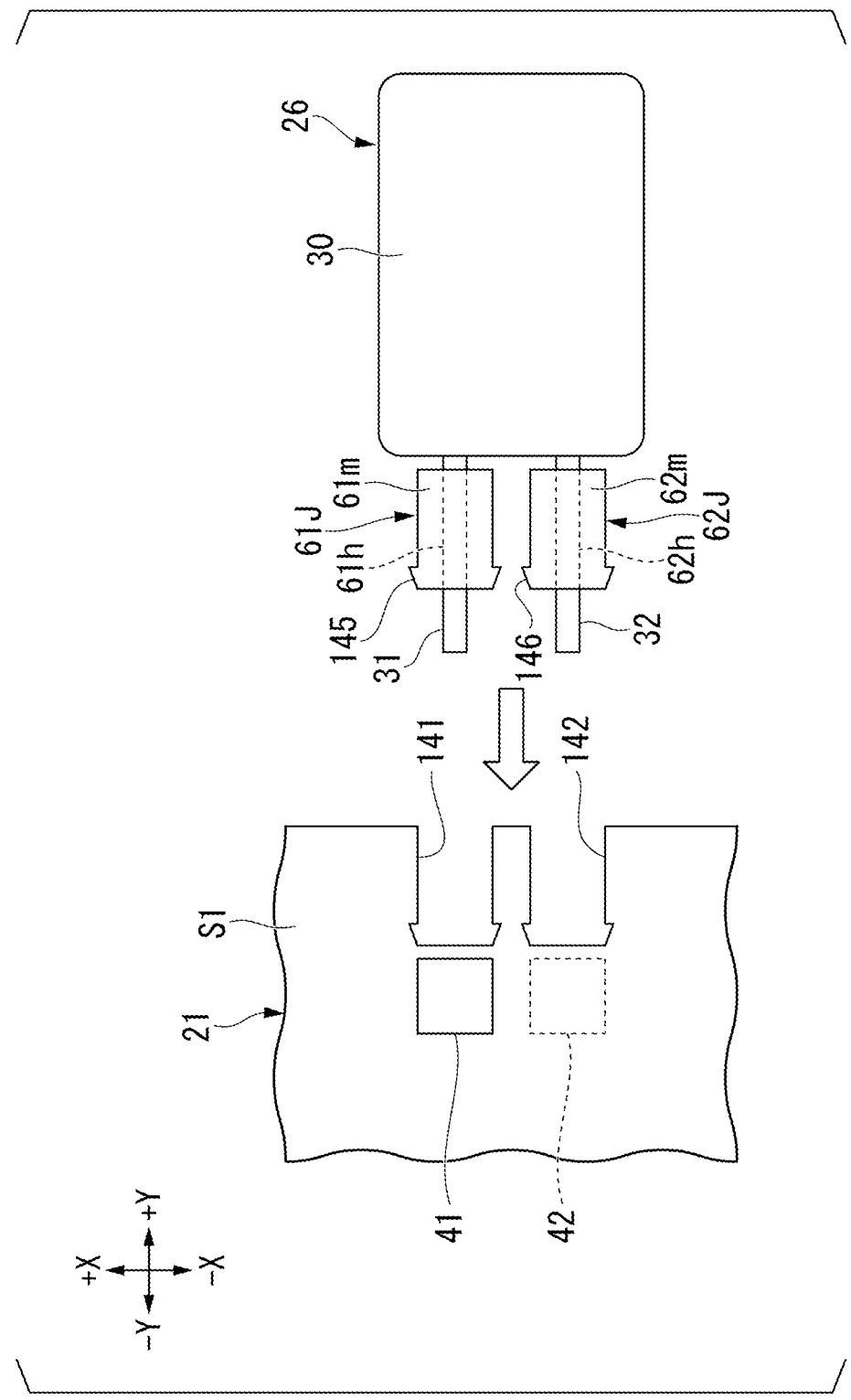
FIG. 16 is a plan view showing an example of a method of assembling the mounting structure according to the third embodiment.

The end portion of the board 21 on the side in the +Y direction has a first cutout 141 and a second cutout 142 (refer to FIG. 16). The first cutout 141 and the second cutout 142 are formed so as to be depressed from the end portion of the board 21 on the side in the +Y direction in the −Y direction. The first cutout 141 and the second cutout 142 are spaced apart at a distance in the X direction.

A width of the first cutout 141 in the X direction is substantially the same as a width of the first holder 61J in the X direction. For example, the first holder 61J is inserted into the first cutout 141 in the Y direction. Both sides of the first holder 61J in the X direction are sandwiched by the first cutout 141, and therefore the first holder 61J is fixed on the board 21. Similarly, a width of the second cutout 142 in the X direction is substantially the same as a width of the second holder 62J in the X direction. For example, the second holder 62J is inserted into the second cutout 142 in the Y direction. Both sides of the second holder 62J in the X direction are sandwiched by the second cutout 142, and therefore the second holder 62J is fixed on the board 21.

FIG. 16 is a plan view showing an example of a method of assembling a mounting structure according to the embodiment. In the embodiment, firstly, the first holder 61J is attached to the first lead 31, and the second holder 62J is attached to the second lead 32. Next, the first holder 61J holding the first lead 31 is fixed on the board 21 by being inserted into the first cutout 141. Furthermore, the second holder 62J holding the second lead 32 is fixed on the board 21 by being inserted into the second cutout 142. Thereafter, as shown in FIGS. 15A to 15C, the first lead 31 is connected to the first pad 41 by the first connection portion 51, and the second lead 32 is connected to the second pad 42 by the second connection portion 52.

With this configuration, it is possible to reduce the thickness of the semiconductor storage device 1J in a similar manner to the first embodiment. Note that, the first holder 61J may include an engagement portion 145. The engagement portion 145 is engaged with the board 21 or a member attached to the board 21 in a case in which the first holder 61J is inserted into a back portion of the first cutout 141. The engagement portion 145 restricts movement of the first holder 61J in the +Y direction. Similarly, the second holder 62J may include an engagement portion 146. The engagement portion 146 is engaged with the board 21 or a member attached to the board 21 in a case in which the second holder 62J is inserted into a back portion of the second cutout 142. The engagement portion 146 restricts movement of the second holder 62J in the +Y direction. Each of the engagement portions 145 and 146 is, for example, a claw portion that engages with a recessed portion of the board 21 or a recessed portion of a member attached to the board 21.

Fourth Embodiment

Next, a fourth embodiment will be described. The fourth embodiment is different from the first embodiment in that a socket-shaped holder is used. Configurations other than those described below are the same as those of the aforementioned first embodiment.

FIG. 17A to 17C are explanatory views of a mounting structure of the capacitor 26 according to the fourth embodiment. FIG. 17A is a plan view showing the mounting structure of the capacitor 26. FIG. 17B is a cross-sectional view taken along line 17b-17b shown in FIG. 17A. FIG. 17C is a cross-sectional view taken along line 17c-17c shown in FIG. 17B. A semiconductor storage device 1K according to the fourth embodiment includes a holder 150 instead of the first holder 61 and the second holder 62. The holder 150 includes, for example, a body part 151, a first conductive portion 152, a second conductive portion 153, a first protruding portion 154, and a second protruding portion 155.

The body part 151 forms a main part of the holder 150. The body part 151 is formed of, for example, a synthetic resin material and has insulation. The body part 151 includes a body-receiving portion 160 that holds, for example, the component main body 30. The body-receiving portion 160 includes a first support portion 161 and a second support portion 162. The first support portion 161 has a shape along a part of an outer shape of the component main body 30. The first support portion 161 holds the component main body 30 by being in contact with the component main body 30. For example, the first support portion 161 is formed in a circular-arc shape along the outer shape of the component main body 30. The first support portion 161 supports an end portion of the component main body 30 in the +X direction. The second support portion 162 is disposed at the opposite side of the first support portion 161 with respect to the component main body 30. The second support portion 162 has a shape along the outer shape of the component main body 30. The second support portion 162 supports the component main body 30 by being in contact with the component main body 30. For example, the second support portion 162 is formed in a circular-arc shape along the outer shape of the component main body 30. The second support portion 162 supports an end portion of the component main body 30 in the −X direction.

In the embodiment, the body part 151 has a first through-hole 61$h$, a second through-hole 62$h$, a first groove 61$g$, and a second groove 62$g$. Each of the first through-hole 61$h$ and the second through-hole 62$h$ is opened in the Y direction. As the second lead portion 31$b$ of the first lead 31 is inserted into the first through-hole 61$h$, the body part 151 holds the second lead portion 31$b$ of the first lead 31. As the second lead portion 32$b$ of the second lead 32 is inserted into the second through-hole 62$h$, the body part 151 holds the second lead portion 32$b$ of the second lead 32.

Each of the first groove 61$g$ and the second groove 62$g$ extends in the Y direction. For example, each of the first groove 61$g$ and the second groove 62$g$ is opened in the +Z direction. The first groove 61$g$ is located on the opposite side of the body-receiving portion 160 with respect to the first through-hole 61$h$. The first lead portion 31$a$ of the first lead 31 passing through the first through-hole 61$h$ is located in the first groove 61$g$. The first groove 61$g$ prevents displacement of the first lead portion 31$a$ of the first lead 31 in the X direction. The second groove 62$g$ is located on the opposite side of the body-receiving portion 160 with respect to the second through-hole 62$h$. The first lead portion 32$a$ of the second lead 32 passing through the second through-hole 62$h$ is located in the second groove 62$g$. The second groove 62$g$ prevents displacement of the first lead portion 32$a$ of the second lead 32 in the X direction.

The first conductive portion 152 is provided on an inner surface of the first groove 61$g$. A connection portion 156 is provided in the first groove 61$g$. The connection portion 156 electrically connects the first lead portion 31$a$ of the first lead 31 and the first conductive portion 152. The first lead portion 31$a$ of the first lead 31 and the first conductive portion 152 are covered with the connection portion 156 from the side in the +Z direction. The second conductive portion 153 is provided on an inner surface of the second groove 62$g$. A connection portion 157 is provided in the second groove 62$g$. The connection portion 157 electrically connects the first lead portion 32$a$ of the second lead 32 and the second conductive portion 153. The first lead portion 32$a$ of the second lead 32 and the second conductive portion 153 are covered with the connection portion 157 from the side in the +Z direction. Each of the connection portions 156 and 157 is formed of, for example, a conductive bonding material (for example, solder or electroconductive paste). Note that, the first lead 31 and the second lead 32 may be attached to the holder 150 by not only using the connection portions 156 and 157 but also using spot welding or the like.

The first protruding portion 154 is a protruding portion protruding from the body part 151 in the −Z direction. The first protruding portion 154 is formed of, for example, metal having electroconductivity. The first protruding portion 154 is electrically connected to the first conductive portion 152 inside the body part 151. The first protruding portion 154 is inserted into the first through-hole 43 of the board 21 and is connected to the first land 44 by the third connection portion 63. The first land 44 is connected to the wiring pattern 21$w$ of the board 21. Consequently, the first lead 31 is connected to the wiring pattern 21$w$ of the board 21 via the first conductive portion 152, the first protruding portion 154, and the first land 44.

Similarly, the second protruding portion 155 is a protruding portion protruding from the body part 151 in the −Z direction. The second protruding portion 155 is formed of, for example, metal having electroconductivity. The second protruding portion 155 is electrically connected to the second conductive portion 153 inside the body part 151. The second protruding portion 155 is inserted into the second through-hole 45 of the board 21 and is connected to the second land 46 by the fourth connection portion 64. The second land 46 is connected to the wiring pattern 21$w$ of the board 21. Therefore, the second lead 32 is connected to the wiring pattern 21$w$ of the board 21 via the second conductive portion 153, the second protruding portion 155, and the second land 46.

Figure 18A:
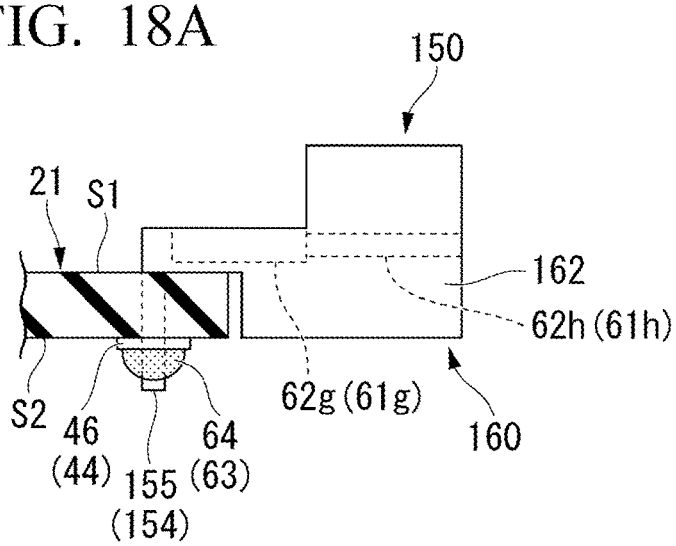
FIG. 18A is a cross-sectional view showing an example of a method of assembling the mounting structure according to the fourth embodiment.
Figure 18B:
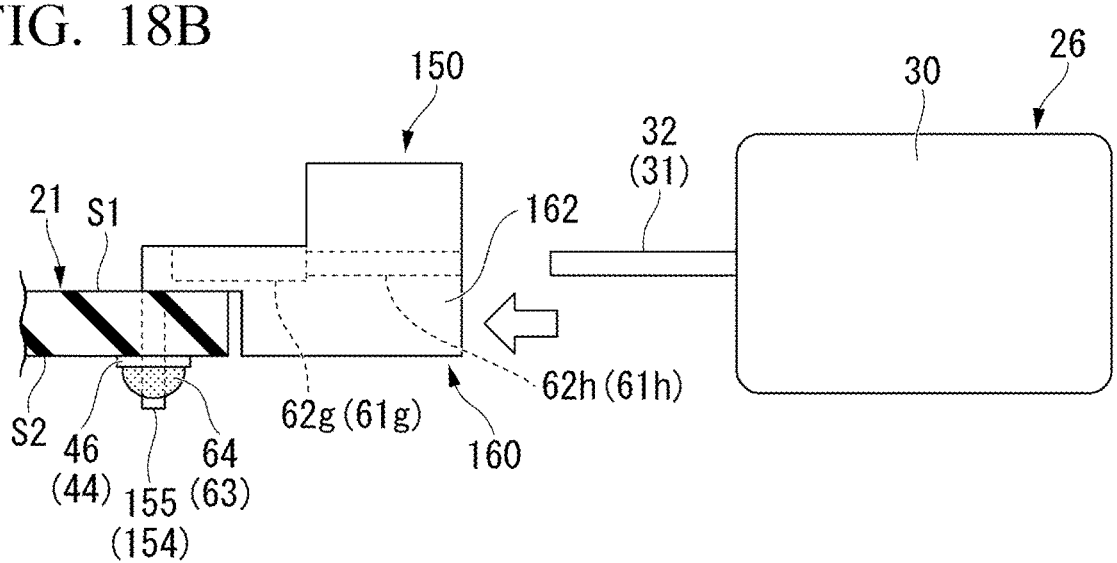
FIG. 18B is a cross-sectional view showing an example of a method of assembling the mounting structure according to the fourth embodiment.
Figure 18C:
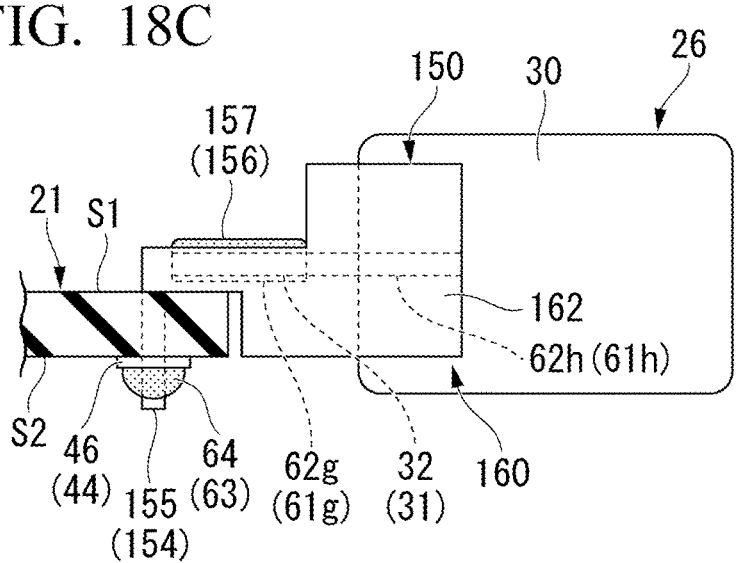
FIG. 18C is a cross-sectional view showing an example of a method of assembling the mounting structure according to the fourth embodiment.

FIG. 18A to FIG. 18C are cross-sectional views each showing an example of a method of assembling a mounting structure according to the embodiment. In the embodiment, firstly, the holder 150 is attached to the board 21 via the third connection portion 63 and the fourth connection portion 64 (refer to FIG. 18A). Thereafter, the first lead 31 and the second lead 32 are inserted into the first through-hole 61$h$ and the second through-hole 62$h$ of the holder 150, respectively. Furthermore, a part of the component main body 30 is inserted into the inside of the body-receiving portion 160 (refer to FIG. 18B). Consequently, the capacitor 26 is held by the holder 150. Next, the connection portion 156 is provided on the first lead portion 31$a$ of the first lead 31, and therefore the first lead portion 31$a$ of the first lead 31 is connected to the first conductive portion 152. Similarly, the connection portion 157 is provided on the first lead portion 32$a$ of the second lead 32, and therefore the first lead portion 32$a$ of the second lead 32 is connected to the second conductive portion 153 (refer to FIG. 18C).

In other cases, instead of the above-mentioned example, the capacitor 26 is firstly attached to the holder 150, and thereafter the holder 150 holding the capacitor 26 may be attached to the board 21.

With this configuration, it is possible to reduce the thickness of the semiconductor storage device 1K in a similar manner to the first embodiment. Furthermore, with this configuration, the capacitor 26 does not need to be arranged such that the first lead 31 and the second lead 32 are separately mounted on the respective two sides of the board 21 by rotating the capacitor 26 as shown in FIG. 4. Consequently, it is possible to increase a degree of workability of attaching the capacitor 26 to the board 21.

First Modified Example

Figure 19:
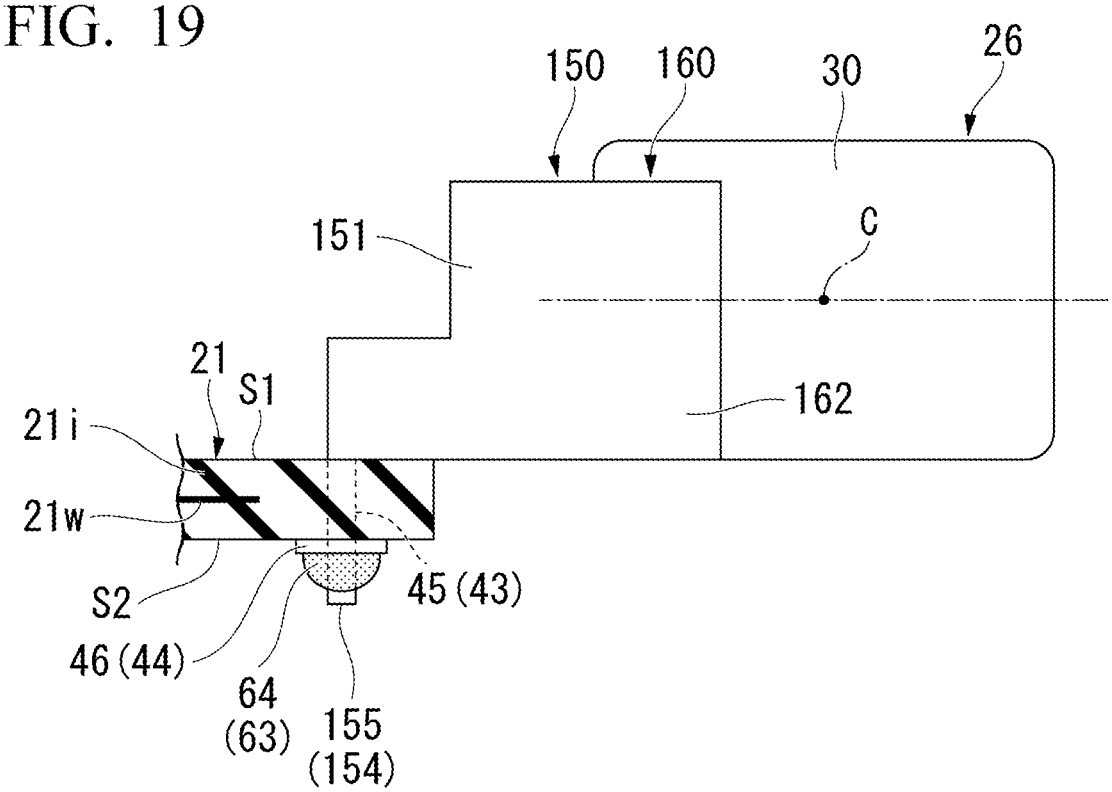
FIG. 19 is an explanatory view of a mounting structure of a first modified example according to the fourth embodiment.

FIG. 19 is an explanatory view of a mounting structure of a first modified example according to the fourth embodiment. In the first modified example, the body part 151 of the holder 150 is provided so as to be displaced from the side in the +Z direction with respect to the board 21 further than that of the fourth embodiment. For example, the entirety of the body-receiving portion 160 of the holder 150 is located closer to the side in the +Z direction than the first surface S1 of the board 21. Consequently, the center C of the component main body 30 of the capacitor 26 in the Z direction is positioned closer to the side in the +Z direction than the board 21. For example, the entirety of the component main body 30 of the capacitor 26 is located closer to the side in the +Z direction than the first surface S1 of the board 21.

Second Modified Example

Figure 20:
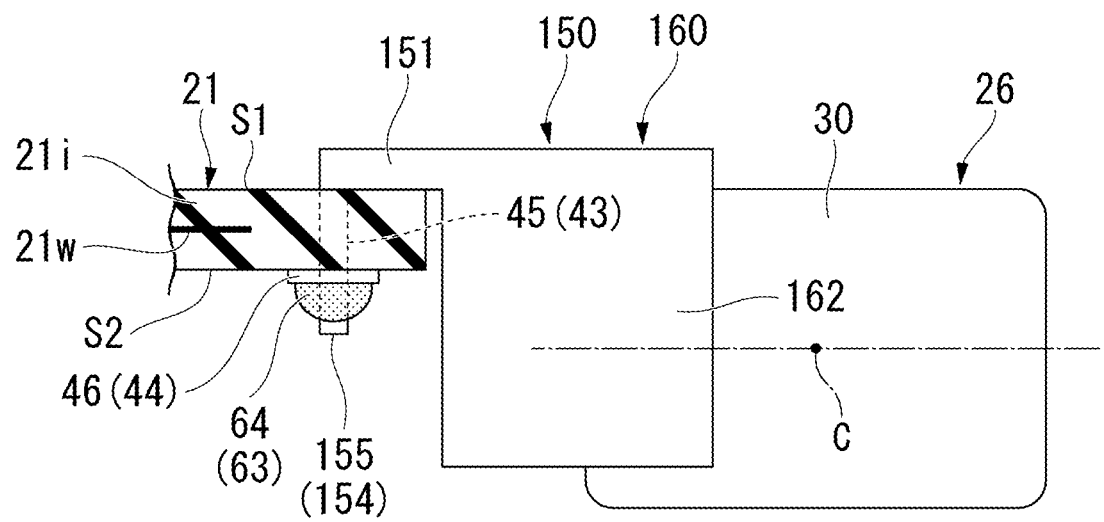
FIG. 20 is an explanatory view of a mounting structure of a second modified example according to the fourth embodiment.

FIG. 20 is an explanatory view of a mounting structure of a second modified example according to the fourth embodiment. In the second modified example, the body part 151 of the holder 150 is provided so as to be displaced from the side in the −Z direction with respect to the board 21 further than that of the fourth embodiment. For example, at least a part of the body-receiving portion 160 of the holder 150 is located closer to the side in the −Z direction than the first surface S1 of the board 21. Consequently, the center C of the component main body 30 of the capacitor 26 in the Z direction is positioned closer to the side in the −Z direction than the board 21. For example, the entirety of the component main body 30 of the capacitor 26 is located closer to the side in the −Z direction than the first surface S1 of the board 21.

Third Modified Example

FIG. 21A to 21C are explanatory views of a mounting structure of a third modified example according to the fourth embodiment. FIG. 21A is a plan view showing the mounting structure. FIG. 21B is a cross-sectional view taken along line 21b-21b shown in FIG. 21A. FIG. 21C is a cross-sectional view taken along line 21c-21c shown in FIG. 21B. A semiconductor storage device 1KA of the third modified example includes a holder 150A. The holder 150A includes the body part 151, the first conductive portion 152, and the second conductive portion 153 in a similar manner to the aforementioned fourth embodiment.

In the modified example, the board 21 has the screw hole 81 instead of the first through-hole 43 and the first land 44. Similarly, the board 21 has the screw hole 82 instead of the second through-hole 45 and the second land 46. The body part 151 has the screw-insertion hole 83 in communication with the screw hole 81 of the board 21 and the screw-insertion hole 85 in communication with the screw hole 82 of the board 21. The body part 151 is fixed on the board 21 via the screw 84 and the screw 86. The screw 84 is inserted into the screw-insertion hole 83 and is engaged with the screw hole 81. The screw 86 is inserted into the screw-insertion hole 85 and is engaged with the screw hole 82.

In the modified example, each of an inner peripheral face of the screw hole 81 and an inner peripheral face of the screw hole 82 is connected to the wiring pattern 21w of the board 21. Consequently, the first lead 31 is connected to the wiring pattern 21w of the board 21 via the first conductive portion 152, the screw 84, and the inner peripheral face of the screw hole 81. Similarly, the second lead 32 is connected to the wiring pattern 21w of the board 21 via the second conductive portion 153, the screw 86, and the inner peripheral face of the screw hole 82.

Fifth Embodiment

Next, a fifth embodiment will be described. The fifth embodiment is different from the first embodiment in that the holder holding the lead is formed in a shape extending to a position out of the board. Configurations other than those described below are the same as those of the aforementioned first embodiment.

FIGS. 22A to 22C are explanatory views of a mounting structure of the capacitor 26 according to the fifth embodiment. FIG. 22A is a plan view showing the mounting structure of the capacitor 26. FIG. 22B is a cross-sectional view taken along line 22b-22b shown in FIG. 22A. FIG. 22C is a cross-sectional view taken along line 22c-22c shown in FIG. 22B. A semiconductor storage device 1L according to the fifth embodiment includes a first holder 61L instead of the first holder 61 and includes a second holder 62L instead of the second holder 62.

The board 21 includes the first through-hole 43, the first land 44, the second through-hole 45, and the second land 46. In the embodiment, the first land 44 and the second land 46 are provided on the second surface S2 of the board 21. The first land 44 and the second land 46 are connected to the wiring pattern 21w of the board 21. The first holder 61L is formed of, for example, metal having electroconductivity. The first holder 61L includes a holder main body 171 and the protruding portion 61p. The holder main body 171 extends in the Y direction. The holder main body 171 has a first portion 171a and a second portion 171b. The first portion 171a overlaps the board 21 in the Z direction. The second portion 171b does not overlap the board 21 in the Z direction.

The second portion 171b includes the first through-hole 61h and the first groove 61g. The first through-hole 61h is opened in the Y direction. The first lead 31 is inserted into the first through-hole 61h. As the second lead portion 31b of the first lead 31 is inserted into the first through-hole 61h, the first holder 61L holds the second lead portion 31b of the first lead 31. In the embodiment, the first through-hole 61h and the first lead 31 are arranged next to the board 21 in the Y direction. The first groove 61g extends in the Y direction. The first groove 61g is opened in the −Z direction. The first groove 61g is located on the opposite side of the component main body 30 with respect to the first through-hole 61h. The first lead portion 31a of the first lead 31 passing through the first through-hole 61h is located at the first groove 61g.

The connection portion 156 is provided on the first groove 61g. The connection portion 156 electrically connects the first lead portion 31a of the first lead 31 and the first holder 61L. The first lead portion 31a of the first lead 31 and the first holder 61L are covered with the connection portion 156 from the side in the −Z direction. The connection portion 156 is formed of, for example, a conductive bonding material (for example, solder or electroconductive paste). Note that, the first holder 61L may be attached to the first lead 31 by not only using the connection portion 156 but also using spot welding or the like.

A first protruding portion 61p is a protruding portion protruding from the first portion 171a of the holder main body 171 in the −Z direction. The first protruding portion

61*p* is inserted into the first through-hole 43 of the board 21 and is connected to the first land 44 via the third connection portion 63. Consequently, the first lead 31 is connected to the wiring pattern 21*w* of the board 21 via the first holder 61L and the first land 44.

Figure 23:
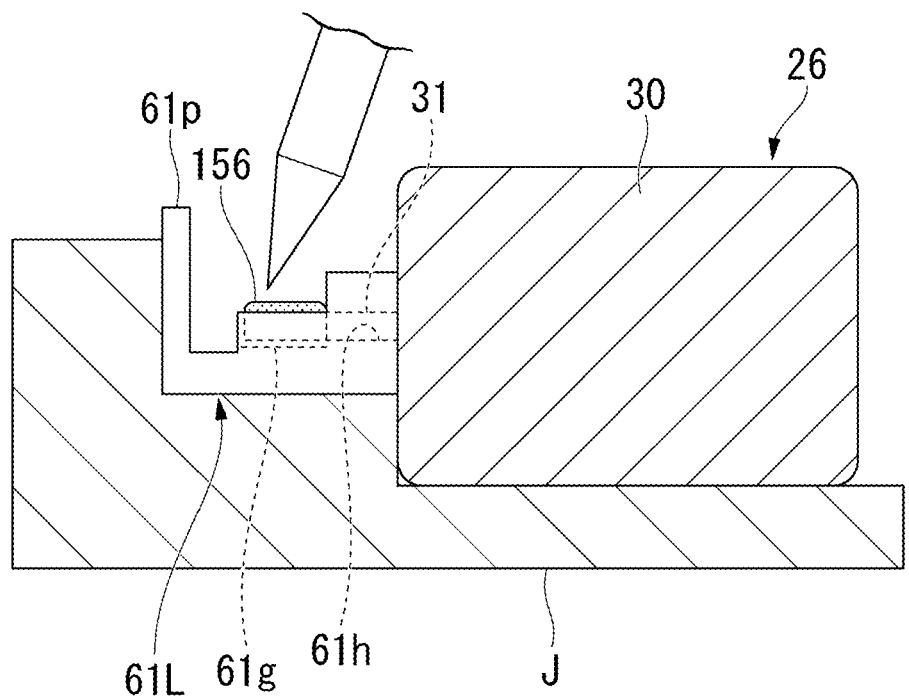
FIG. 23 is a view showing an example of a lead connection method according to the fifth embodiment.

FIG. 23 is a view showing an example of a connection method of the first lead 31 to the first holder 61L. In the embodiment, the first holder 61L is mounted on a jig J in a state of being in a posture inverted in a vertical direction with respect to the posture when the first holder 61L is mounted on the board 21. The first lead 31 is attached to the first holder 61L by the connection portion 156 in a state in which the first holder 61L is mounted on the jig J.

The explanation of the second holder 62L is the same as that of the first holder 61L. The explanation of the aforementioned first holder 61L may be applicable to the explanation of the second holder 62L by replacing "first holder 61L" with "second holder 62L", replacing "protruding portion 61*p*" with "protruding portion 62*p*", replacing "first through-hole 61*h*" with "second through-hole 62*h*", replacing "first groove 61*g*" with "second groove 62*g*", replacing "first lead 31" with "second lead 32", replacing "first through-hole 43" with "second through-hole 45", replacing "first land 44" with "second land 46", and replacing "connection portion 156" with "connection portion 157".

In the embodiment, firstly, the first holder 61L and the second holder 62L are attached to the capacitor 26, and thereafter the first holder 61L and the second holder 62L holding the capacitor 26 are attached to the board 21. Instead of this, firstly, the first holder 61L and the second holder 62L are attached to the board 21, and thereafter the first holder 61L and the second holder 62L which are fixed on the board 21 may be attached to the capacitor 26.

With this configuration, it is possible to reduce the thickness of the semiconductor storage device 1L in a similar manner to the first embodiment. Furthermore, in the configuration according to the embodiment, the first groove 61*g* is provided on the first holder 61L, and the second groove 62*g* is provided on the second holder 62L. Therefore, it is possible to prevent displacements of the first lead 31 and the second lead 32. Note that, similarly to the holder 150A of the third modified example according to the fourth embodiment, the first holder 61L may be fixed on the board 21 via the screw 84 in the embodiment. Similarly to the holder 150A of the third modified example according to the fourth embodiment, the second holder 62L may be fixed on the board 21 via the screw 86.

Modified examples according to the fifth embodiment will be described. Configurations of each of the modified examples other than those described below are the same as those of the aforementioned fifth embodiment. Each of the modified examples described below may be achieved by being appropriately combined with configurations of another modified example or another embodiment.

Note that, the first holder 61L may be surface-mounted on the first pad 41 provided on the first surface S1 of the board 21 without including the protruding portion 61*p*. Similarly, the second holder 62L may be surface-mounted on the second pad 42 provided on the first surface S1 of the board 21 without including the protruding portion 62*p*.

First Modified Example

Figure 24A:
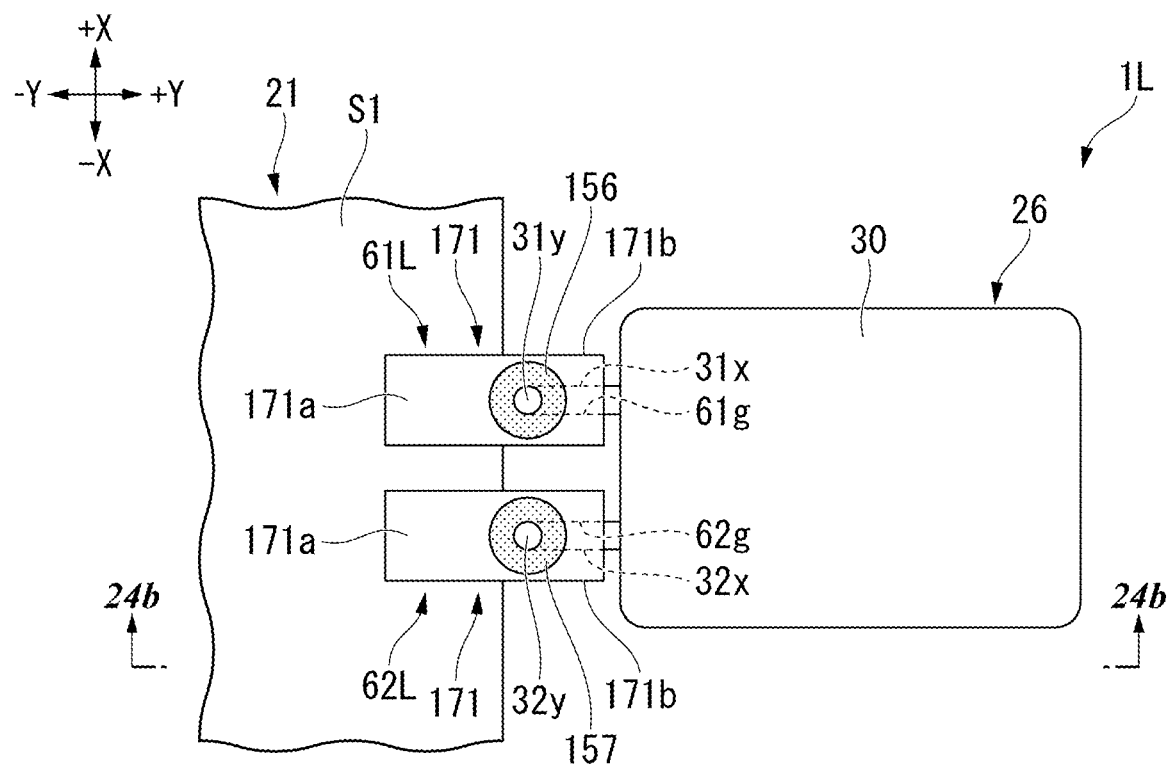
FIG. 24A is an explanatory plan view of a mounting structure of a first modified example according to the fifth embodiment.
Figure 24B:
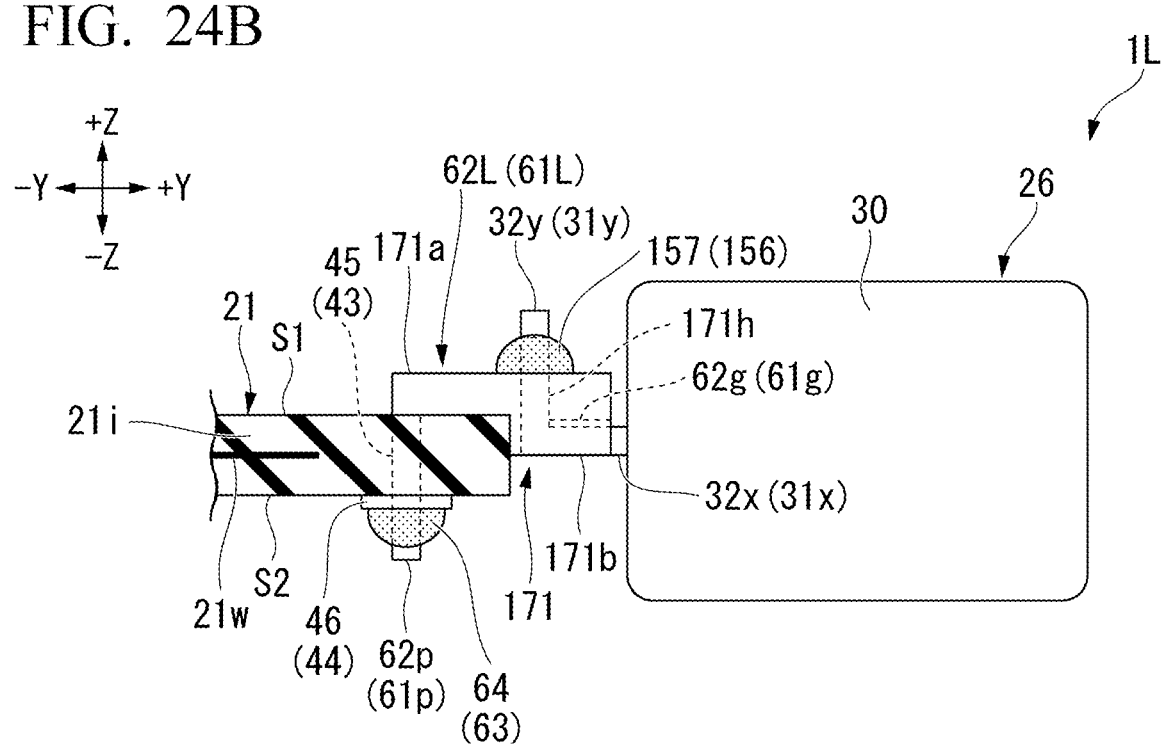
FIG. 24B is an explanatory cross-sectional view of the mounting structure of the first modified example according to the fifth embodiment.

FIGS. 24A and 24B are explanatory views of a mounting structure of the capacitor 26 of a first modified example according to the fifth embodiment. FIG. 24A is a cross-sectional view showing the mounting structure of the capacitor 26. FIG. 24B is a cross-sectional view taken along line 24*b*-24*b* shown in FIG. 24A. Each of the second portion 171*b* of the first holder 61L and the second portion 171*b* of the second holder 62L has a through-hole 171*h*. The through-hole 171*h* penetrates through the holder main body 171 in a direction crossing the Y direction (for example, the Z direction).

The first lead 31 includes a base 31*x* and a curved portion 31*y*. The base 31*x* protrudes straight from the component main body 30 in the −Y direction. The curved portion 31*y* includes a portion bent with respect to the base 31*x* in a direction crossing the Y direction (for example, the Z direction). The curved portion 31*y* is inserted into the through-hole 171*h* of the first holder 61L. Similarly, the second lead 32 includes a base 32*x* and a curved portion 32*y*. The base 32*x* protrudes straight from the component main body 30 in the −Y direction. The curved portion 32*y* includes a portion bent with respect to the base 32*x* in a direction crossing the Y direction (for example, the Z direction). The curved portion 32*y* is inserted into the through-hole 171*h* of the second holder 62L. In the modified example, the connection portions 156 and 157 are provided on an end surface of the holder main body 171 facing in the +Z direction.

With this configuration, the distance between the board 21 and the component main body 30 of the capacitor 26 can be shorter than that of the configuration of according to the fifth embodiment. Accordingly, it is possible to further downsize the semiconductor storage device 1L. Note that, the through-hole 171*h* is not limited to the through-hole extending in the Z direction. The through-hole 171*h* may be a through-hole extending in a direction inclined with respect to the Z direction.

Note that, the first holder 61L may be surface-mounted on the first pad 41 provided on the first surface S1 of the board 21 without including the protruding portion 61*p*. Similarly, the second holder 62L may be surface-mounted on the second pad 42 provided on the first surface S1 of the board 21 without including the protruding portion 62*p*.

Second Modified Example

Figure 25A:
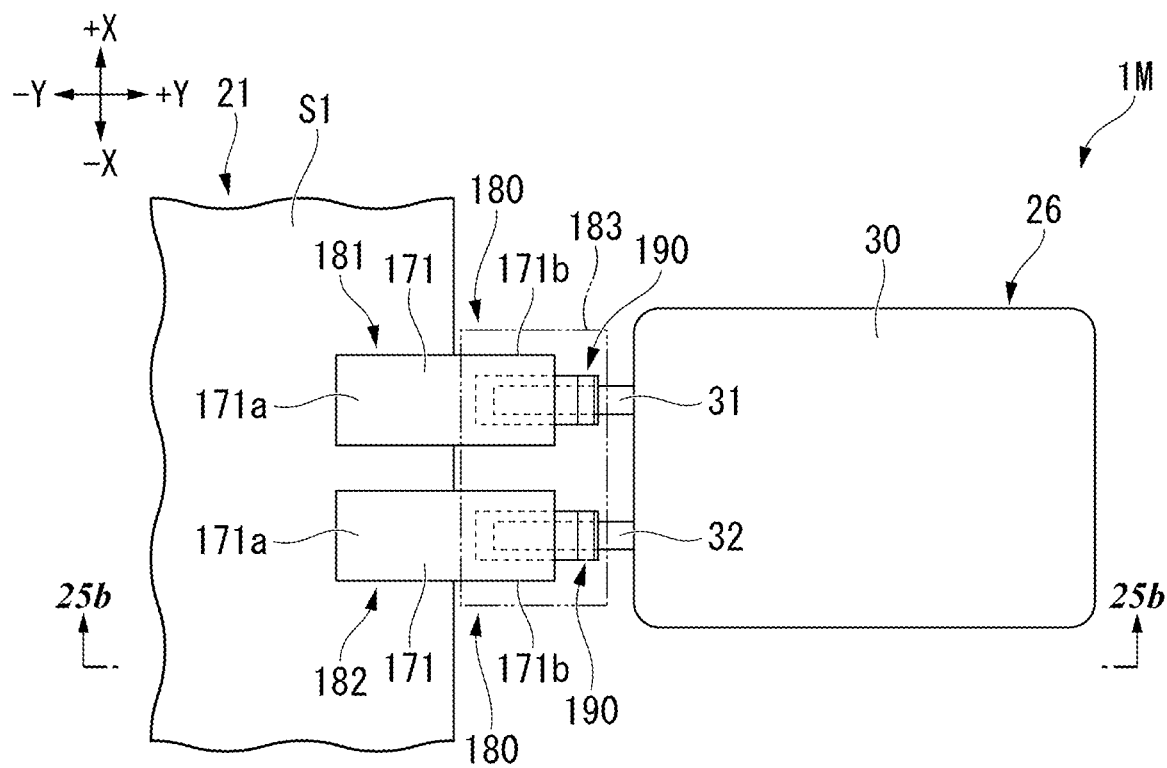
FIG. 25A is an explanatory plan view of a mounting structure of a second modified example according to the fifth embodiment.
Figure 25B:
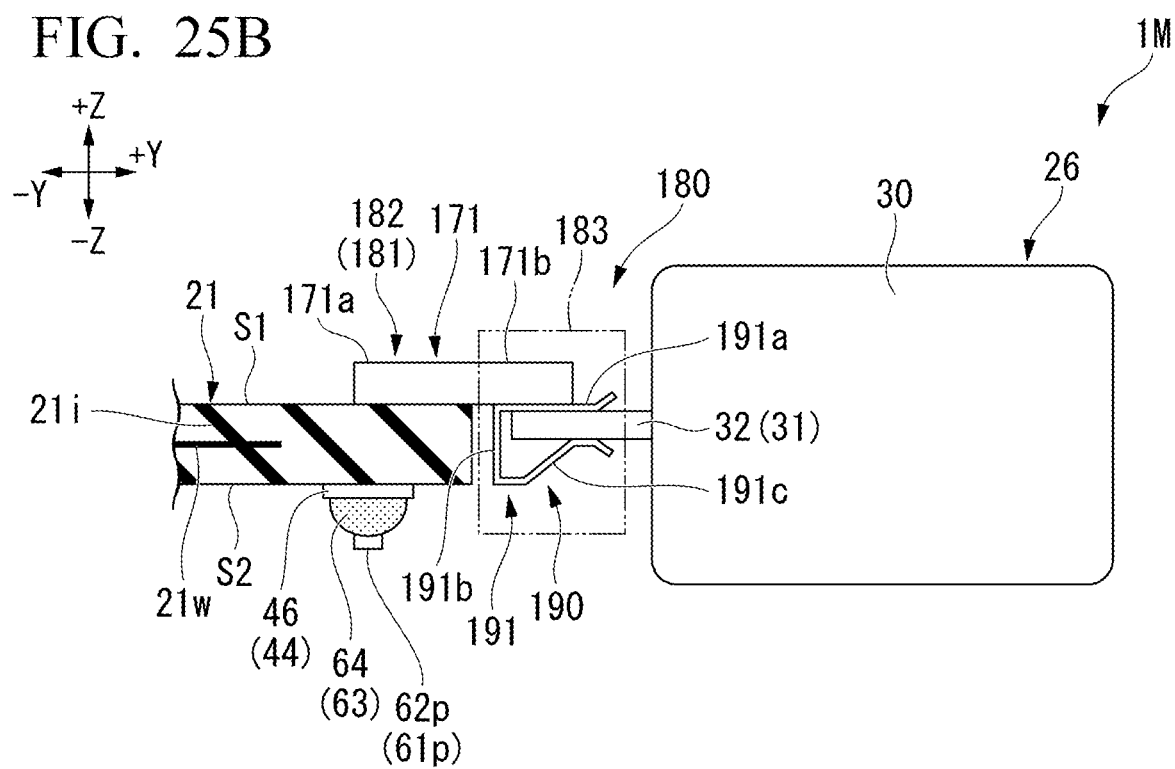
FIG. 25B is an explanatory cross-sectional view of the mounting structure of the second modified example according to the fifth embodiment.

FIGS. 25A and 25B are explanatory views of a mounting structure of the capacitor 26 of a second modified example. FIG. 25A is a plan view showing the mounting structure of the capacitor 26. FIG. 25B is a cross-sectional view taken along line 25*b*-25*b* shown in FIG. 25A. A semiconductor storage device 1M of the second modified example includes a holder 180 instead of the first holder 61 and the second holder 62. The holder 180 includes, for example, a first holding portion 181, a second holding portion 182, and a housing 183.

The first holding portion 181 is a member corresponding the first holder 61L according to the fifth embodiment. The first holding portion 181 is formed of, for example, metal having electroconductivity. The first holding portion 181 includes the holder main body 171 and the protruding portion 61*p*.

In the modified example, the second portion 171*b* of the holder main body 171 includes the sandwiching portion 190. The sandwiching portion 190 has elasticity. The sandwiching portion 190 sandwiches the first lead 31 and thereby holds the first lead 31. For example, the sandwiching portion 190 includes a plate spring 191. The plate spring 191 includes a first portion 191*a*, a second portion 191*b*, and a third portion 191*c*.

The first portion 191*a* forms a base of the sandwiching portion 190. The first portion 191*a* is located on, for example, the first lead 31 on the side in the +Z direction. In other words, the first portion 191a is located on the upper portion of the first lead 31 facing in the +Z direction. The second portion 191b extends in the -Z direction from the end portion of the first portion 191a on the side in the -Y direction. The third portion 191c includes a portion bent at the end portion of the second portion 191b on the side in the -Z direction. The third portion 191c extends toward the first portion 191a. In other words, the third portion 191c is located on the lower portion of the first lead 31 facing in the -Z direction. For example, the third portion 191c includes a portion extending in a direction inclined with respect to the Z direction. The third portion 191c is located on, for example, the side in the -Z direction with respect to the first lead 31.

In a case in which the first lead 31 is inserted into the sandwiching portion 190, the first lead 31 is inserted between the first portion 191a and the third portion 191c, and the plate spring 191 is elastically deformed so as to increase the distance between the first portion 191a and the third portion 191c. Consequently, the first lead 31 is pressed against the first portion 191a by the third portion 191c and therefore the first lead 31 is held by the sandwiching portion 190. Since the first lead 31 is sandwiched by the sandwiching portion 190, the first holding portion 181 is electrically connected to the sandwiching portion 190.

The explanation of the second holding portion 182 is the same as that of the first holding portion 181. That is, the explanation of the aforementioned first holding portion 181 may be applicable to the explanation of the second holding portion 182 by replacing "the first holding portion 181" with "the second holding portion 182", replacing "protruding portion 61p" with "protruding portion 62p", and replacing "first lead 31" with "second lead 32".

The housing 183 is provided over at least a part of the first holding portion 181 and at least a part of the second holding portion 182. The housing 183 integrally supports the first holding portion 181 and the second holding portion 182. The housing 183 is made of, for example, a synthetic resin material or rubber and has insulation property. In the embodiment, the housing 183 is formed in a rectangular parallelepiped shape extending across the holder main body 171 of the first holding portion 181 and the holder main body 171 of the second holding portion 182. The housing 183 accommodates the second portion 171b of the holder main body 171 of the first holding portion 181 and the second portion 171b of the holder main body 171 of the second holding portion 182. The housing 183 has the through-hole 61h (refer to FIGS. 21A to 21C) and the through-hole 62h (refer to FIGS. 21A to 21C). The first lead 31 is inserted into the through-hole 61h. The second lead 32 is inserted into the through-hole 62h.

With this configuration, as the sandwiching portion 190 is provided in the semiconductor storage device 1M, it is not necessary to provide a connection portion such as solder with respect to the first lead 31 and the second lead 32.

Note that, the first holding portion 181 may be surface-mounted on the first pad 41 provided on the first surface S1 of the board 21 without including the protruding portion 61p. Similarly, the second holding portion 182 may be surface-mounted on the second pad 42 provided on the first surface S1 of the board 21 without including the protruding portion 62p.

Third Modified Example

FIGS. 26A to 26C are explanatory views of a mounting structure of the capacitor 26 of a third modified example. FIG. 26A is a plan view showing the mounting structure of the capacitor 26. FIG. 26B is a cross-sectional view taken along line 26b-26b shown in FIG. 26A. FIG. 26C is a cross-sectional view taken along line 26c-26c shown in FIG. 26B. A semiconductor storage device 1N of the third modified example includes a holder 200 instead of the first holder 61 and the second holder 62. The holder 200 includes, for example, first holding portion 201, second holding portion 202, and a support portion 203.

The first holding portion 201 has a shape substantially the same as the first holder 61L according to the fifth embodiment. The first holding portion 201 includes the holder main body 171 and the protruding portion 61p. The holder main body 171 includes the first portion 171a and the second portion 171b. Furthermore, the holder main body 171 of the modified example includes a first engagement portion 201a. The first engagement portion 201a includes a portion bent at the end portion of the second portion 171b on the side in the +Y direction toward the +X direction. The first engagement portion 201a extends in the +X direction.

The second holding portion 202 has a shape substantially the same as the second holder 62L according to the fifth embodiment. The second holding portion 202 includes the holder main body 171 and the protruding portion 62p. The holder main body 171 includes the first portion 171a and the second portion 171b. Furthermore, the holder main body 171 of the modified example includes a second engagement portion 202a. The second engagement portion 202a includes a portion bent at the end portion of the second portion 171b on the side in the +Y direction toward the -X direction. The second engagement portion 202a extends in the -X direction.

The support portion 203 is provided over at least a part of the first holding portion 201 and at least a part of the second holding portion 202. The support portion 203 integrally supports the first holding portion 201 and the second holding portion 202. The support portion 203 is made of, for example, a synthetic resin material or rubber and has insulation property. In the embodiment, the support portion 203 includes the body-receiving portion 160, a third engagement portion 203a, and a fourth engagement portion 203b. The body-receiving portion 160 supports the component main body 30 of the capacitor 26.

Figure 27:
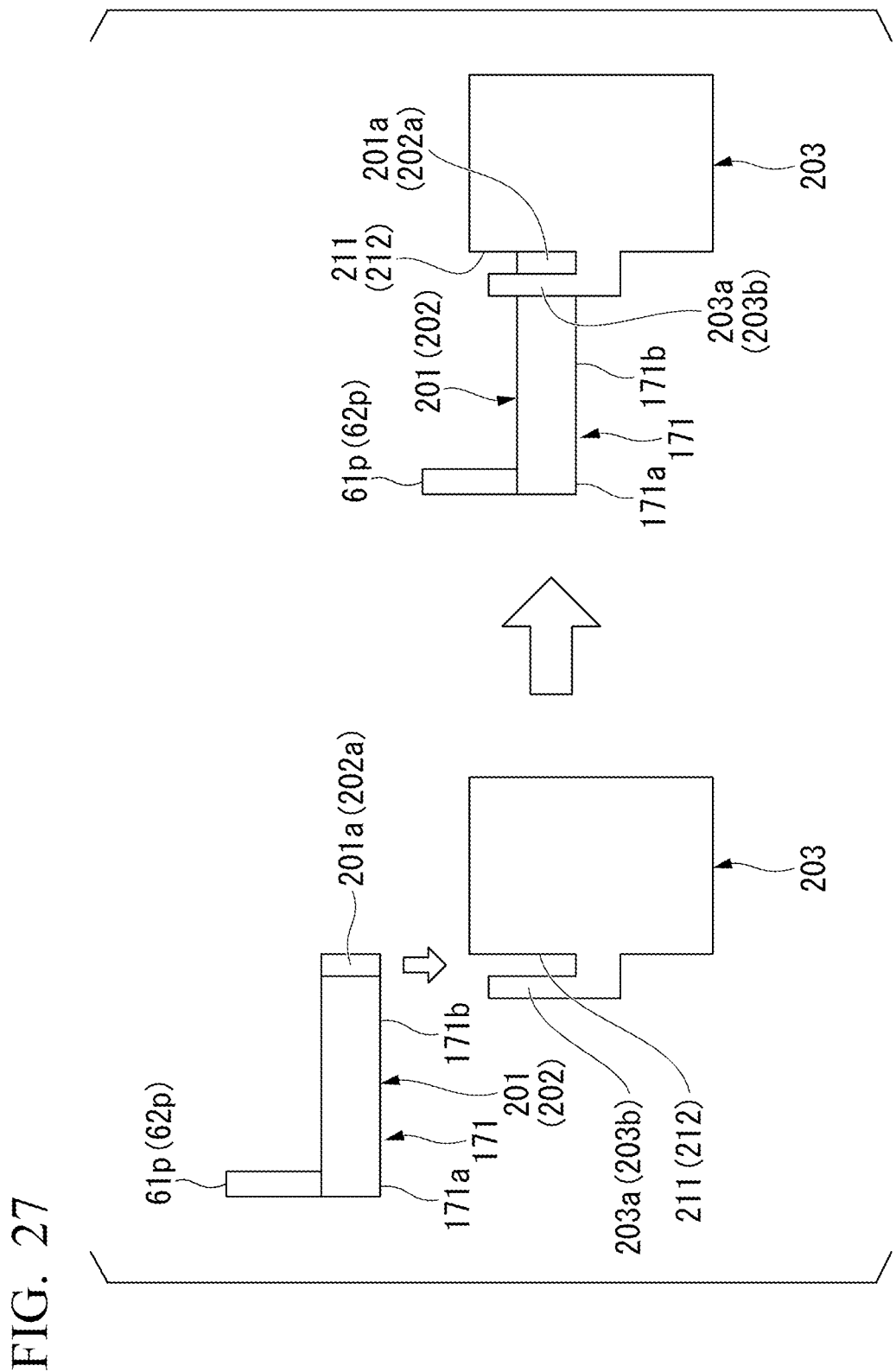
FIG. 27 is an exploded side view showing holder the third modified example according to the fifth embodiment.

FIG. 27 is an exploded side view showing the holder 200 of the modified example. Note that, FIG. 27 is a view showing a posture inverted in a vertical direction with respect to the posture of the holder 200 shown in FIGS. 26A to 26C. The third engagement portion 203a has a recess portion 211 to be engaged with the first engagement portion 201a of the first holding portion 201. The recess portion 211 is, for example, a groove opened in the -Z direction. As the first engagement portion 201a of the first holding portion 201 is fitted into the recess portion 211 in the Z direction, the first holding portion 201 is fixed to the third engagement portion 203a. Similarly, the fourth engagement portion 203b has a recess portion 212 to be engaged with the second engagement portion 202a of the second holding portion 202. The recess portion 212 is, for example, a groove opened in the -Z direction. As the second engagement portion 202a of the second holding portion 202 is fitted into the recess portion 212 in the Z direction, the second holding portion 202 is fixed to the fourth engagement portion 203b.

With this configuration, it is possible to reduce the thickness of the semiconductor storage device 1N in a similar manner to the first embodiment. In the configuration according to the embodiment, as the support portion 203 is provided in the semiconductor storage device 1N, the first holding portion 201 and the second holding portion 202 form one integrated body, and it is possible to handle the body. Consequently, it is possible to improve workability of assembling the first holding portion 201 and the second holding portion 202 to the semiconductor storage device 1N.

Fourth Modified Example

Figure 28A:
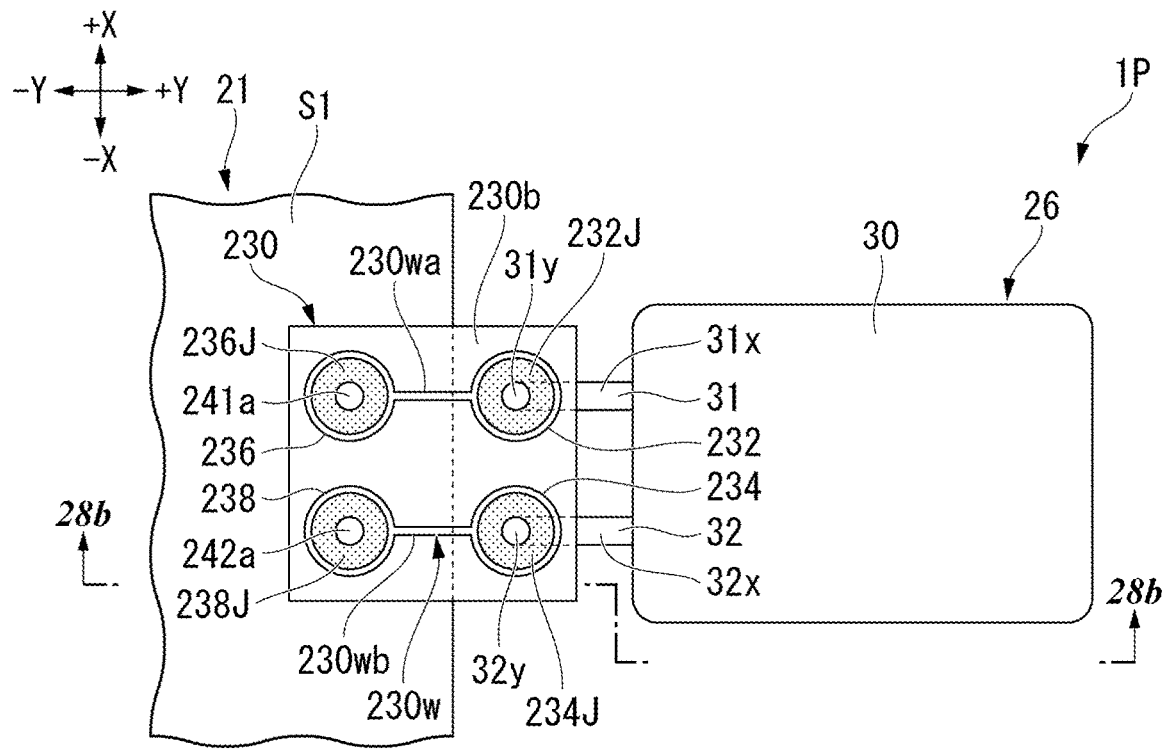
FIG. 28A is an explanatory plan view of a mounting structure of a fourth modified example according to the fifth embodiment.
Figure 28B:
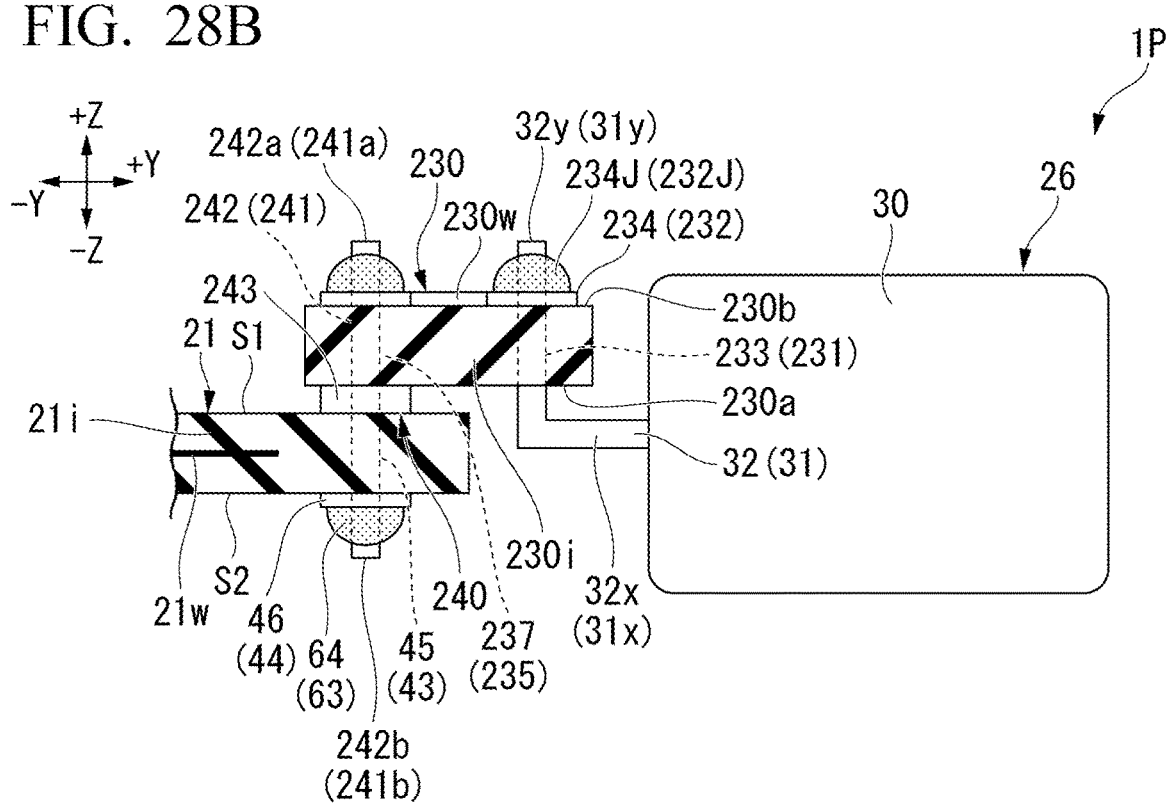
FIG. 28B is an explanatory cross-sectional view of the mounting structure of the fourth modified example according to the fifth embodiment.
Figure 29:
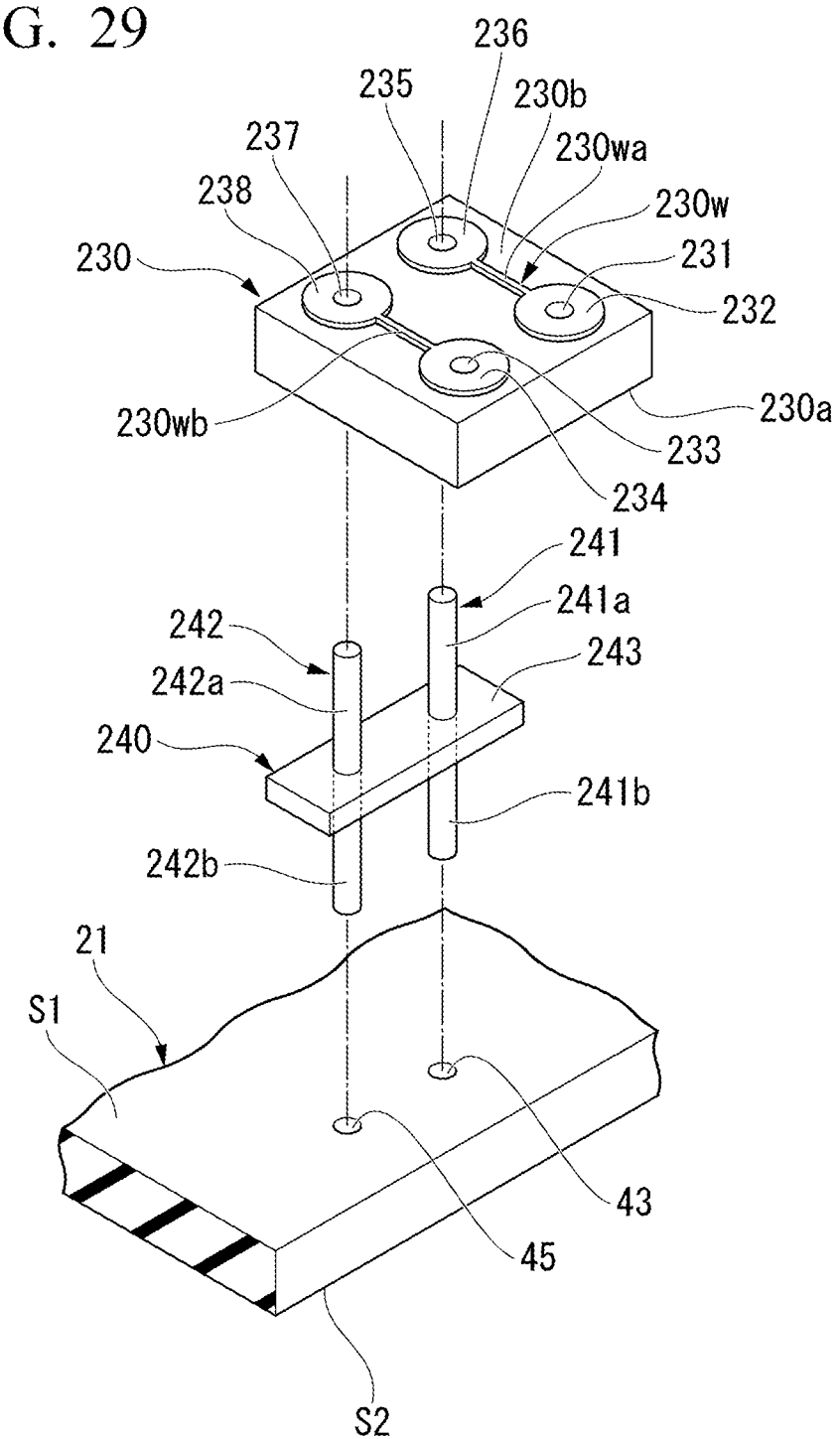
FIG. 29 is an exploded perspective view showing the mounting structure of the fourth modified example according to the fifth embodiment.

FIGS. 28A and 28B are explanatory views of a mounting structure of the capacitor 26 of a fourth modified example. FIG. 28A is a plan view showing the mounting structure of the capacitor 26. FIG. 28B is a cross-sectional view taken along line 28b-28b shown in FIG. 28A. FIG. 29 is an exploded perspective view showing the mounting structure of the capacitor 26 of a fourth modified example. A semiconductor storage device 1P of the fourth modified example includes a holder 230 and a fixing member 240 instead of the first holder 61 and the second holder 62.

The holder 230 is, for example, a printed board including an insulating base member 230i and a wiring pattern 230w provided on the insulating base member 230i. The wiring pattern 230w may be a wiring pattern provided on a surface layer of the insulating base member 230i or may be a wiring pattern provided in an inner layer of the insulating base member 230i. The wiring pattern 230w includes, for example, a first wiring 230wa and a second wiring 230wb. The holder 230 has a first surface 230a and a second surface 230b. The first surface 230a faces the board 21. The second surface 230b is the opposite side of the first surface 230a.

The holder 230 includes a first through-hole 231, a first land 232, a second through-hole 233, a second land 234, a third through-hole 235, a third land 236, a fourth through-hole 237, and a fourth land 238.

The first through-hole 231 is a through-hole penetrating through the board 21 in the Z direction. The first land 232 is a conductive portion provided on the second surface 230b of the holder 230. The first land 232 is provided around the first through-hole 231. Here, the first lead 31 includes the base 31x and the curved portion 31y. The curved portion 31y of the first lead 31 is inserted into the first through-hole 231. The curved portion 31y of the first lead 31 is fixed on the first land 232 by a connection portion 232J. Consequently, the capacitor 26 is held by the holder 230. The connection portion 232J is formed of, for example, a conductive bonding material (for example, solder or electroconductive paste). The curved portion 31y of the first lead 31 is connected to the first wiring 230wa of the wiring pattern 230w via, for example, the first land 232.

The second through-hole 233 is a through-hole penetrating through the board 21 in the Z direction. The second land 234 is a conductive portion provided on the second surface 230b of the holder 230. The second land 234 is provided around the second through-hole 233. Here, the second lead 32 includes the base 32x and the curved portion 32y. The curved portion 32y of the second lead 32 is inserted into the second through-hole 233. The curved portion 32y of the second lead 32 is fixed on the second land 234 via a connection portion 234J. Consequently, the capacitor 26 is held by the holder 230. The connection portion 234J is formed of, for example, a conductive bonding material (for example, solder or electroconductive paste). The curved portion 32y of the second lead 32 is connected to the second wiring 230wb of the wiring pattern 230w via, for example, the second land 234.

The third through-hole 235 is a through-hole penetrating through the board 21 in the Z direction. The third land 236 is a conductive portion provided on the second surface 230b of the holder 230. The third land 236 is provided around the third through-hole 235. Here, the fixing member 240 described below has a first pin 241. A first portion 241a of the first pin 241 is inserted into the third through-hole 235. The first portion 241a of the first pin 241 is fixed on the third land 236 via a connection portion 236J. The connection portion 236J is formed of, for example, a conductive bonding material (for example, solder or electroconductive paste). The first portion 241a of the first pin 241 is connected to the first wiring 230wa of the wiring pattern 230w via, for example, the third land 236.

The fourth through-hole 237 is a through-hole penetrating through the board 21 in the Z direction. The fourth land 238 is a conductive portion provided on the second surface 230b of the holder 230. The fourth land 238 is provided around the fourth through-hole 237. Here, the fixing member 240 described below has a second pin 242. A first portion 242a of the second pin 242 is inserted into the fourth through-hole 237. The first portion 242a of the second pin 242 is fixed on the fourth land 238 via a connection portion 238J. The connection portion 238J is formed of, for example, a conductive bonding material (for example, solder or electroconductive paste). The first portion 242a of the second pin 242 is connected to the second wiring 230wb of the wiring pattern 230w via, for example, the fourth land 238.

The fixing member 240 includes the first pin 241, the second pin 242, and a holding portion 243. Each of the first pin 241 and the second pin 242 is a pin formed of, for example, metal having electroconductivity. Each of the first pin 241 and the second pin 242 extends in the Z direction. The first pin 241 includes the first portion 241a and a second portion 241b. The first portion 241a protrudes to one side of the holding portion 243. The second portion 241b protrudes to the other side of the holding portion 243. Similarly, the second pin 242 includes the first portion 242a and a second portion 242b. The first portion 242a protrudes to one side of the holding portion 243. The second portion 242b protrudes to the other side of the holding portion 243.

The holding portion 243 is formed of, for example, an insulating material such as a synthetic resin material or the like. The holding portion 243 integrally holds the first pin 241 and the second pin 242. The holding portion 243 is located between the board 21 and the holder 230 in a case in which the mounting structure is assembled. The holding portion 243 functions as a spacer separating the board 21 and the holder 230 from each other (refer to FIGS. 28A and 28B).

Moreover, the holding portion 243 also functions as a regulating member that regulates heights of the first pin 241 and the second pin 242 protruding in the Z direction when attaching the fixing member 240 to the holder 230. That is, when attaching the fixing member 240 to the holder 230, the holding portion 243 comes into contact with the first surface 230a of the holder 230. At this time, the height of the first portion 241a of the first pin 241 protruding from the third through-hole 235 of the holder 230 is regulated, and the height of the first portion 242a of the second pin 242 protruding from the fourth through-hole 237 of the holder 230 is regulated. Accordingly, it is possible to stably connect the first portion 241a of the first pin 241 to the third land 236. It is possible to stably connect the first portion 242a of the second pin 242 to the fourth land 238.

Similarly, the holding portion 243 also functions as a regulating member that regulates heights of the first pin 241 and the second pin 242 protruding in the Z direction when attaching the fixing member 240 to the board 21. That is, when attaching the fixing member 240 to the board 21, the holding portion 243 comes into contact with the first surface S1 of the board 21. At this time, the height of the second portion 241b of the first pin 241 protruding from the first through-hole 43 of the board 21 is regulated, and the height of the second portion 242b of the second pin 242 protruding from the second through-hole 45 of the board 21 is regulated. Accordingly, it is possible to stably connect the second portion 241b of the first pin 241 to the first land 44. It is possible to stably connect the second portion 242b of the second pin 242 to the second land 46.

The board 21 includes the first through-hole 43, the first land 44, the second through-hole 45, and the second land 46.

The second portion 241b of the first pin 241 is inserted into the first through-hole 43 of the board 21. The second portion 241b of the first pin 241 is fixed on the first land 44 via the connection portion 63. Accordingly, the holder 230 is fixed on the board 21. The second portion 241b of the first pin 241 is connected to the wiring pattern 21w of the board 21 via, for example, the first land 44. Consequently, the first lead 31 of the capacitor 26 is connected to the wiring pattern 21w of the board 21 via the first land 232 of the holder 230, the first wiring 230wa of the wiring pattern 230w of the holder 230, the third land 236 of the holder 230, the first pin 241 of the fixing member 240, and the first land 44 of the board 21.

The second portion 242b of the second pin 242 is inserted into the second through-hole 45 of the board 21. The second portion 242b of the second pin 242 is fixed on the second land 46 via the connection portion 64. Accordingly, the holder 230 is fixed on the board 21. The second portion 242b of the second pin 242 is connected to the wiring pattern 21w of the board 21 via, for example, the second land 46. Consequently, the second lead 32 of the capacitor 26 is connected to the wiring pattern 21w of the board 21 via the second land 234 of the holder 230, the second wiring 230wb of the wiring pattern 230w of the holder 230, the fourth land 238 of the holder 230, the second pin 242 of the fixing member 240, and the second land 46 of the board 21.

With this configuration, it is possible to reduce the thickness of the semiconductor storage device 1P in a similar manner to the first embodiment. In the configuration according to the embodiment, since the holder 230 serving as a printed board is used, the manufacturing cost may be reduced lower than that of the other embodiments.

Sixth Embodiment

Next, a sixth embodiment will be described. The sixth embodiment is different from the first embodiment in that a holder includes a sandwiching portion that sandwiches a lead. Configurations other than those described below are the same as those of the second modified example according to the aforementioned first embodiment.

FIGS. 30A and 30B are explanatory views of a mounting structure of the capacitor 26 according to the sixth embodiment. FIG. 30A is a cross-sectional view showing the mounting structure of the capacitor 26. FIG. 30B is a cross-sectional view taken along line 30c-30c shown in FIG. 30A. A semiconductor storage device 1Q according to the sixth embodiment includes a first holder 61Q instead of the first holder 61 and includes a second holder 62Q instead of the second holder 62.

Similarly to the second modified example according to the first embodiment, the first holder 61Q includes the flat surface 61s. The flat surface 61s is surface-mounted on the pad 71 of the first surface S1 of the board 21. The flat surface 61s is formed of metal. Similarly to the second modified example according to the fifth embodiment, the first holder 61Q includes the housing 183 and the sandwiching portion 190. The housing 183 accommodates the sandwiching portion 190. The first portion 191a of the sandwiching portion 190 is connected to the pad 71 via the connection portion 73. The pad 71 is connected to the wiring pattern 21w of the board 21. Consequently, the first lead 31 is connected to the wiring pattern 21w of the board 21 via the sandwiching portion 190 of the first holder 61Q and the pad 71.

Similarly to the second modified example according to the first embodiment, the second holder 62Q includes the flat surface 62s. The flat surface 62s is surface-mounted on the pad 72 of the second surface S2 of the board 21. The flat surface 62s is formed of metal. Similarly to the second modified example according to the fifth embodiment, the second holder 62Q includes the housing 183 and the sandwiching portion 190. The housing 183 accommodates the sandwiching portion 190. The first portion 191a of the sandwiching portion 190 is connected to the pad 72 via the connection portion 74. The pad 72 is connected to the wiring pattern 21w of the board 21. Consequently, the second lead 32 is connected to the wiring pattern 21w of the board 21 via the sandwiching portion 190 of the second holder 62Q and the pad 72.

With this configuration, it is possible to reduce the thickness of the semiconductor storage device 1Q in a similar manner to the first embodiment. Furthermore, in the configuration according to the embodiment, it is possible to shorten the distance between the board 21 and the component main body 30 of the capacitor 26. Furthermore, in the configuration according to the embodiment, it is not necessary to provide a connection portion such as solder with respect to the first lead 31 and the second lead 32.

Note that, instead of the above-described configuration, the first holder 61Q may include the protruding portion 61p inserted into the first through-hole 43 of the board 21 in a similar manner to the first embodiment. The second holder 62Q may include the protruding portion 62p inserted into the second through-hole 45 of the board 21 in a similar manner to the first embodiment.

First Modified Example

Figure 31B:
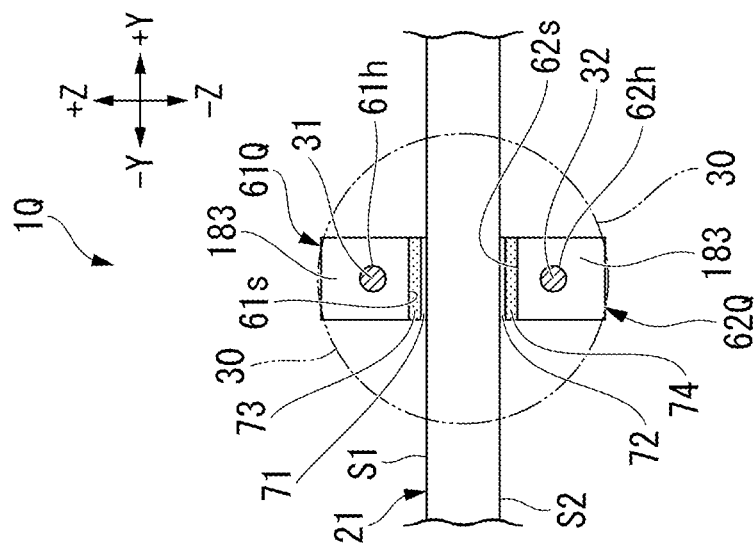
FIG. 31B is an explanatory cross-sectional view of the mounting structure of the first modified example according to the sixth embodiment.
Figure 31A:
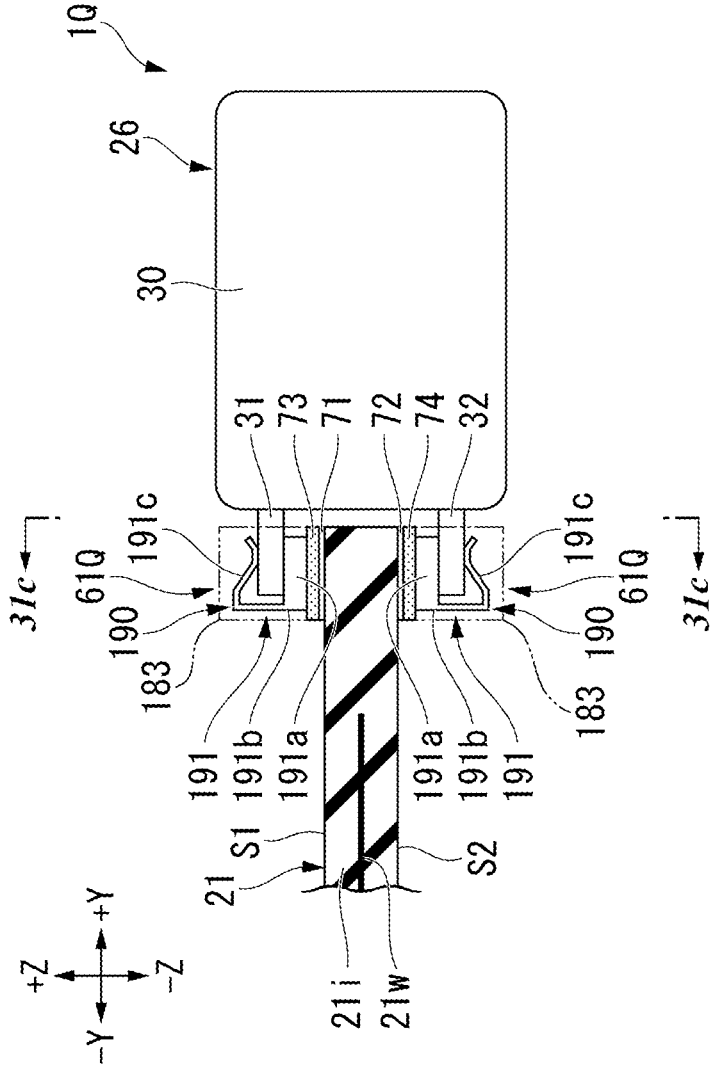
FIG. 31A is an explanatory cross-sectional view of a mounting structure of a first modified example according to the sixth embodiment.

FIGS. 31A and 31B are explanatory views of a mounting structure of the capacitor 26 of a first modified example according to the sixth embodiment. FIG. 31A is a cross-sectional view showing the mounting structure of the capacitor 26. FIG. 31B is a cross-sectional view taken along line 31c-31c shown in FIG. 31A. In the semiconductor storage device 1Q of the modified example, the first holder 61Q and the second holder 62Q are disposed at positions at which the first holder 61Q and the second holder 62Q overlap each other in the Z direction. In the modified example, the height of the first holder 61Q (for example, a thickness of the first portion 191a of the first holder 61Q) is adjusted such that the distance between the first lead 31 and the board 21 is larger than that of the sixth embodiment. Similarly, the height of the second holder 62Q (for example, a thickness of the first portion 191a of the second holder 62Q) is adjusted such that the distance between the second lead 32 and the board 21 is larger than that of the sixth embodiment.

With this configuration, attachment operation of the capacitor 26 can be carried out in the posture in which the first lead 31 and the second lead 32 overlap in the Z direction. Accordingly, it is possible to increase a degree of workability of attaching the capacitor 26 to the board 21.

Second Modified Example

FIG. 32A to 32C are explanatory views of a mounting structure of the capacitor 26 of a second modified example according to the sixth embodiment. FIG. 32A is a plan view showing the mounting structure of the capacitor 26. FIG. 32B is a cross-sectional view taken along line 32b-32b shown in FIG. 32A. FIG. 32C is a cross-sectional view taken along line 32c-32c shown in FIG. 32B. A semiconductor storage device 1QA of the modified example includes a first holder 61QA and a second holder 62QA.

In the modified example, the board 21 has the screw hole 81 instead of the pad 71. Similarly, the board 21 has the screw hole 82 instead of the pad 72. The first holder 61QA includes the sandwiching portion 190 and has the screw-insertion hole 83. The screw-insertion hole 83 is in communication with the screw hole 81 of the board 21. The second holder 62QA includes the sandwiching portion 190 and has the screw-insertion hole 85. The screw-insertion hole 85 is in communication with the screw hole 82 of the board 21. Furthermore, the first holder 61QA is inserted into the screw-insertion hole 83. The first holder 61QA is fixed on the board 21 by the screw 84 engaged with the screw hole 81. Similarly, the second holder 62QA is inserted into the screw-insertion hole 85. The second holder 62QA is fixed on the board 21 by the screw 86 engaged with the screw hole 82.

In the modified example, each of an inner peripheral face of the screw hole 81 and an inner peripheral face of the screw hole 82 is connected to the wiring pattern 21w of the board 21. Therefore, the first lead 31 is connected to the wiring pattern 21w of the board 21 via the sandwiching portion 190 of the first holder 61QA, the screw 84, and the inner peripheral face of the screw hole 81. Similarly, the second lead 32 is connected to the wiring pattern 21w of the board 21 via the sandwiching portion 190 of the second holder 62QA, the screw 86, and the inner peripheral face of the screw hole 82. Note that, instead of fixation using the screw 84, the first holder 61QA may include the protruding portion 61p in a similar manner to the first embodiment. The protruding portion 61p is inserted into the first through-hole 43 of the board 21 and is fixed on the board 21 via the third connection portion 63. The protruding portion 61p is connected to the wiring pattern 21w of the board 21 via the first land 44. In this case, the first lead 31 is connected to the wiring pattern 21w of the board 21 via the sandwiching portion 190 of the first holder 61QA, the protruding portion 61p, and the first land 44.

Similarly, instead of fixation using the screw 86, the second holder 62QA may include the protruding portion 62p in a similar manner to the first embodiment. The protruding portion 62p is inserted into the second through-hole 45 of the board 21 and is fixed on the board 21 via the fourth connection portion 64. The protruding portion 62p is connected to the wiring pattern 21w of the board 21 via the second land 46. In this case, the second lead 32 is connected to the wiring pattern 21w of the board 21 via the sandwiching portion 190 of the second holder 62QA, the protruding portion 62p, and the second land 46.

Seventh Embodiment

Next, a seventh embodiment will be described. The seventh embodiment is different from the first embodiment in that a holder sandwiching the board is provided. Configurations other than those described below are the same as those of the aforementioned first embodiment.

FIGS. 33A to 33C are explanatory views of a mounting structure of the capacitor 26 according to the seventh embodiment. FIG. 33A is a plan view showing the mounting structure of the capacitor 26. FIG. 33B is a cross-sectional view taken along line 33b-33b shown in FIG. 33A. FIG. 33C is a cross-sectional view taken along line 33c-33c shown in FIG. 33B. A semiconductor storage device 1R according to the seventh embodiment includes a holder 220 instead of the first holder 61 and the second holder 62. The holder 220 includes a first holding portion 221, a second holding portion 222, a connecting portion (support portion) 223, a fixing portion 224 and a fixing portion 225.

The first holding portion 221 is located on the side in the +Z direction with respect to the board 21. The first holding portion 221 is mounted on the first surface S1 of the board 21. The first holding portion 221 has the through-hole 61h. The first lead 31 is inserted into the through-hole 61h. The second holding portion 222 is located on the side in the −Z direction with respect to the board 21. The second holding portion 222 is mounted on the second surface S2 of the board 21. The second holding portion 222 has the through-hole 62h. The second lead 32 is inserted into the through-hole 62h. The connecting portion 223 extends between the first holding portion 221 and the second holding portion 222 in the Z direction. The connecting portion 223 connects the end portion of the first holding portion 221 on the side in the +Y direction and the end portion of the second holding portion 222 on the side in the +Y direction.

Consequently, the holder 220 has a groove 226. The board 21 is inserted into the groove 226 in the Y direction. The holder 220 sandwiches both sides of the board 21 in the Z direction and thereby is attached to the board 21. The first holding portion 221, the second holding portion 222, and the connecting portion 223 are formed integrally with a thermally-stable synthetic resin material.

In the embodiment, the board 21 has a cutout 215. The holder 220 is attached to the cutout 215. The cutout 215 is provided at the end portion of the board 21 on the side in the +Y direction. The cutout 215 is depressed in the −Y direction. A part of the connecting portion 223 of the holder 220 is inserted into the inside of the cutout 215. Both sides of the holder 220 in the X direction are sandwiched by the board 21.

In the embodiment, the first surface S1 of the board 21 includes a pad 251.

The pad 251 is a conductive portion used for surface mounting. The fixing portion 224 of the holder 220 is formed of, for example, metal. The fixing portion 224 has a flat surface 224s facing the pad 251. The fixing portion 224 is connected to the pad 251 of the board 21 via a connection portion 252. Accordingly, the holder 220 is fixed on the board 21. The connection portion 252 is formed of, for example, a conductive bonding material (for example, solder or electroconductive paste).

For example, the connection portion 252 is provided by a reflow process that is carried out at the same time as the bonding step of mounting the electronic components (for example, the DRAMs 24 and the NANDs 25) on the first surface S1 of the board 21. In the embodiment, for example, the holder 220 is attached to the board 21 before attaching the capacitor 26 to the holder 220. That is, the board 21 is sandwiched by the holder 220. Next, the holder 220 is attached to the board 21 by a reflow process. Thereafter, the capacitor 26 is attached to the holder 220, the first lead 31 is connected to the first pad 41, and the second lead 32 is connected to the second pad 42.

Furthermore, in the embodiment, the second surface S2 of the board 21 has a pad 253. The pad 253 is a conductive portion used for surface mounting. The fixing portion 225 of the holder 220 is formed of, for example, metal. The fixing portion 225 has a flat surface 225s facing the pad 253. The fixing portion 225 is connected to the pad 253 of the board 21 via a connection portion 254. Accordingly, the holder 220 is fixed on the board 21. The connection portion 254 is formed of, for example, a conductive bonding material (for example, solder or electroconductive paste). For example, the connection portion 254 is provided by a reflow process that is carried out at the same time as the bonding step of mounting the electronic components (for example, the DRAMs 24 and the NANDs 25) on the second surface S2 of the board 21.

Therefore, the holder 220 is fixed on the board 21 such that the holder 220 sandwiches the board 21 in the Z direction.

With this configuration, it is possible to reduce the thickness of the semiconductor storage device 1R in a similar manner to the first embodiment. Furthermore, in the configuration according to the embodiment, since the holder 220 having the groove 226 is attached to the board 21, it is possible to prevent displacement of the holder 220 during a surface mounting process.

Modified Example

Figure 34A:
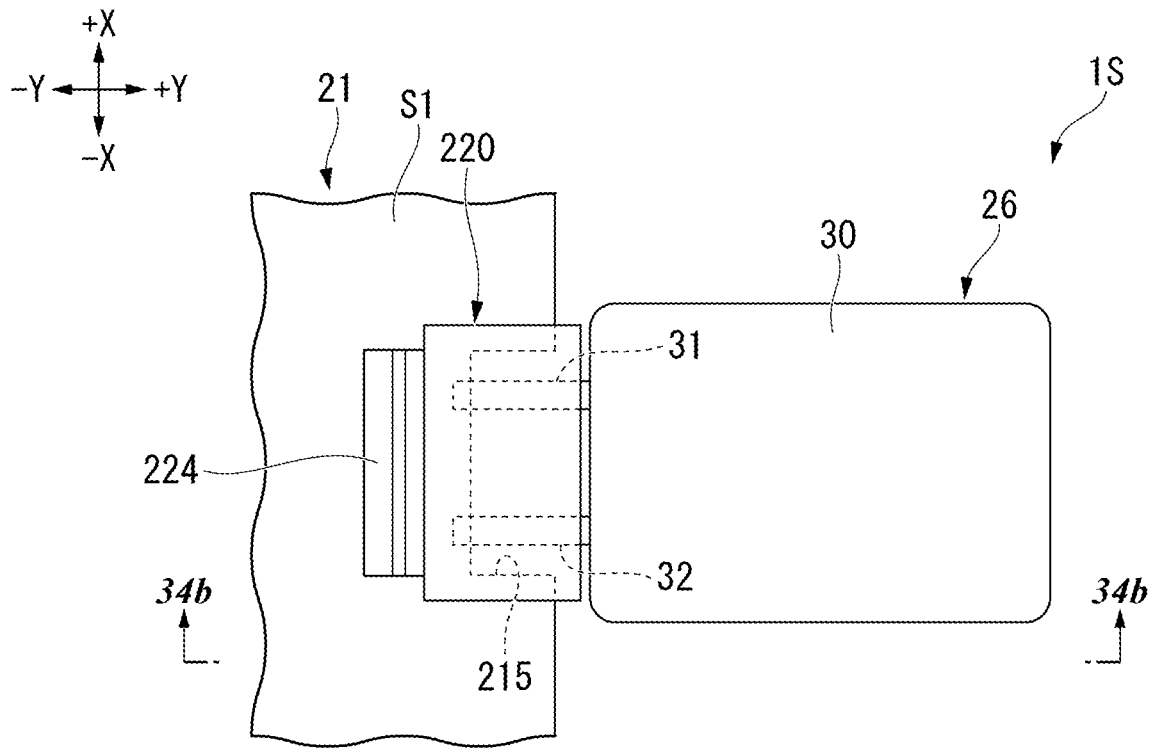
FIG. 34A is an explanatory plan view of a mounting structure of a modified example according to the seventh embodiment.
Figure 34B:
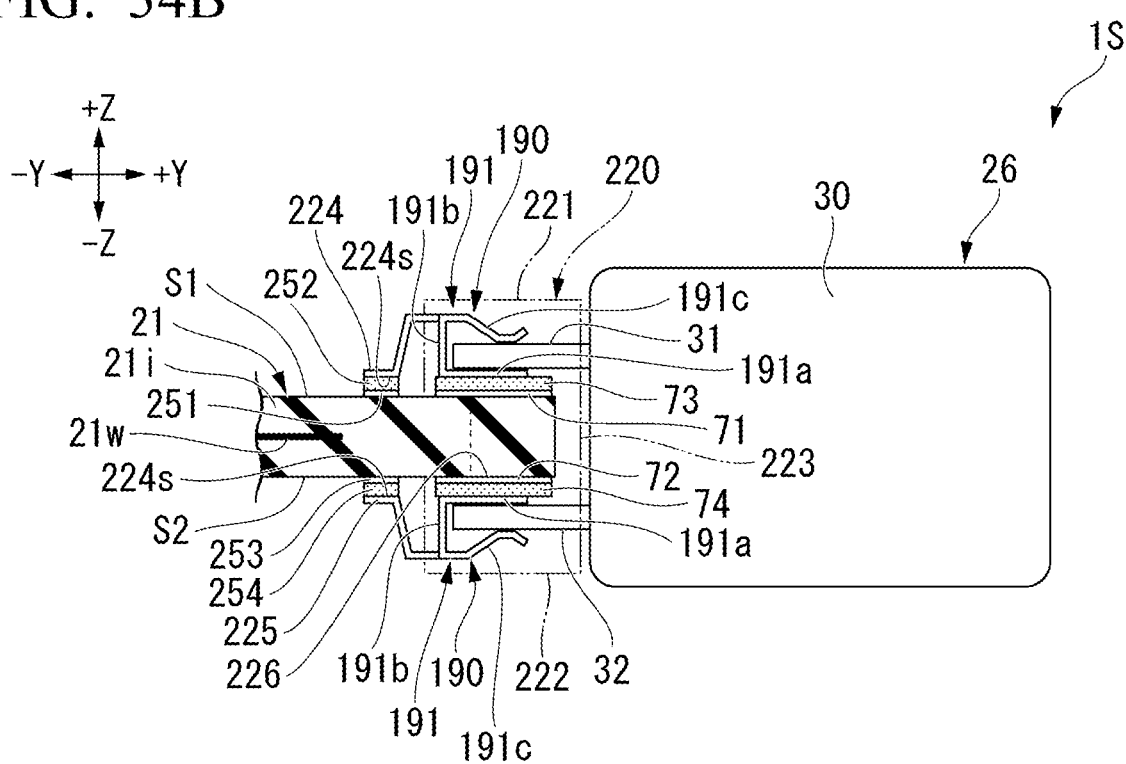
FIG. 34B is an explanatory plan view of the mounting structure of the modified example according to the seventh embodiment.

FIGS. 34A and 34B are explanatory views of a mounting structure of the capacitor 26 of a modified example according to the seventh embodiment. FIG. 34A is a plan view showing the mounting structure of the capacitor 26. FIG. 34B is a cross-sectional view taken along line 34b-34b shown in FIG. 34A. In a semiconductor storage device 1S of the modified example, the first holding portion 221 includes the sandwiching portion 190 holding the first lead 31. The second holding portion 222 includes the sandwiching portion 190 holding the second lead 32. Each of the first holding portion 221 and the second holding portion 222 includes the fixing portion 224.

The first surface S1 of the board 21 includes the pad 251. The pad 251 is connected to the wiring pattern 21w of the board 21. In the embodiment, the fixing portion 224 of the first holding portion 221 is connected to the sandwiching portion 190 of the first holding portion 221. The fixing portion 224 and the sandwiching portion 190 of the first holding portion 221 are formed of, for example, metal having electroconductivity. The first lead 31 is electrically connected to the sandwiching portion 190 by being sandwiched by the sandwiching portion 190 of the first holding portion 221. Accordingly, the first lead 31 is connected to the wiring pattern 21w of the board 21 via the sandwiching portion 190 of the first holding portion 221, the fixing portion 224, and the pad 251.

The second surface S2 of the board 21 includes the pad 253. The pad 253 is a conductive portion used for surface mounting. The fixing portion 225 of the second holding portion 222 is connected to the pad 253 via the connection portion 254. The connection portion 254 is formed of, for example, a conductive bonding material (for example, solder or electroconductive paste). For example, the connection portion 254 is provided by a reflow process that is carried out at the same time as the bonding step of mounting the electronic components (for example, the DRAMs 24 and the NANDs 25) on the second surface S2 of the board 21.

The pad 253 is connected to the wiring pattern 21w of the board 21. In the embodiment, the fixing portion 225 of the second holding portion 222 is connected to the sandwiching portion 190 of the second holding portion 222. The fixing portion 225 and the sandwiching portion 190 of the second holding portion 222 are formed of, for example, metal having electroconductivity. The second lead 32 is electrically connected to the sandwiching portion 190 by being sandwiched by the sandwiching portion 190 of the second holding portion 222. Consequently, the second lead 32 is connected to the wiring pattern 21w of the board 21 via the sandwiching portion 190 of the second holding portion 222, the fixing portion 225, and the pad 253.

In the embodiment, for example, the holder 220 is attached to the board 21 before attaching the capacitor 26 to the holder 220. That is, the board 21 is sandwiched by the holder 220. Next, the holder 220 is attached to the board 21 by a reflow process. Thereafter, the capacitor 26 is attached to the holder 220. In the embodiment, the first lead 31 is sandwiched by the sandwiching portion 190 of the first holding portion 221, and the second lead 32 is sandwiched by the sandwiching portion 190 of the second holding portion 222. Therefore, the first lead 31 and the second lead 32 are connected to the wiring pattern 21w of the board 21. That is, the fixation of the capacitor 26 to the holder 220 and the electrical connection of the first lead 31 and the second lead 32 to the board 21 are carried out at the same time.

Eighth Embodiment

Next, an eighth embodiment will be described. The eighth embodiment is different from the first embodiment in that an axial capacitor is mounted on the board 21. Configurations other than those described below are the same as those of the aforementioned first embodiment.

Figure 35:
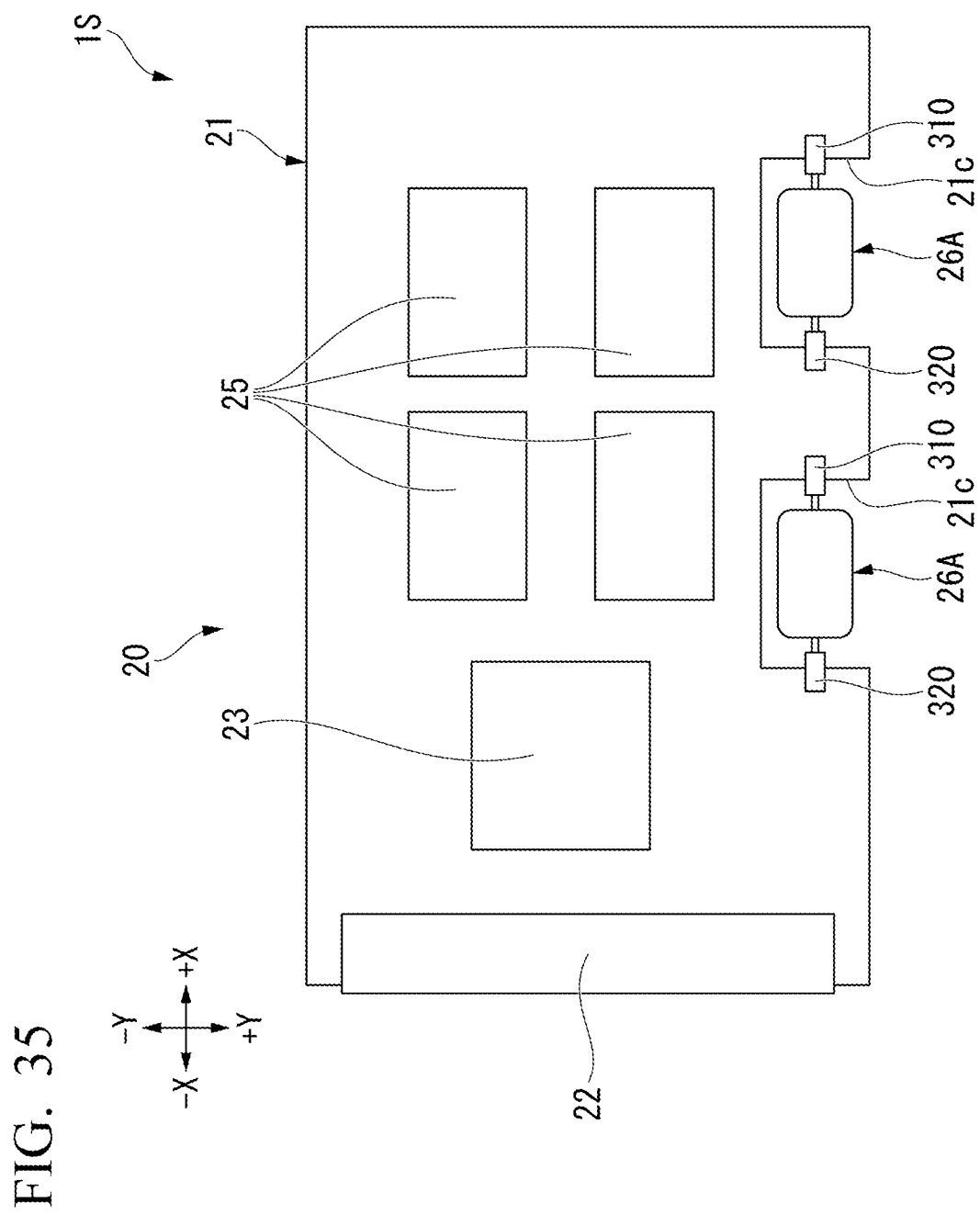
FIG. 35 is a plan view showing a board unit according to an eighth embodiment.
Figure 37:
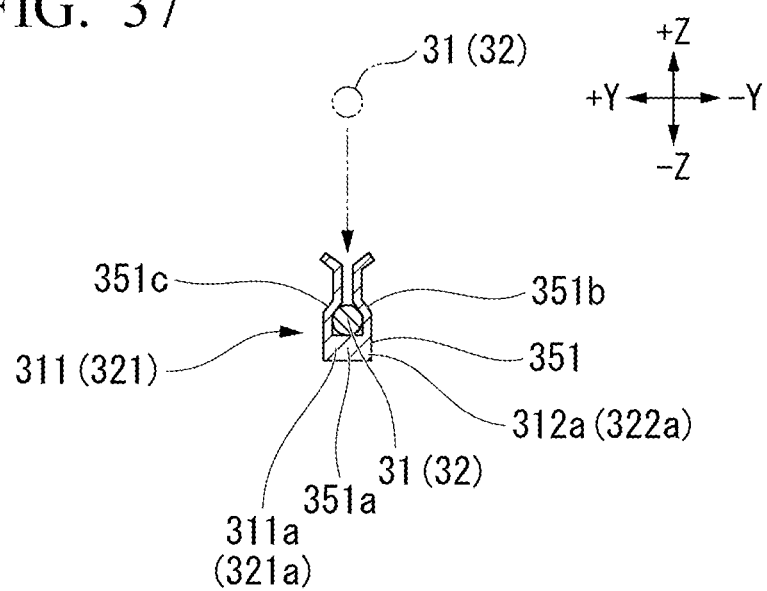
FIG. 37 is a cross-sectional view taken along line F37-F37 of the mounting structure shown in FIG. 36B.

FIG. 35 is a plan view showing the board unit 20 according to the eighth embodiment. The board unit 20 of the semiconductor storage device 1S according to the eighth embodiment includes a capacitor 26A serving as an axial capacitor instead of the capacitor 26. Additionally, the board unit 20 includes a first holder 310 and a second holder 320 instead of the first holder 61 and the second holder 62. FIGS. 36A and 36B are explanatory views of a mounting structure of the capacitor 26A according to the eighth embodiment. FIG. 36A is a plan view showing the mounting structure of the capacitor 26A. FIG. 36B is a cross-sectional view taken along line 36b-36b shown in FIG. 36A. FIG. 37 is a cross-sectional view taken along line F37-F37 of the mounting structure shown in FIG. 36B. Firstly, the board 21 will be described. The board 21 has, for example, a cutout 21c, and includes the first through-hole 43, the first land 44, the second through-hole 45, and the second land 46. The cutout 21c is provided at, for example, an end portion of the board 21 in the +Y direction. The cutout 21c is larger than the outer shape of the component main body 30 of the capacitor 26A. The first through-hole 43 and the first land 44 are located on the side in the +X direction with respect to the cutout 21c. The second through-hole 45 and the second land 46 are located on the side in the −X direction with respect to the cutout 21c. The explanations of the first through-hole 43, the first land 44, the second through-hole 45, and the second land 46 are the same as those of the first embodiment.

Next, the capacitor 26A will be described. The capacitor 26A includes, for example, the component main body 30, the first lead 31, and the second lead 32. The component main body 30 is formed in a cylindrical shape. The component main body 30 is disposed in the cutout 21c of the board 21.

Consequently, the component main body 30 does not overlap the board 21 when viewed from the thickness direction of the board 21 (the Z direction). In the embodiment, at least a part of the component main body 30 is arranged next to the board 21 in the X direction and the Y direction. For example, the center C of the component main body 30 in the Z direction is arranged next to the board 21 in the X direction and the Y direction.

The first lead 31 protrudes from a first end surface 30s1 of the component main body 30 (an end surface facing in the +X direction) in an axial direction of the component main body 30. In the embodiment, the first lead 31 protrudes from the first end surface 30s1 of the component main body 30 in the +X direction. On the other hand, the second lead 32 protrudes from a second end surface 30s2 of the component main body 30 (an end surface facing in the −X direction) in the axial direction of the component main body 30. In the embodiment, the second lead 32 protrudes from the second end surface 30s2 of the component main body 30 in the −X direction. That is, the first lead 31 and the second lead 32 protrude from the sides of the component main body 30 opposite to each other.

Next, the first holder 310 will be described. The first holder 310 is a holding member that holds the first lead 31. The first holder 310 is disposed on the side in the +X direction with respect to the capacitor 26A. The first holder 310 is fixed on the board 21. The first holder 310 holds the first lead 31 and thereby fixes the capacitor 26A to the board 21. The first holder 310 is made of, for example, metal. The first holder 310 includes, for example, a holder main body 311 and a fixing portion 312.

The holder main body 311 is disposed in the cutout 21c of the board 21. The holder main body 311 holds the first lead 31 inside the cutout 21c of the board 21. In the embodiment, the holder main body 311 includes a sandwiching portion 311a. The sandwiching portion 311a has elasticity. The sandwiching portion 311a sandwiches the first lead 31 and thereby holds the first lead 31. For example, the sandwiching portion 311a includes a plate spring 351 (refer to FIG. 37). The plate spring 351 includes a first portion 351a, a second portion 351b, and a third portion 351c.

The first portion 351a forms a base of the sandwiching portion 311a. The first portion 351a is located on, for example, the side in the −Z direction with respect to the first lead 31. The second portion 351b extends in the +Z direction from the end portion of the first portion 351a on the side in the −Y direction. The third portion 351c extends in the +Z direction from the end portion of the first portion 351a on the side in the +Y direction. At least a part of the second portion 351b and at least a part of the third portion 351c are bent so as to come close to each other. Consequently, a gap between the second portion 351b and the third portion 351c is at least partially smaller than a diameter of the first lead 31. Therefore, the first lead 31 sandwiched by the sandwiching portion 311a is restricted from being removed in the +Z direction. Note that, a casing 313 covering the holder main body 311 may be attached to the holder main body 311.

The fixing portion 312 is connected to the holder main body 311 and is fixed on the board 21 (refer to FIGS. 36A and 36B). For example, the fixing portion 312 includes a first portion 312a, a second portion 312b, and a third portion 312c. The first portion 312a is connected to the holder main body 311 at the position opposite to the first lead 31 in the Z direction. For example, the first portion 312a is connected to the first portion 351a of the sandwiching portion 311a of the holder main body 311 (refer to FIG. 37). The first portion 312a extends from the holder main body 311 in the +X direction. The first portion 312a is disposed in the cutout 21c of the board 21 when viewed from the Y direction.

The second portion 312b is bent at an end portion of the first portion 312a in the +X direction (that is, an end portion of the first portion 312a apart from the holder main body 311) toward the +Z direction. The second portion 312b extends in the Z direction. For example, the second portion 312b extends to the portion on the side in the +Z direction further than the first surface S1 of the board 21. The second portion 312b is disposed in the cutout 21c of the board 21 when viewed from the Y direction.

The third portion 312c extends in the +X direction from the end portion of the second portion 312b in the +Z direction. When viewed from the Y direction, the third portion 312c extends from a first position to a second position. The first position is a position where the third portion 312c overlaps the cutout 21c of the board 21 when viewed from the Y direction. The second position is a position where the third portion 312c overlaps the first surface S1 of the board 21 when viewed from the Y direction. A part of the third portion 312c is an overlap portion that overlaps the first surface S1 of the board 21. The overlap portion includes the protruding portion 61p.

The protruding portion 61p is inserted into the first through-hole 43 of the board 21. The protruding portion 61p is fixed on the first land 44 via a connection portion 63. In the embodiment, the first land 44 is connected to the wiring pattern 21w of the board 21. Accordingly, the first lead 31 is connected to the wiring pattern 21w of the board 21 via the holder main body 311, the fixing portion 312, and the first land 44. Next, the second holder 320 will be described. The second holder 320 is a holding member that holds the second lead 32. The second holder 320 is disposed on the side in the −X direction with respect to the capacitor 26A. The second holder 320 is fixed on the board 21. The second holder 320 holds the second lead 32 and thereby fixes the capacitor 26A to the board 21. The second holder 320 is made of, for example, metal. The second holder 320 includes, for example, a holder main body 321 and a fixing portion 322.

The holder main body 321 is disposed in the cutout 21c of the board 21. The holder main body 321 holds the second lead 32 inside the cutout 21c of the board 21. In the embodiment, the holder main body 321 includes a sandwiching portion 321a. The sandwiching portion 321a has elasticity. The sandwiching portion 321a sandwiches the second lead 32 and thereby holds the second lead 32. Similarly to the sandwiching portion 311a of the first holder 310, the sandwiching portion 321a includes, for example, the plate spring 351. Note that, a casing 323 covering the holder main body 321 may be attached to the holder main body 321.

The fixing portion 322 is connected to the holder main body 321 and is fixed on the board 21. For example, the fixing portion 322 includes a first portion 322a, a second portion 322b, and a third portion 322c.

The first portion 322a is connected to the holder main body 321 at the position opposite to the second lead 32 in the Z direction. For example, the first portion 322a is connected to the first portion 351a of the sandwiching portion 321a of the holder main body 321 (refer to FIG. 37). The first portion 322a extends from the holder main body 321 in the −X direction. The first portion 322a is disposed in the cutout 21c of the board 21 when viewed from the Y direction.

The second portion 322b is bent at an end portion of the first portion 322a in the −X direction (that is, an end portion of the first portion 322a apart from the holder main body 321) toward the +Z direction. The second portion 322b extends in the Z direction. For example, the second portion 322b extends to the portion on the side in the +Z direction further than the first surface S1 of the board 21. The second portion 322b is disposed in the cutout 21c of the board 21 when viewed from the Y direction.

The third portion 322c extends in the −X direction from the end portion of the second portion 322b in the +Z direction. When viewed from the Y direction, the third portion 322c extends from a first position to a second position. The third portion 322c overlaps the cutout 21c of the board 21 at the first position when viewed from the Y direction. The third portion 322c overlaps the first surface S1 of the board 21 at the second position when viewed from the Y direction. A part of the third portion 322c is an overlap portion that overlaps the first surface S1 of the board 21. The overlap portion includes the protruding portion 62p.

The protruding portion 62p is inserted into the second through-hole 45 of the board 21. The protruding portion 62p is fixed on the second land 46 via a connection portion 64. In the embodiment, the second land 46 is connected to the wiring pattern 21w of the board 21. Accordingly, the second lead 32 is connected to the wiring pattern 21w of the board 21 via the holder main body 321, the fixing portion 322, and the second land 46.

With this configuration, since the component main body 30 of the capacitor 26A is disposed at a position out of the board 21, the housing 10 can be thinner as compared to a case in which the board 21 and the component main body 30 of the capacitor 26A are disposed so as to overlap each other in the Z direction.

In the embodiment, the capacitor 26A is supported by the first holder 310 and the second holder 320 which are disposed separately on the respective two sides of the component main body 30. With this configuration, it is possible to tightly hold the component main body 30 as compared to a case in which holders holding the first lead 31 and the second lead 32 are collectively disposed on one side of the component main body 30. As a result, it is possible to increase impact resistance of the semiconductor storage device 1S. Furthermore, in a case in which the semiconductor storage device 1S includes the first holder 310 and the second holder 320 which are disposed separately on the respective two sides of the component main body 30, a large stress is not likely to affect the connection portion (for example, solder portion) fixing the first lead 31 and the second lead 32 even when an external force affects the component main body 30. Consequently, it is possible to increase the reliability of the semiconductor storage device 1S.

First Modified Example

Figure 38:
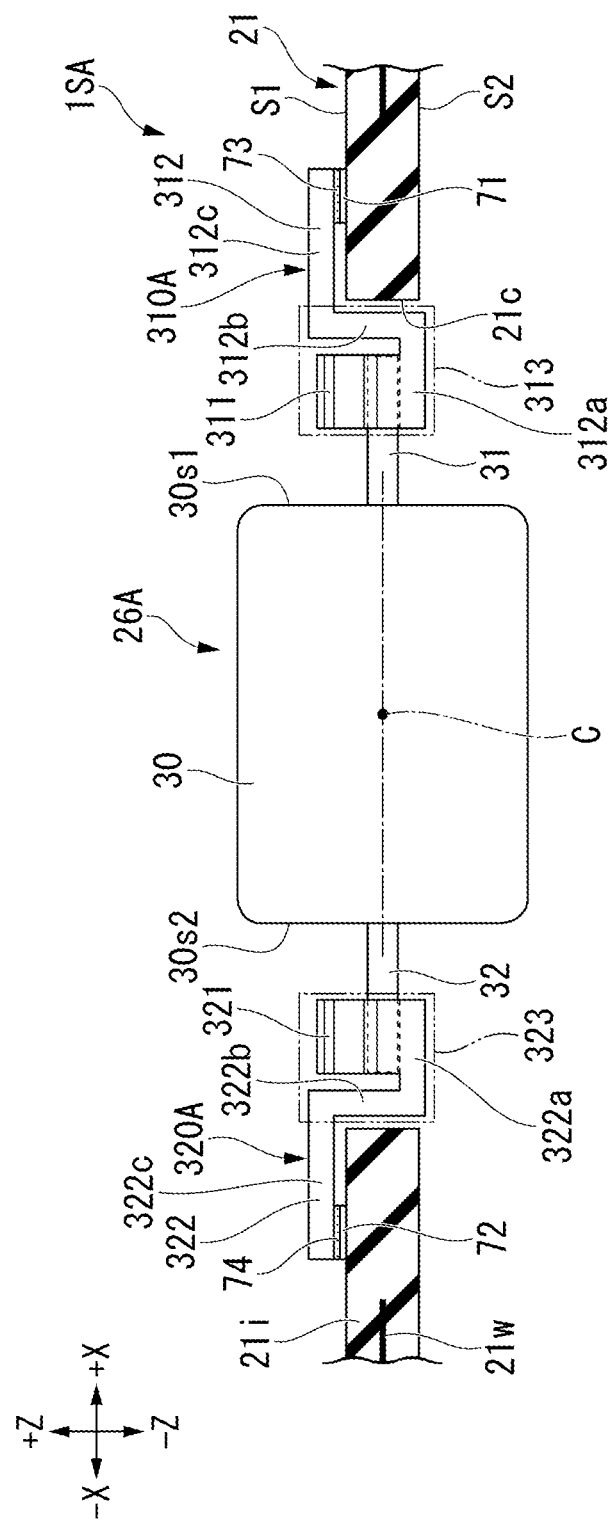
FIG. 38 is an explanatory view of a mounting structure of a first modified example according to the eighth embodiment.

FIG. 38 is an explanatory view of a mounting structure of a first modified example according to the eighth embodiment. A semiconductor storage device 1SA of the first modified example includes a first holder 310A instead of the first holder 310 and a second holder 320A instead of the second holder 320.

A first pad 71 and a second pad 72 are provided on the first surface S1 of the board 21. The first pad 71 and the second pad 72 are used for surface mounting. The first pad 71 is located on the side in the +X direction with respect to the cutout 21c. The second pad 72 is located on the side in the −X direction with respect to the cutout 21c.

In the modified example, the first holder 310A (for example, the third portion 312c of the fixing portion 312 of the first holder 310A) is fixed on the first pad 71 via the connection portion 73. That is, the first holder 310A is mounted on the surface of the first surface S1 of the board 21. In the embodiment, the first pad 71 is connected to the wiring pattern 21w of the board 21. Therefore, the first lead 31 is connected to the wiring pattern 21w of the board 21 via the first holder 310A and the first pad 71.

Similarly, the second holder 320A (for example, the third portion 322c of the fixing portion 322 of the second holder 320A) is fixed on the second pad 72 via the connection portion 74. That is, the second holder 320A is mounted on the surface of the first surface S1 of the board 21. In the embodiment, the second pad 72 is connected to the wiring pattern 21w of the board 21. Therefore, the second lead 32 is connected to the wiring pattern 21w of the board 21 via the second holder 320A and the second pad 72.

In the configuration according to the embodiment, the capacitor 26A is supported by the first holder 310A and the second holder 320A in a reflow process when manufacturing the capacitor 26A. The first holder 310A and the second holder 320A are disposed separately on the respective two sides of the component main body 30. Consequently, it is not necessary to directly support the capacitor 26A by a carrier palette for reflow use. That is, the capacitor 26A does not come into contact with such a carrier palette for reflow use. More specifically, in a mounting step before the reflow process, the first holder 310A and the second holder 320A are inclined with respect to the first pad 71 and the second pad 72 and are mounted thereon. In such a case, as the connection portions 73 and 74, for example, solder is heated by the reflow process, a self-alignment effect is obtained due to surface tension of the solder, and therefore the inclination of the first holder 310A and the second holder 320A is corrected. Consequently, it is possible to increase a degree of workability of attaching the capacitor 26A to the board 21.

Second Modified Example

Figure 39:
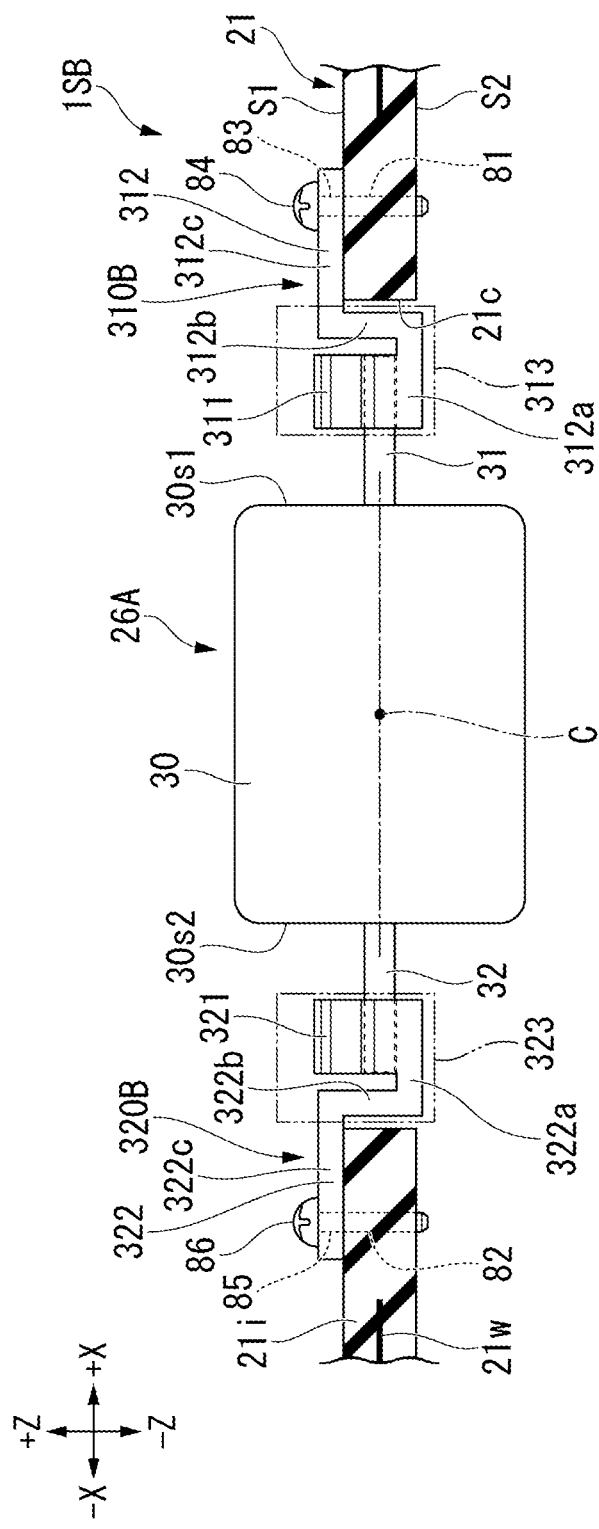
FIG. 39 is an explanatory view of a mounting structure of a second modified example according to the eighth embodiment.

FIG. 39 is an explanatory view of a mounting structure of a second modified example according to the eighth embodiment. A semiconductor storage device 1SB of the second modified example includes a first holder 310B instead of the first holder 310 includes a second holder 320B instead of the second holder 320.

A first screw hole 81 and a second screw hole 82 are provided on the board 21. The first screw hole 81 is located on the side in the +X direction with respect to the cutout 21c. The second screw hole 82 is located on the side in the −X direction with respect to the cutout 21c.

In the modified example, the first holder 310B (for example, the third portion 312c of the fixing portion 312 of the first holder 310B) has the screw-insertion hole 83 in communication with the first screw hole 81 of the board 21. The first holder 310B is inserted into the screw-insertion hole 83. The first holder 310B is fixed on the board 21 by the screw 84 engaged with the first screw hole 81. In the embodiment, an inner surface of the first screw hole 81 is connected to the wiring pattern 21w of the board 21. Consequently, the first lead 31 is connected to the wiring pattern 21w of the board 21 via the first holder 310B and the screw 84.

In the modified example, the second holder 320B (for example, the third portion 322c of the fixing portion 322 of the second holder 320B) has the screw-insertion hole 85 in communication with the second screw hole 82 of the board 21. The second holder 320B is inserted into the screw-insertion hole 85. The second holder 320B is fixed on the board 21 by the screw 86 engaged with the second screw hole 82. In the embodiment, an inner surface of the second screw hole 82 is connected to the wiring pattern 21*w* of the board 21. Accordingly, the second lead 32 is connected to the wiring pattern 21*w* of the board 21 via the second holder 320B and the screw 86.

Ninth Embodiment

Next, a ninth embodiment will be described. The ninth embodiment is different from the eighth embodiment in that the first lead 31 and the second lead 32 are fixed to a through-hole of a holder. Configurations other than those described below are the same as those of the second modified example according to the aforementioned eighth embodiment.

FIGS. 40A and 40B are plan views showing the board unit 20 according to the ninth embodiment. FIG. 40A is a plan view showing the board unit 20. FIG. 40B is a cross-sectional view taken along line 40*b*-40*b* shown in FIG. 40A. The board unit 20 of a semiconductor storage device 1T according to the ninth embodiment includes a first holder 330 and a second holder 340. Each of the first holder 330 and the second holder 340 is made of, for example, metal. Each of the first holder 330 and the second holder 340 has the through-hole 171*h*. The through-hole 171*h* penetrates through the first holder 330 or the second holder 340 in the Z direction. The through-hole 171*h* is disposed at a region at which the through-hole 171*h* overlaps the cutout 21*c* in the Z direction.

The first lead 31 includes a base 31*x* and a curved portion 31*y*. The base 31*x* protrudes straight from the component main body 30 in the +X direction. The curved portion 31*y* includes a portion bent with respect to the base 31*x* toward, for example, the +Z direction. The curved portion 31*y* is inserted into the through-hole 171*h* of the first holder 330. The curved portion 31*y* is fixed to the first holder 330 via the connection portion 156.

Similarly, the second lead 32 includes a base 32*x* and a curved portion 32*y*. The base 32*x* protrudes straight from the component main body 30 in the −X direction. The curved portion 32*y* includes a portion bent with respect to the base 32*x* toward, for example, the +Z direction. The curved portion 32*y* is inserted into the through-hole 171*h* of the second holder 340. The curved portion 32*y* is fixed to the second holder 340 via the connection portion 157.

The other configurations of the first holder 330 and the second holder 340 are the same as those of the first holder 310 and the second holder 320 according to the eighth embodiment. With this configuration, since the component main body 30 of the capacitor 26A is disposed at a position out of the board 21, the housing 10 can be thinner as compared to a case in which the board 21 and the component main body 30 of the capacitor 26A are disposed so as to overlap each other in the Z direction.

First Modified Example

Figure 41:
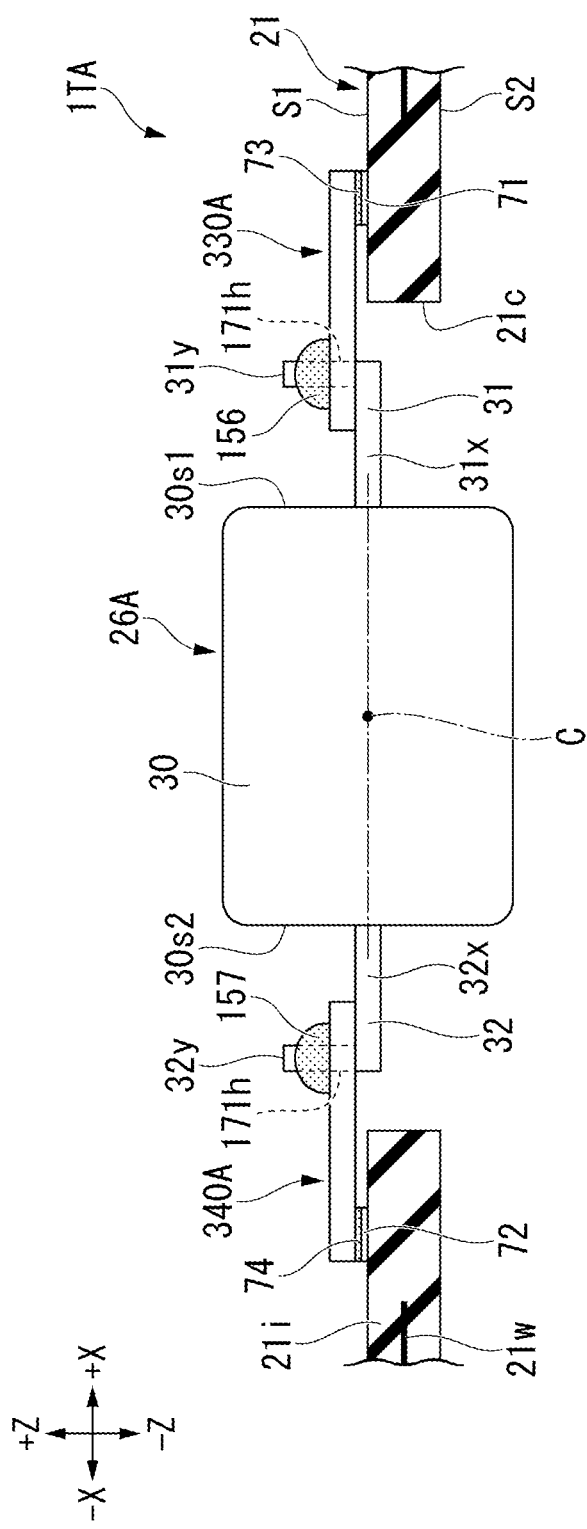
FIG. 41 is an explanatory view of a mounting structure of a first modified example according to the ninth embodiment.

FIG. 41 is an explanatory view of a mounting structure of a first modified example according to the ninth embodiment. A semiconductor storage device 1TA of the first modified example includes a first holder 330A instead of the first holder 330 and includes a second holder 340A instead of the second holder 340.

Similarly to the first modified example according to the eighth embodiment, the first holder 330A and the second holder 340A are fixed on the first pad 71 and the second pad 72 provided on the first surface S1 of the board 21, respectively. That is, the first holder 330A and the second holder 340A are mounted on the surface of the first surface S1 of the board 21. The other configurations of the first holder 330A and the second holder 340A are the same as those of the first holder 330 and the second holder 340 according to the ninth embodiment.

Second Modified Example

Figure 42:
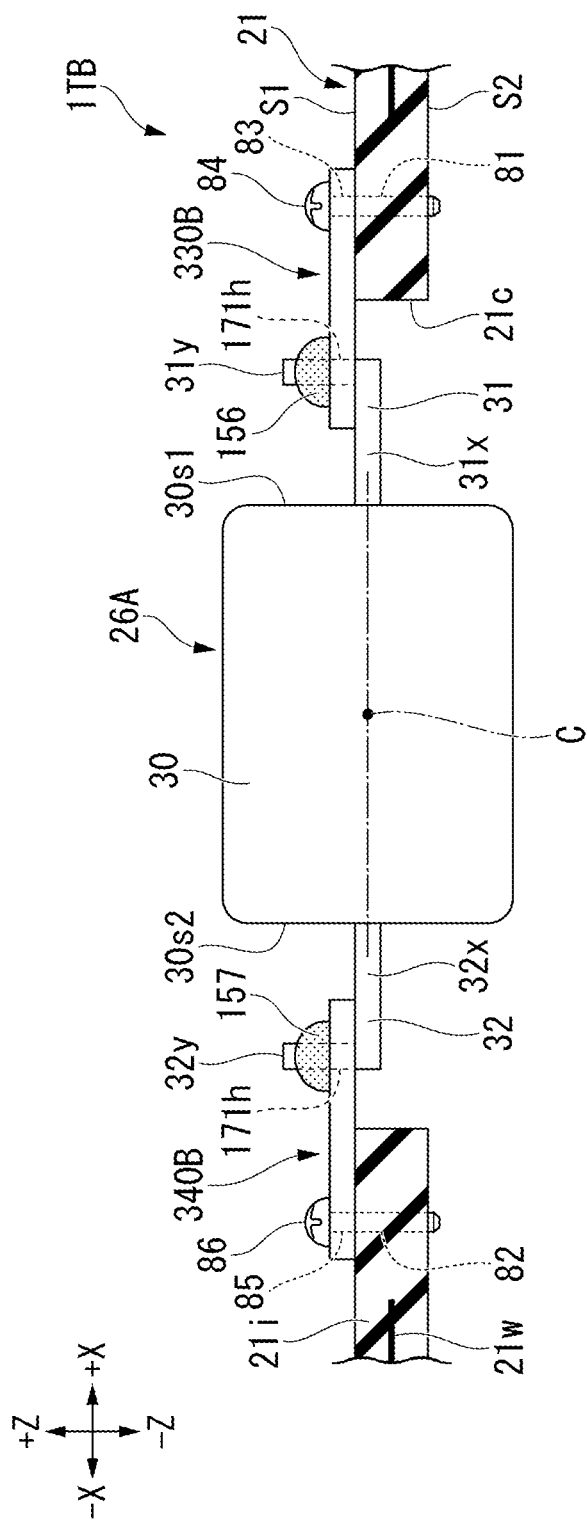
FIG. 42 is an explanatory view of a mounting structure of a second modified example according to the ninth embodiment.

FIG. 42 is an explanatory view of a mounting structure of a second modified example according to the ninth embodiment. A semiconductor storage device 1TB of the second modified example includes a first holder 330B instead of the first holder 330 and includes a second holder 340B instead of the second holder 340.

Similarly to the second modified example according to the eighth embodiment, the first holder 330B and the second holder 340B are fixed on the board 21 by the screws 84 and 86, respectively. The other configurations of the first holder 330B and the second holder 340B are the same as those of the first holder 330 and the second holder 340 according to the ninth embodiment.

Tenth Embodiment

Next, a tenth embodiment will be described. The tenth embodiment is different from the eighth embodiment in that the first lead 31 and the second lead 32 each extending in the X direction are fixed to through-holes of a holder. Configurations other than those described below are the same as those of the second modified example according to the aforementioned eighth embodiment.

Figure 43:
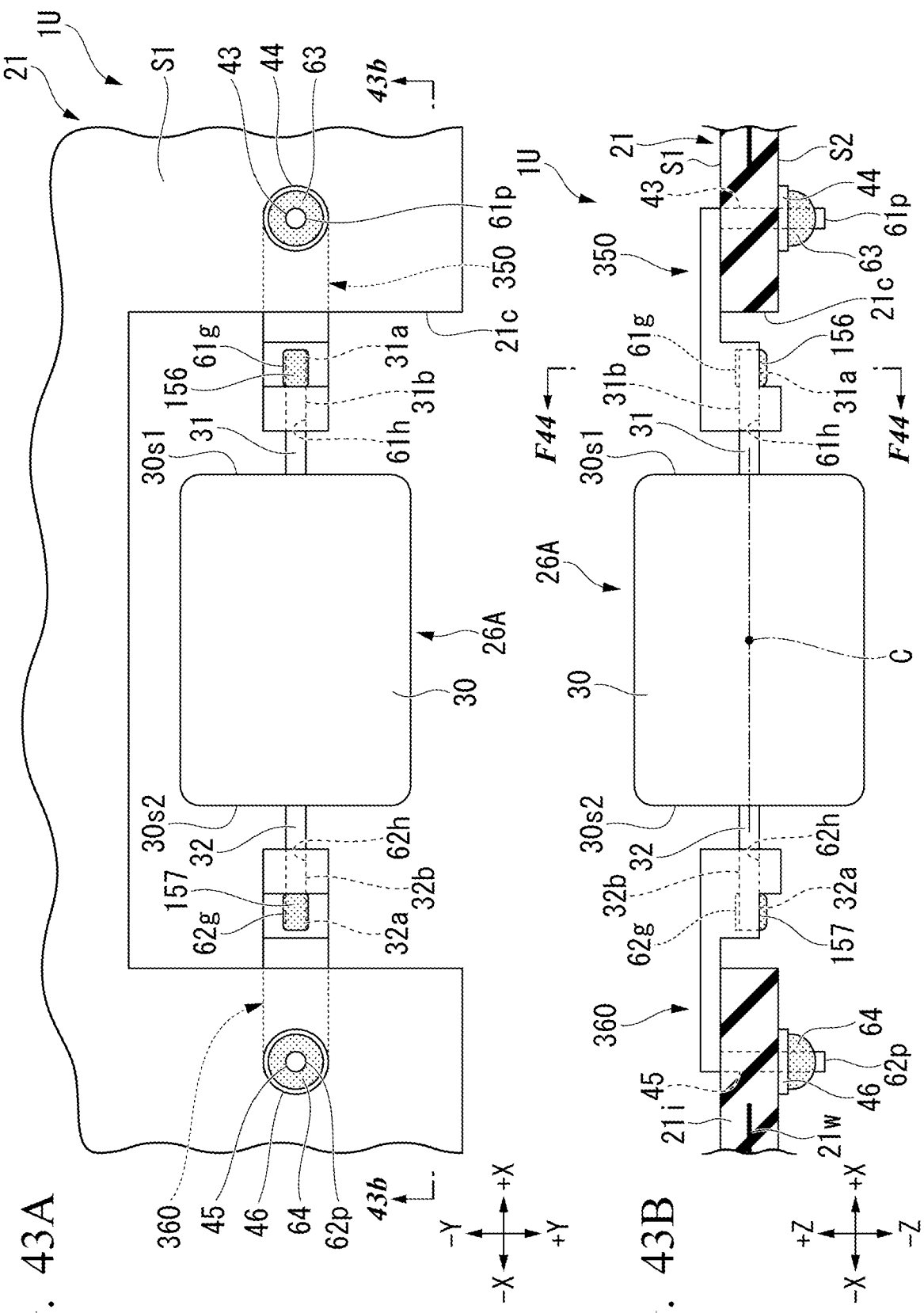
FIG. 43A is an explanatory plan view of a capacitor-mounting structure according to a tenth embodiment.
FIG. 43B an explanatory cross-sectional view of the capacitor-mounting structure according to the tenth embodiment.
Figure 44:
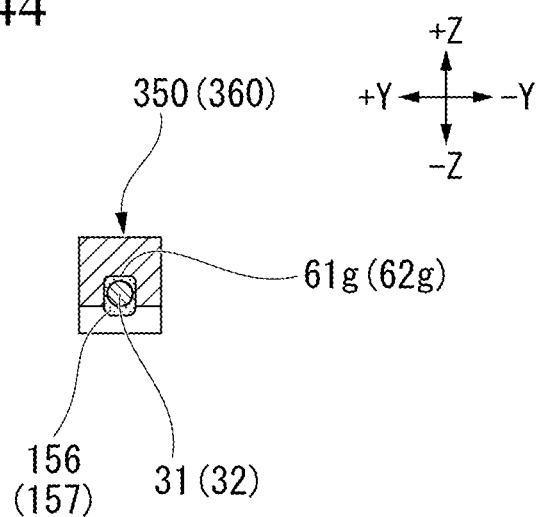
FIG. 44 is a cross-sectional view taken along line F44-F44 of the mounting structure shown in FIG. 43B.

FIGS. 43A and 43B are plan views showing the board unit 20 according to the tenth embodiment. FIG. 43A is a plan view showing the board unit 20. FIG. 43B is a cross-sectional view taken along line 43*b*-43*b* shown in FIG. 43A. FIG. 44 is a cross-sectional view taken along line F44-F44 of the mounting structure shown in FIG. 43B. The board unit 20 of a semiconductor storage device 1U according to the tenth embodiment includes a first holder 350 and a second holder 360. Each of the first holder 350 and the second holder 360 is made of, for example, metal.

The first holder 350 has the first through-hole 61*h* and the first groove 61*g*. The first through-hole 61*h* is opened in the X direction. As the second lead portion 31*b* of the first lead 31 is inserted into the first through-hole 61*h*, the first holder 350 holds the second lead portion 31*b* of the first lead 31. Note that, the first through-hole 61*h* may be omitted. The first groove 61*g* extends in the X direction. For example, the first groove 61*g* is opened in the −Z direction. The first lead portion 31*a* of the first lead 31 passing through the first through-hole 61*h* is located in the first groove 61*g*. The first groove 61*g* prevents displacement of the first lead portion 31*a* of the first lead 31 in the Y direction. The first lead portion 31*a* is fixed to the first groove 61*g* via the connection portion 156.

The second holder 360 has the second through-hole 62*h* and the second groove 62*g*. The second through-hole 62*h* is opened in the X direction. As the second lead portion 32*b* of the second lead 32 is inserted into the second through-hole 62*h*, the second holder 360 holds the second lead portion 32*b* of the second lead 32. Note that, the second through-hole 62*h* may be omitted. The second groove 62*g* extends in the X direction. For example, the second groove 62*g* is opened in the −Z direction. The first lead portion 32*a* of the second lead 32 passing through the second through-hole 62*h* is located in the second groove 62*g*. The second groove 62*g* prevents displacement of the first lead portion 32a of the second lead 32 in the Y direction. The first lead portion 32a is fixed to the second groove 62g via the connection portion 157.

The other configurations of the first holder 350 and the second holder 360 are the same as those of the first holder 310 and the second holder 320 according to the eighth embodiment. With this configuration, since the component main body 30 of the capacitor 26A is disposed at a position out of the board 21, the housing 10 can be thinner as compared to a case in which the board 21 and the component main body 30 of the capacitor 26A are disposed so as to overlap each other in the Z direction.

First Modified Example

Figure 45:
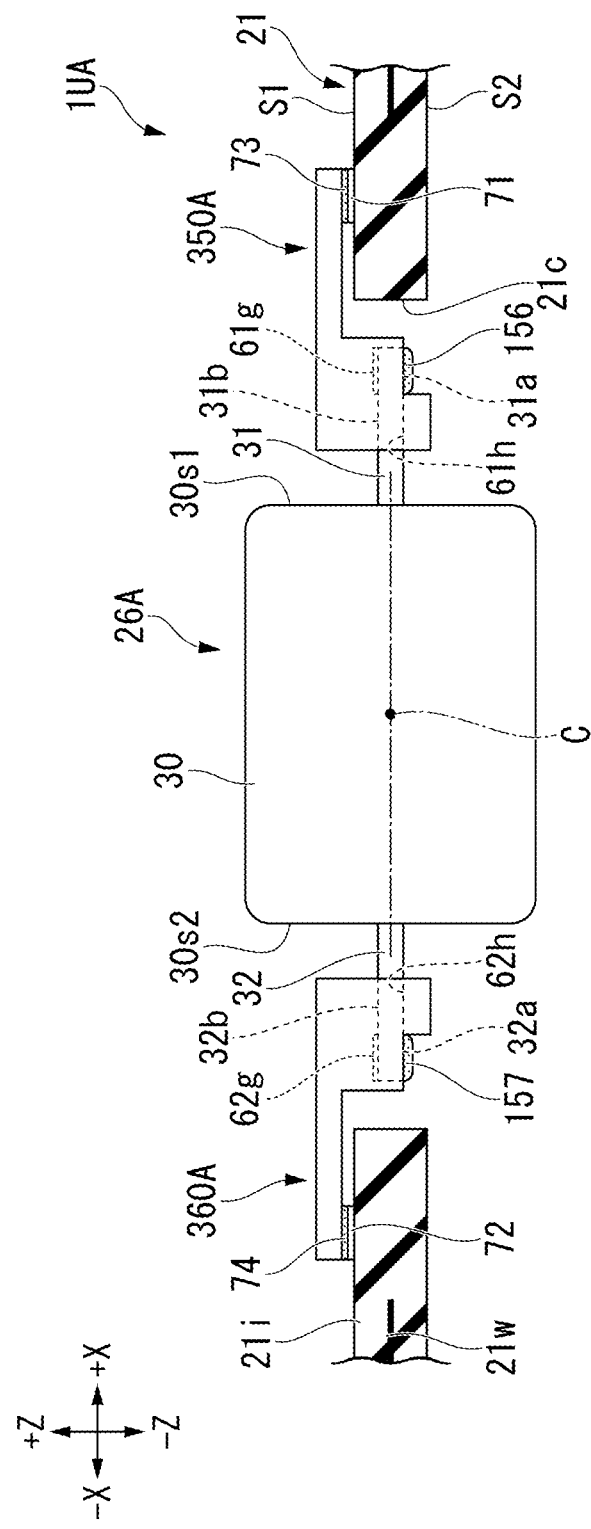
FIG. 45 is an explanatory view of a mounting structure of a first modified example according to the tenth embodiment.

FIG. 45 is an explanatory view of a mounting structure of a first modified example according to the tenth embodiment. A semiconductor storage device 1UA of the first modified example includes a first holder 350A instead of the first holder 350 and includes a second holder 360A instead of the second holder 360.

Similarly to the first modified example according to the eighth embodiment, the first holder 350A and the second holder 360A are fixed on the first pad 71 and the second pad 72 provided on the first surface S1 of the board 21, respectively. That is, the first holder 350A and the second holder 360A are mounted on the surface of the first surface S1 of the board 21. The other configurations of the first holder 350A and the second holder 360A are the same as those of the first holder 350 and the second holder 360 according to the tenth embodiment.

Second Modified Example

Figure 46:
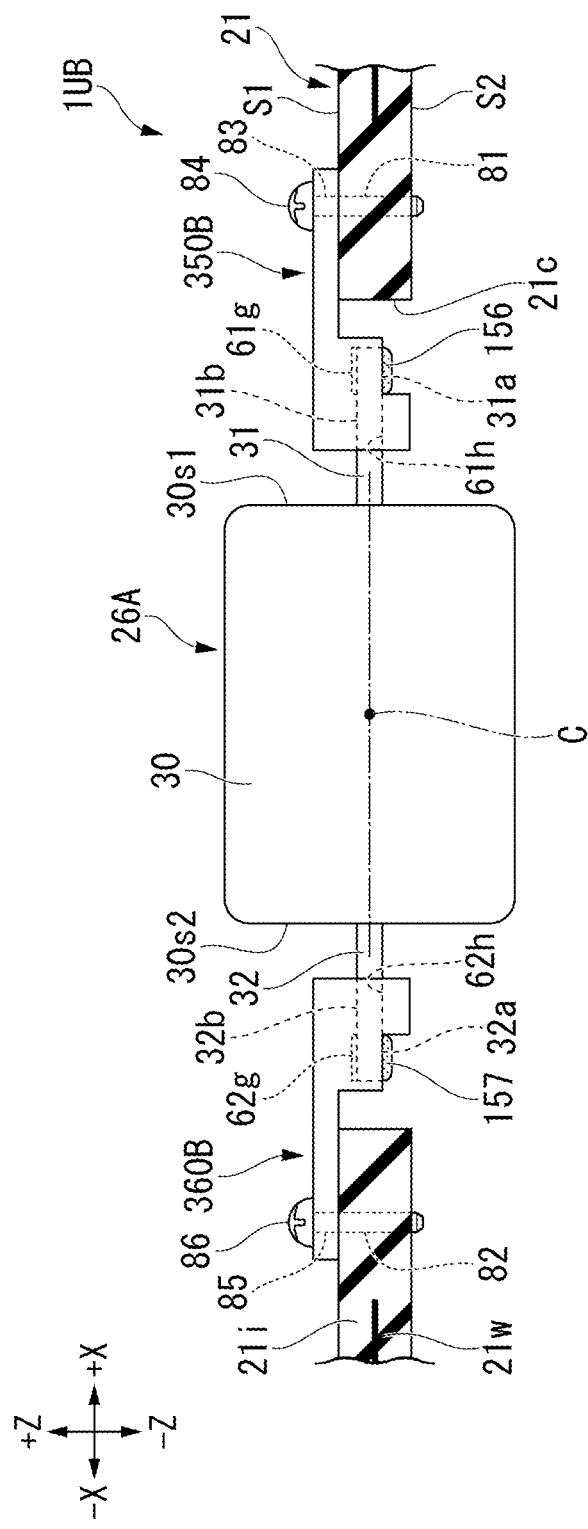
FIG. 46 is an explanatory view of a mounting structure of a second modified example according to the tenth embodiment.

FIG. 46 is an explanatory view of a mounting structure of a second modified example according to the tenth embodiment. A semiconductor storage device 1UB of the second modified example includes a first holder 350B instead of the first holder 350 and includes a second holder 360B instead of the second holder 360.

Similarly to the second modified example according to the eighth embodiment, the first holder 350B and the second holder 360B are fixed on the board 21 by the screws 84 and 86, respectively. The other configurations of the first holder 350B and the second holder 360B are the same as those of the first holder 350 and the second holder 360 according to the tenth embodiment.

Eleventh Embodiment

Next, an eleventh embodiment will be described. The eleventh embodiment is different from the eighth embodiment in that each of the first lead 31 and the second lead 32 includes a two-step curved portion. Configurations other than those described below are the same as those of the second modified example according to the aforementioned eighth embodiment.

Figure 48:
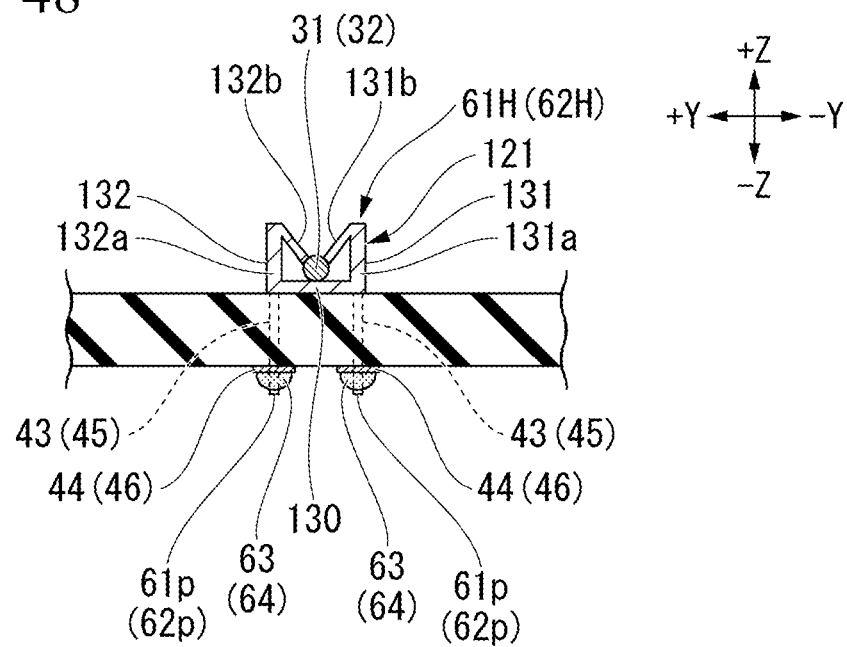
FIG. 48 is a cross-sectional view taken along line F48-F48 of the mounting structure shown in FIG. 47B.

FIGS. 47A and 47B are plan views showing the board unit 20 according to the eleventh embodiment. FIG. 47A is a plan view showing the board unit 20. FIG. 47B is a cross-sectional view taken along line 47b-47b shown in FIG. 47A. FIG. 48 is a cross-sectional view taken along line F48-F48 of a mounting structure shown in FIG. 47B. The board unit 20 of a semiconductor storage device 1V according to the eleventh embodiment includes the first holder 61H and the second holder 62H. Each of the first holder 61H and the second holder 62H is made of, for example, metal.

In the embodiment, each of the first lead 31 and the second lead 32 of the capacitor 26A includes a two-step curved portion. For example, the first lead 31 includes a third lead portion 31c and a fourth lead portion 31d in addition to the first lead portion 31a and the second lead portion 31b mentioned above. The third lead portion 31c protrudes from the first end surface 30s1 of the component main body 30 in the +X direction. The fourth lead portion 31d includes a portion bent at the end portion of the third lead portion 31c on the side in the +X direction toward the +Z direction. The fourth lead portion 31d extends in the Z direction. The end portion of the fourth lead portion 31d on the side in the +Z direction is connected to the second lead portion 31b. Note that, in the embodiment, the second lead portion 31b means a portion extending parallel to the first surface S1 of the board 21 between the fourth lead portion 31d and the first lead portion 31a.

Similarly, the second lead 32 includes a third lead portion 32c and a fourth lead portion 32d in addition to the first lead portion 32a and the second lead portion 32b mentioned above. The third lead portion 32c protrudes from the second end surface 30s2 of the component main body 30 in the −X direction. The fourth lead portion 32d includes a portion bent at the end portion of the third lead portion 32c on the side in the −X direction toward the +Z direction. The fourth lead portion 32d extends in the Z direction. The end portion of the fourth lead portion 32d on the side in the +Z direction is connected to the second lead portion 32b. Note that, in the embodiment, the second lead portion 32b means a portion extending parallel to the first surface S1 of the board 21 between the fourth lead portion 32d and the first lead portion 32a.

The first holder 61H includes a lock mechanism 121 that fixes the first lead 31 without including a connection portion such as solder. For example, the lock mechanism 121 removably fixes the first lead 31. The lock mechanism 121 includes, for example, a base 130, a first pressing portion 131, and a second pressing portion 132. In the embodiment, the first lead 31 is connected to the wiring pattern 21w of the board 21 via the first holder 61H and the land 44. Note that, the configuration of the first holder 61H is the same as that of the first holder 61H according to the second embodiment.

Similarly, the second holder 62H includes a lock mechanism 121 that fixes the second lead 32 without including a connection portion such as solder. The lock mechanism 121 removably fixes, for example, the second lead 32. In the embodiment, the second lead 32 is connected to the wiring pattern 21w of the board 21 via the second holder 62H and the land 46. Note that, the configuration of the second holder 62H is the same as that of the second holder 62H according to the second embodiment.

With this configuration, since the component main body 30 of the capacitor 26A is disposed at a position out of the board 21, the housing 10 can be thinner as compared to a case in which the board 21 and the component main body 30 of the capacitor 26A are disposed so as to overlap each other in the Z direction.

Figure 49:
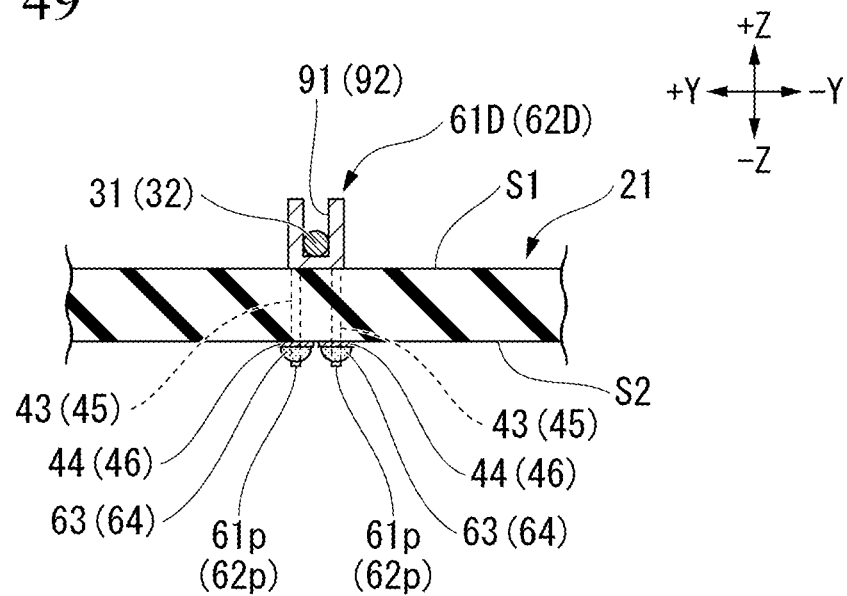
FIG. 49 is an explanatory view of a mounting structure of a first modified example according to the eleventh embodiment.
Figure 50:
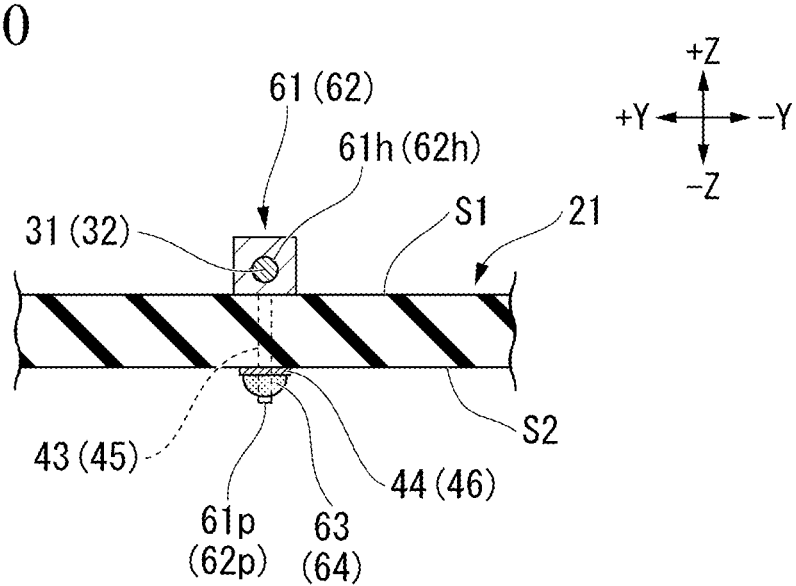
FIG. 50 is an explanatory view of a mounting structure of a second modified example according to the eleventh embodiment.

Note that, instead of the first holder 61H and the second holder 62H, the board unit 20 of the semiconductor storage device 1V according to the eleventh embodiment may include the first holder 61D and the second holder 62D (refer to FIG. 49) similar to that of the fourth modified example according to the first embodiment. The board unit 20 of the semiconductor storage device 1V may include the first holder 61 and the second holder 62 (refer to FIG. 50) similar to that of the first embodiment.

As described above, the mounting structures of the axial capacitor 26A according to the eighth to the eleventh embodiments have been explained. However, the mounting structure of the axial capacitor 26A is not limited to the above-described examples, and the holder described in the first to the seventh embodiments may be provided on each of the first lead 31 and the second lead 32. For example, the holder 230 (refer to FIGS. 28A and 28B) formed by a printed board may be provided on each of the first lead 31 and the second lead 32.

A plurality of embodiments and modified examples have been described above. However, the embodiments and the modified examples are not limited to the above-mentioned examples. For example, the embodiments and the modified examples described above may be suitably combined, and a combined embodiment or a combined modified example may be achieved.

For example, the above-described embodiments and modified examples may be modified and achieved based on the following viewpoints (1) to (3).
(1) Regarding the fixation structure using the holder or the holding portion, the holder or the holding portion which holds the first lead 31 or the second lead 32 may be surface-mounted on a pad on a surface of the board 21, and may include a protruding portion that is inserted into and fixed to a through-hole of the board 21.
(2) Regarding the fixation structure of the lead, each of the first lead 31 and the second lead 32 may be fixed on a pad on a surface of the board 21 via a connection portion such as solder or may be inserted into and fixed to a through-hole of the board 21.
(3) Regarding the position, the posture, or the shape of the capacitors 26 and 26A, the first lead 31 and the second lead 32 may be disposed on both sides of the board 21 in the Z direction. A part of the component main body 30 of the capacitors 26 and 26A may be held by the holder or the holding portion so as to face the board 21 in the Y direction in a state in which both the first lead 31 and the second lead 32 are collectively disposed on the first surface S1 of the board 21 (or the second surface side). Each of the first lead 31 and the second lead 32 may be bent in two or more steps as shown in FIGS. 13A to 13C. Furthermore, a modified example may be achieved by an optional combination according to the above-mentioned viewpoints (1) to (3). Moreover, in each of the embodiments or each of the modified examples, the holder or the holding portion may be fixed on the board 21 via a fixing member such as a screw.

From another viewpoint, the capacitors 26 and 26A may be fixed on the board 21 without depending on the above-mentioned holders. For example, regarding the capacitors 26 and 26A, the first lead 31 and the second lead 32 may be separately disposed on the respective two sides of the board 21 in the Z direction, the first lead 31 may be fixed on the first pad 41 of the first surface S1 of the board 21 via the first connection portion 51, and the second lead 32 may be fixed on the second pad 42 of the second surface S2 of the board 21 via the second connection portion 52.

According to at least one of the embodiments described above, the semiconductor storage device includes a board, an electronic component, and a holder. The aforementioned electronic component includes a component main body and a first lead. The component main body is disposed at a position out of the board in a direction parallel to the first surface. The first lead protrudes from the component main body toward the board. The aforementioned holder is fixed on the board and holds the first lead. With this configuration, it is possible to provide a semiconductor storage device suitable to reduce the thickness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a board having a first surface and a second surface, the second surface being opposite to the first surface;
   an electronic component including a component main body, a first lead, and a second lead, the component main body being at a position out of the board in a direction parallel to the first surface, the component main body having a first end face, the first lead and the second lead protruding from the first end face of the component main body toward the board;
   a first holder on the first surface, the first holder holding the first lead and having a portion overlapping the first surface in a thickness direction of the board;
   a second holder on the second surface, the second holder holding the second lead and having a portion overlapping the second surface in the thickness direction of the board; and
   a first connection portion outside the first holder, the first connection portion electrically connecting the first lead and the board, wherein
   the first lead includes a first lead portion and a second lead portion,
   the second lead portion is between the first lead portion and the component main body,
   the first connection portion electrically connects the first lead portion to the board, and
   the first holder holds the second lead portion.

2. The semiconductor storage device according to claim 1, wherein
   at least a part of the electronic component is next to the board in the direction parallel to the first surface.

3. The semiconductor storage device according to claim 1, wherein
   at least a part of the first holder has electroconductivity, and
   the first holder electrically connects the first lead and the board.

4. The semiconductor storage device according to claim 1, wherein
   the board has a cutout,
   the cutout is at an end portion of the board, and
   the first holder and the second holder are inserted into the cutout.

5. The semiconductor storage device according to claim 1, wherein
   the first holder and the second holder include a lock mechanism, and
   the lock mechanism fixes the first lead and the second lead.

6. The semiconductor storage device according to claim 5, wherein
the lock mechanism includes a plate spring, and
the plate spring is in contact with the first lead.

7. The semiconductor storage device according to claim 1, wherein
the first holder includes a holder main body and a protruding portion, the holder main body having a first through-hole, the first through-hole extending in a direction crossing a direction from the component main body to the board,
the board has a second through-hole,
the protruding portion of the first holder penetrates through the first through-hole and the second through-hole, and
the first holder is on the board via the protruding portion.

8. The semiconductor storage device according to claim 1, wherein
the first holder includes a first insulator, a second insulator, a first conductive portion, and a second conductive portion,
the first conductive portion is on the first insulator,
the first conductive portion electrically connects the first lead and the board,
the second conductive portion is on the second insulator, and
the second conductive portion electrically connects the second lead and the board.

9. The semiconductor storage device according to claim 1, wherein
the first holder has a first portion and a second portion,
the first portion overlaps the board in a thickness direction of the board,
the second portion is at a position out of the board in the direction parallel to the first surface, and
the first lead is held by the second portion of the first holder.

10. The semiconductor storage device according to claim 9, wherein
at least a part of the first lead is next to the board in the direction parallel to the first surface in an outside of the board.

11. The semiconductor storage device according to claim 9, wherein
the second portion of the first holder has a through-hole,
the through-hole extends in a direction crossing a direction from the component main body to the board,
the through-hole penetrates through the second portion of the first holder,
the first lead includes a third lead portion and a fourth lead portion,
the third lead portion protrudes from the component main body,
the fourth lead portion includes a portion bent with respect to the third lead portion, and
the fourth lead portion is inserted into the through-hole.

12. The semiconductor storage device according to claim 11, wherein
the second portion of the second board has a through hole,
the through hole penetrates the second portion parallel with a direction crossing the direction from the component main body toward the first board,
the first lead has a third lead portion and a fourth lead portion,
the third lead portion protrudes from the component main body,
the fourth lead portion bent with respect to the third lead portion, and
the fourth lead portion is inserted into the through-hole.

13. The semiconductor storage device according to claim 1, wherein
the first holder includes a sandwiching portion having elasticity, and
the sandwiching portion holds the first lead.

14. A semiconductor storage device, comprising:
a board having a first surface and a second surface, the second surface being opposite to the first surface;
an electronic component; and
a holder on the board, wherein
the electronic component includes a component main body, a first lead, and a second lead, the component main body having a first end face,
the component main body is at a position out of the board in a direction parallel to the first surface,
the first lead has a portion protruding from the first end face toward the board and overlapping the first surface in the thickness direction of the board,
the first lead is electrically connected to the first surface,
the second lead has a portion protruding from the first end face toward the board and being on an opposite side of the first lead with respect to the board, and
the second lead is electrically connected to the second surface, and
wherein the holder includes an insulator, a first conductive portion, and a second conductive portion,
the first conductive portion is on the insulator,
the first conductive portion electrically connects the first lead and the board,
the second conductive portion is on the insulator, and
the second conductive portion electrically connects the second lead and the board.

* * * * *